(12) United States Patent
Hashimoto et al.

(10) Patent No.: US 10,483,143 B2
(45) Date of Patent: Nov. 19, 2019

(54) END EFFECTOR AND SUBSTRATE CONVEYING ROBOT

(71) Applicant: KAWASAKI JUKOGYO KABUSHIKI KAISHA, Kobe-shi, Hyogo (JP)

(72) Inventors: Yasuhiko Hashimoto, Kobe (JP); Takayuki Fukushima, Takarazuka (JP); Ryosuke Kanamaru, Kakogawa (JP); Shinya Kinoshita, Akashi (JP); Daiki Miyagawa, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 0 days.

(21) Appl. No.: 15/108,387

(22) PCT Filed: Jun. 27, 2014

(86) PCT No.: PCT/JP2014/067238
§ 371 (c)(1),
(2) Date: Jun. 27, 2016

(87) PCT Pub. No.: WO2015/098153
PCT Pub. Date: Jul. 2, 2015

(65) Prior Publication Data
US 2016/0329227 A1 Nov. 10, 2016

(30) Foreign Application Priority Data

Dec. 26, 2013 (JP) ................. 2013-270282
Jan. 28, 2014 (JP) ................. 2014-013216

(51) Int. Cl.
H01L 21/677 (2006.01)
H01L 21/67 (2006.01)
H01L 21/687 (2006.01)

(52) U.S. Cl.
CPC .. *H01L 21/67766* (2013.01); *H01L 21/67207* (2013.01); *H01L 21/67265* (2013.01); *H01L 21/67781* (2013.01); *H01L 21/68707* (2013.01)

(58) Field of Classification Search
CPC .................................. H01L 21/67766
See application file for complete search history.

(56) References Cited

U.S. PATENT DOCUMENTS 5,374,147 A 12/1994 Hiroki et al.
8,505,991 B2 * 8/2013 Minami ............ H01L 21/68707
294/103.1

(Continued)

FOREIGN PATENT DOCUMENTS

JP S61-152385 A 7/1986
JP H04-92446 A 3/1992

(Continued)

OTHER PUBLICATIONS

Sep. 22, 2014 International Search Report issued in International Patent Application No. PCT/JP2014/067238.

(Continued)

*Primary Examiner* — Gerald McClain
(74) *Attorney, Agent, or Firm* — Oliff PLC

(57) ABSTRACT

An end effector has a hand base portion at least a part of which advances below a lowermost substrate or above an uppermost substrate of a plurality of substrates stored in a substrate storing portion, a substrate holding unit provided to the hand base portion so as to hold the two or more substrates including the lowermost substrate or the uppermost substrate, and a protrusion amount change unit for changing a protrusion amount of the substrate holding unit from a reference surface including the surface of the hand base portion opposed to the lowermost substrate or the uppermost substrate. The protrusion amount change unit has (Continued)

a single drive source applying a drive force to the whole substrate holding unit.

20 Claims, 53 Drawing Sheets

(56) References Cited

U.S. PATENT DOCUMENTS

| | | | |
|---|---|---|---|
| 9,245,784 B2 * | 1/2016 | Hashimoto | ....... H01L 21/67742 |
| 2004/0186626 A1 | 9/2004 | Tsukamoto et al. | |
| 2005/0118010 A1 | 6/2005 | Ogawa et al. | |

FOREIGN PATENT DOCUMENTS

| | | |
|---|---|---|
| JP | H05-100199 A | 4/1993 |
| JP | H05-235147 A | 9/1993 |
| JP | H11-163096 A | 6/1999 |
| JP | 2925329 B2 | 7/1999 |
| JP | 2001-054890 A | 2/2001 |
| JP | 2001-118909 A | 4/2001 |
| JP | 2001-291759 A | 10/2001 |
| JP | 2003-060004 A | 2/2003 |
| JP | 2003-309166 A | 10/2003 |
| JP | 2005-161416 A | 6/2005 |
| JP | 2005-340729 A | 12/2005 |
| JP | 2007-109703 A | 4/2007 |
| JP | 2008-200837 A | 9/2008 |
| JP | 2009-012088 A | 1/2009 |
| JP | 2010-179420 A | 8/2010 |
| JP | 2011-091276 A | 5/2011 |
| JP | 2013-135099 A | 7/2013 |
| JP | 2013135099 A * | 7/2013 ....... H01L 21/67742 |
| NO | 2013/021645 A1 | 2/2013 |

OTHER PUBLICATIONS

Jun. 28, 2016 International Preliminary Report on Patentability issued in International Patent Application No. PCT/JP2014/067238.

* cited by examiner (a)
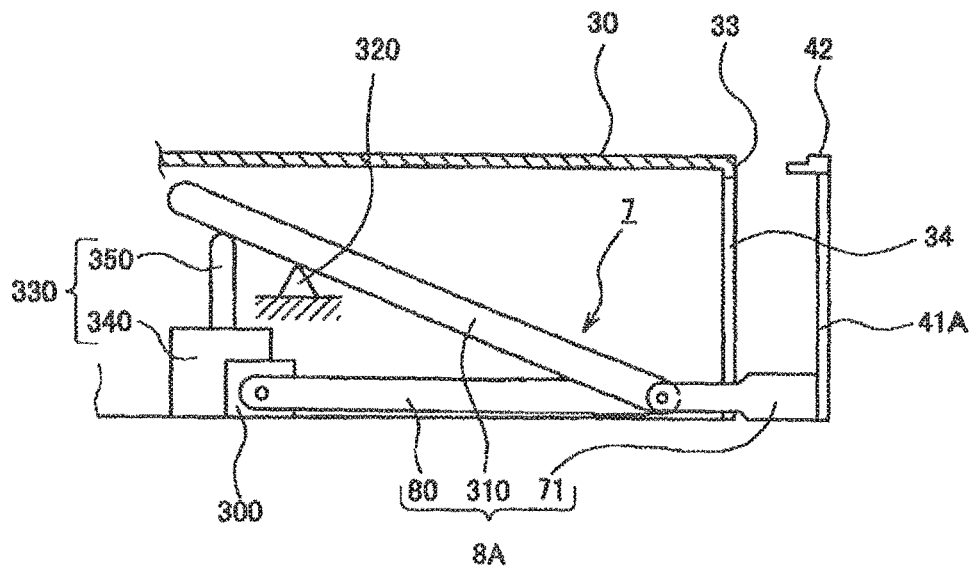
(b)
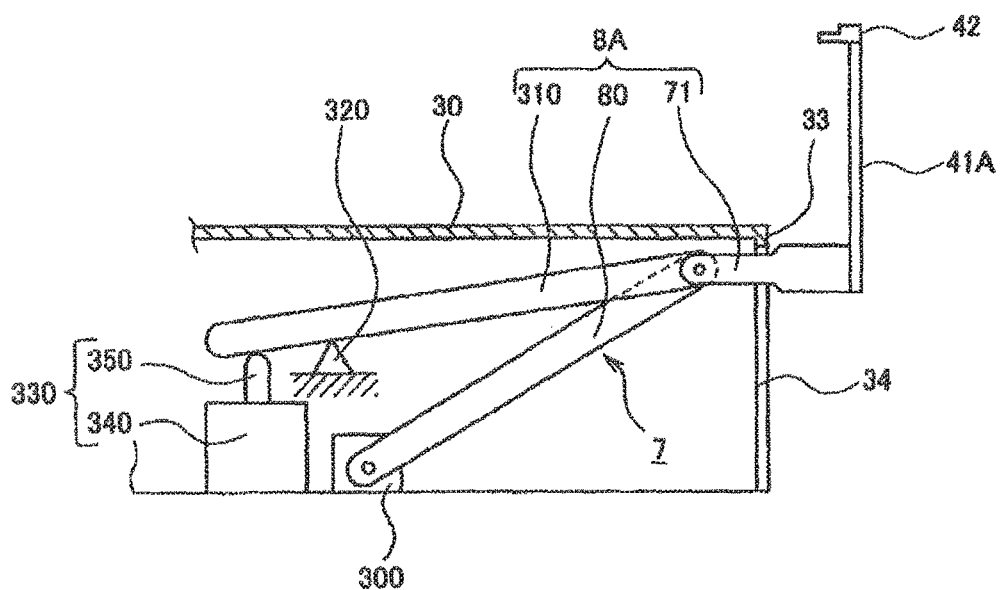
FIG. 13

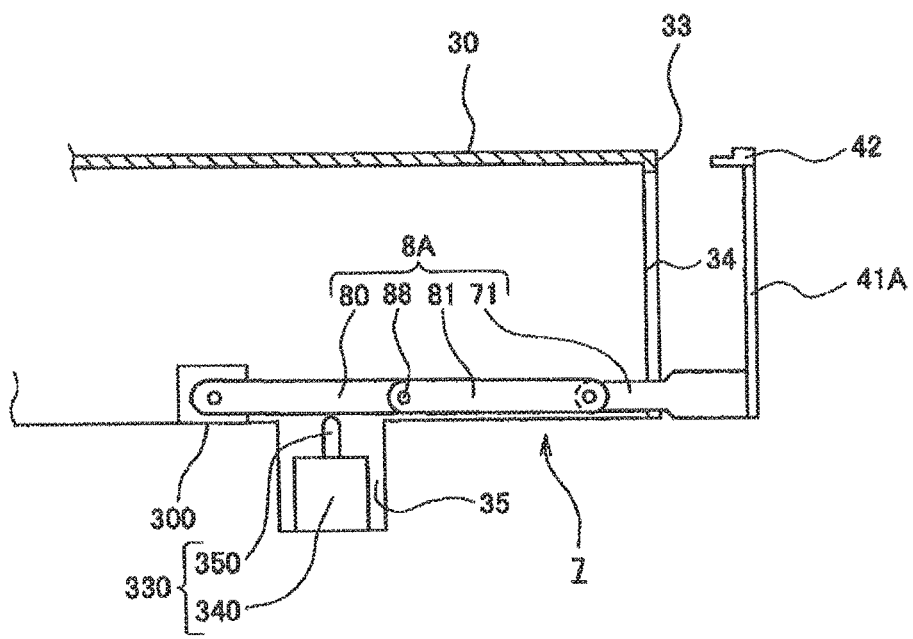
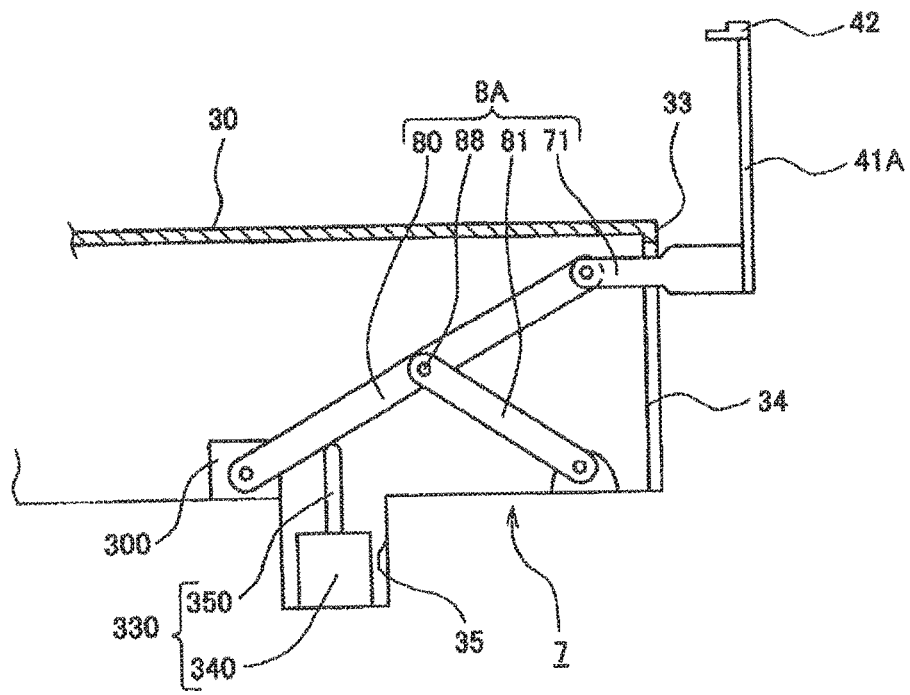
FIG. 14

(a)
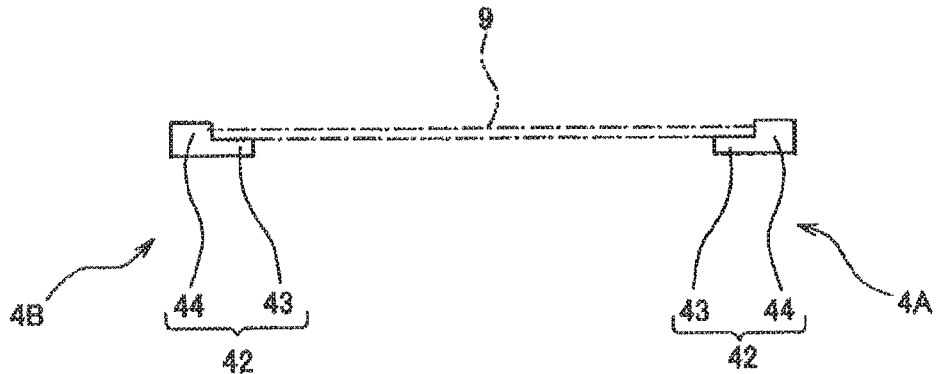
(b)
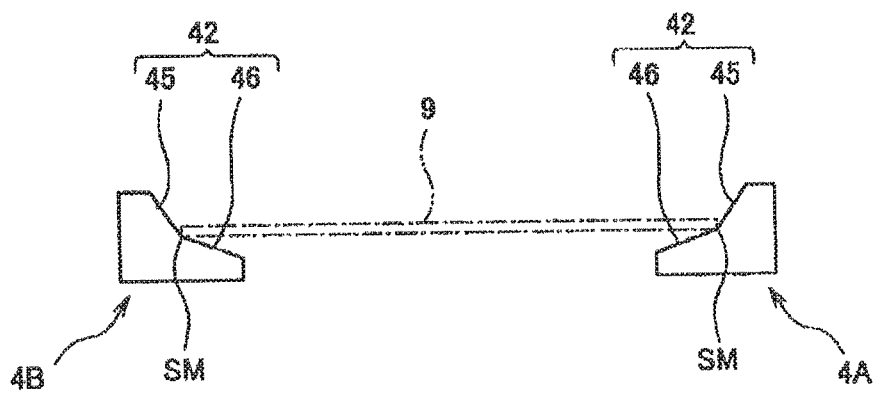
FIG. 15

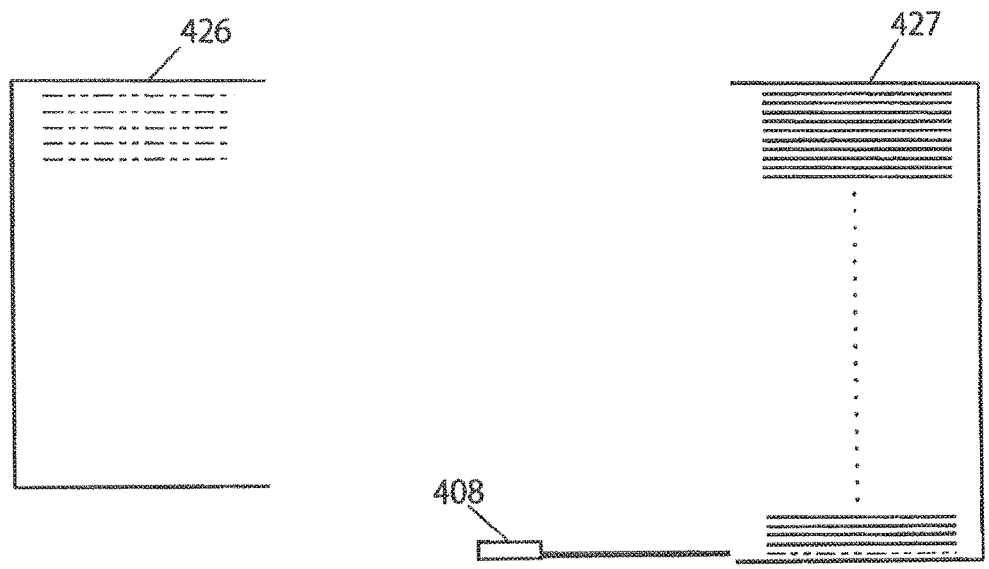
FIG. 25
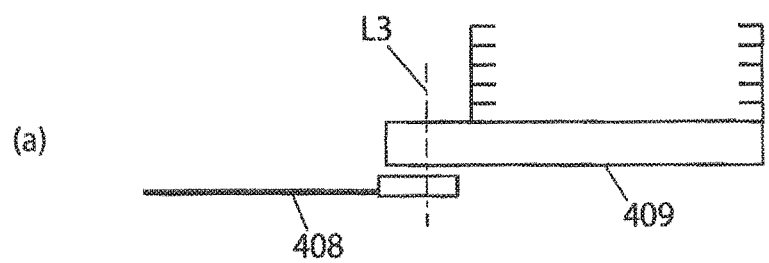
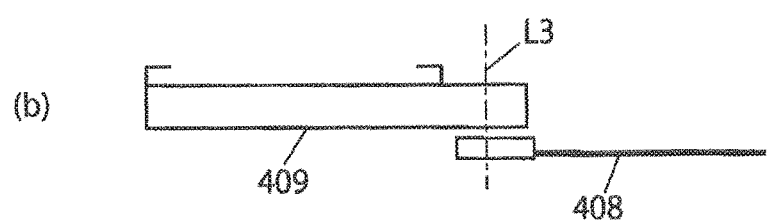
FIG. 26

(a)
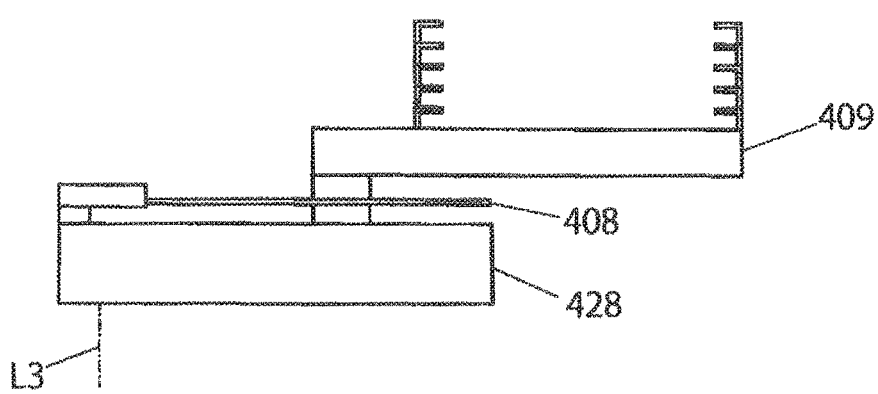
(b)
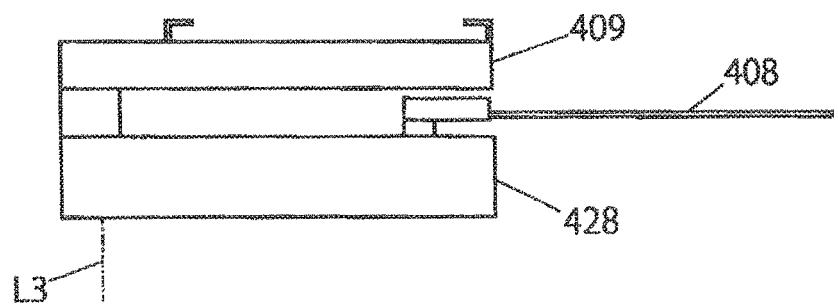
FIG. 33

Vertical Pitch Converting Operation

Substrate Pinching Operation

END EFFECTOR AND SUBSTRATE CONVEYING ROBOT

TECHNICAL FIELD

The present invention relates to an end effector of a robot and a substrate conveying robot comprising the end effector, particularly to an end effector capable of holding two or more substrates and a substrate conveying robot comprising the end effector.

BACKGROUND ART

Conventionally, a substrate conveying robot comprising an end effector is used in order to convey a substrate (plate member) such as a wafer for manufacturing semiconductors or a glass substrate for manufacturing liquid crystal panels.

The substrate conveying robot is taught conveying positions of substrates via a teaching device connected to a robot controller, and operates repeatedly between the taught conveying positions so as to convey the substrates. For example, the robot takes a wafer out from a substrate storing portion (FOUP, for example) in which a plurality of wafers are stored and conveys the wafer to another substrate storing portion (FOUP, for example) or the side of a wafer treating device.

An end effector holding a plurality of substrates and conveying the same simultaneously is proposed in order to enhance efficiency of conveying substrates from a conveying source to a conveying destination. This type of end effector has a hand of batch conveying type having a hand base portion at least a part of which advances below a plurality of substrates to be held and a substrate holding unit capable of holding a plurality of substrates.

CITATION LIST

Patent Literature

[PTL 1] Japanese Patent Application Laid-Open No. 2003-309166
[PTL 2] PCT International Application Publication No. WO2013/021645
[PTL 3] Japanese Patent No. 2925329
[PTL 4] Japanese Patent Application Laid-Open No. H05-235147
[PTL 5] Japanese Patent Application Laid-Open No. H11-163096
[PTL 6] Japanese Patent Application Laid-Open No. 2001-118909
[PTL 7] Japanese Patent Application Laid-Open No. 2001-291759
[PTL 8] Japanese Patent Application Laid-Open No. 2005-340729
[PTL 9] Japanese Patent Application Laid-Open No. S61-152385
[PTL 10] Japanese Patent Application Laid-Open No. 2009-12088
[PTL 11] Japanese Patent Application Laid-Open H04-92446

SUMMARY OF INVENTION

Technical Problem

However, in a batch conveying type hand holding two or more substrates simultaneously, a complicated mechanism is needed in order to enable the protrusion amount of a substrate holding unit in the vertical direction from a hand base portion to be changed for the purpose of enabling a vertical pitch of substrate holding positions to be changed or the like.

Then, an object of the present invention is to provide and end effector and a substrate conveying robot capable of simplifying a mechanism for enabling the protrusion amount of a substrate holding unit in the vertical direction from a hand base portion to be changed.

Solution to Problem

In order to achieve the object above, a first aspect of the present invention is an end effector capable of holding two or more substrates, comprising a hand base portion at least a part of which advances below a lowermost substrate or above an uppermost substrate of a plurality of substrates stored in a substrate storing portion, a substrate holding unit provided to the hand base portion so as to hold the two or more substrates including the lowermost substrate or the uppermost substrate, and a protrusion amount change unit for changing a protrusion amount of the substrate holding unit from a reference surface including a surface of the hand base portion opposed to the lowermost substrate or the uppermost substrate, wherein the protrusion amount change unit has a single drive source applying a drive force to a whole of the substrate holding unit.

A second aspect of the present invention is configured so that, in the first aspect, a vertical pitch of the two or more substrates held by the substrate holding unit is changed by changing the protrusion amount of the substrate holding unit by the protrusion amount change unit.

A third aspect of the present invention is that, in the first or second aspect, the substrate holding unit has a left set and a right set of substrate supporting portions provided to a distal end side of the hand base portion in order to support corresponding edge portions of the respective substrates and a left set and a right set of substrate supporting portions provided to a proximal end side of the hand base portion in order to support corresponding edge portions of the respective substrates, wherein the left and right sets of substrate supporting portions on the distal end side of the hand base portion are coupled to each other and the left and right sets of substrate supporting portions on the proximal end side of the hand base portion are coupled to each other.

A fourth aspect of the present invention is that, in any one of the first to third aspects, the at least a part of the hand base portion which advances below the lowermost substrate or above the uppermost substrate has a width smaller than 300 mm in left and right directions.

A fifth aspect of the present invention is that, in any one of the first to fourth aspects, the hand base portion has a front part to which the substrate holding unit is arranged and a rear part formed integrally with the front part, wherein the rear portion is thicker than the front part in a vertical direction.

A sixth aspect of the present invention is that, in any one of the first to fifth aspects, the substrate holding unit has a left set and a right set of substrate supporting portions provided to the distal end side of the hand base portion in order to support corresponding edge portions of the respective substrates and a left set and a right set of substrate supporting portions provided to the proximal end side of the hand base portion in order to support corresponding edge portions of the respective substrates, wherein, in a state that the two or more substrates are held by the substrate holding unit, a pair of forward and rearward left sets, and a pair of forward and rearward right sets of the substrate supporting portions are opposite to each other in inclination along left and right directions formed by the respective heights of the substrate supporting portions.

A seventh aspect of the present invention is that, in any one of the first to sixth aspects, the substrate holding unit is configured so as to support three points of an edge portion of each of the two or more substrates.

An eighth aspect of the present invention is that, in the seventh aspect, the substrate holding unit has a left set and a right set of substrate supporting portions provided to the distal end side of the hand base portion in order to support corresponding edge portions of the respective substrates and a left set and a right set of substrate supporting portions provided to the proximal end side of the hand base portion in order to support corresponding edge portions of the respective substrates, wherein the left and right sets of substrate supporting portions on the distal end side are configured to support different substrates, respectively.

A ninth aspect of the present invention is that, in any one of the first to eighth aspects, the substrate holding unit has a plurality of substrate supporting portions each for supporting an edge portion of the substrate, wherein at least one of the substrate supporting portions for supporting a closest one of the two or more substrates to the reference surface is fixed to the hand base portion.

A tenth aspect of the present invention is that, in any one of the first to ninth aspects, the substrate holding unit has a plurality of substrate supporting portions each for supporting an edge portion of the substrate, wherein each substrate supporting portion or at least a part of a member formed integrally with the same is formed of a material which is deformed easily when receiving an impact force.

An eleventh aspect of the present invention is that, in any one of first to tenth aspects, the substrate holding unit has a substrate supporting portion provided to the distal end side of an end effector body having the hand base portion, the substrate supporting portion including a substrate placing surface supporting a bottom surface edge portion of the substrate and a substrate supporting portion connecting mechanism connecting the substrate supporting portion to the distal end side of the end effector body so that the substrate supporting portion is displaced in response to an external force when the external force is applied to the substrate supporting portion.

An twelfth aspect of the present invention is that, in the eleventh aspect, the substrate supporting portion connecting mechanism has a unit for pivotably connecting a proximal end portion of the substrate supporting portion to the distal end side of the end effector body.

A thirteenth aspect of the present invention is that, in the twelfth aspect, the substrate supporting portion connecting mechanism has a resistance applying unit for applying a resistance to a pivoting operation of the substrate supporting portion with respect to the end effector body.

A fourteenth aspect of the present invention is that, in the twelfth or thirteenth aspect, a pivotal axis line of the pivotal operation of the substrate supporting portion with respect to the end effector body is oriented in a direction orthogonal to a vertical direction.

A fifteenth aspect of the present invention is that, in any one of the eleventh to fourteenth aspects, a displacement prohibiting unit for prohibiting a displacement of the substrate supporting portion when the external force is applied to the substrate supporting portion.

A sixteenth aspect of the present invention is that, in the fifteenth aspect, the displacement prohibiting unit has an abutting portion capable of advancing and retreating with respect to the substrate supporting portion and an abutting portion drive unit for moving the abutting portion between a reaching position capable of reaching the substrate supporting portion in a non-displaced position and a separate position separated from the substrate supporting portion in the non-displaced position.

A seventeenth aspect of the present invention is that, in the fifteenth or sixteenth aspect, a substrate supporting portion drive unit for moving the substrate supporting portion between an upper position and a lower position is further provided, wherein a limited state and a non-limited state of a displacement of the substrate supporting portion by the displacement prohibiting unit are switched therebetween according to a position of the substrate supporting portion in a vertical direction.

An eighteenth aspect of the present invention is that, in the seventeenth aspect, the substrate supporting portion is pivotable about its proximal end portion as the center in response to the external force, and the displacement prohibiting unit has an abutting portion abutted on the substrate supporting portion when the substrate supporting portion which has pivoted in response to the external force is moved downward by the substrate supporting portion drive unit so as to return the substrate supporting portion to a non-pivoted position.

A nineteenth aspect of the present invention is that, in the seventeenth or eighteenth aspect, the plurality of substrate supporting portions arranged in their respective different positions in a vertical direction are provided, wherein the substrate supporting portion drive unit is a unit for changing a pitch of the plurality of substrate supporting portions in the vertical direction.

A twentieth aspect of the present invention is that, in any one of the eleventh to nineteenth aspects, the substrate supporting portion is displaced in response to the external force generated when the substrate supporting portion collides with an object around the same during movement of the end effector in an advance direction from the proximal end side toward the distal end side of the end effector.

A twenty-first aspect of the present invention is that, in any one of the eleventh to twentieth aspects, a displacement detecting unit for detecting a displacement of the substrate supporting portion by the external force is further provided.

A twenty-second aspect of the present invention comprises the end effector according to any one of the first to twenty-first aspects and an articulated arm on whose distal end the end effector is mounted.

Also, various reference examples of the present invention will be described hereunder.

An end effector device according to an aspect of a first reference example of the present invention comprises a hand having a storing space and a plurality of holding portions provided to the hand and configured to hold portions different from each other in a peripheral direction of a peripheral edge portion of each plate member so as to hold the plurality of plate members, wherein each of the holding portions includes a plurality of receiving portions each receiving peripheral edge portion of the corresponding one of the plurality of plate members so that the plurality of plate members are arranged, by unit of all of the receiving portions, at intervals in a first direction substantially parallel with one plane and substantially orthogonal to the one plane, and a pitch converting mechanism configured to linearly move the plurality of receiving portions in the first direction so as to convert the intervals, wherein a plurality of linearly moving portions each moving linearly integrally with the corresponding one of the plurality of receiving portions of the pitch converting mechanism are provided to the hand so as to be exposed outside of the hand, and wherein a plurality of drive portions each driving the corresponding one of the plurality of linearly moving portions of the pitch converting mechanism are stored in the storing space of the hand.

According to this configuration, the pitch converting mechanism is divided into the linearly moving portions corresponding to their respective receiving portions and the drive portions. Although the linearly moving portions are exposed outside of the hand, the linearly moving portions linearly move together with the receiving portions receiving the plate members, and therefore the linearly moving portions are not rubbed against the plate members and do not include any actuating mechanisms inside, not generating particles. On the other hand, as the drive portions include the actuating mechanisms inside, they may generate particles, however, they are separated from the receiving portions receiving the plate members in the first direction as an arranging direction of the plate members and also stored inside of the hand. Thereby, the plate members can be prevented from being contaminated with particles caused by the pitch converting mechanism.

In addition, the drive portions of the pitch converting mechanism exist immediately close to the receiving portions. Thereby, accuracy of an operation of converting intervals of the receiving portions can be enhanced.

Moreover, the hand may include a hollow body portion formed so as to extend in a second direction substantially parallel with the one plane, and a hollow movable portion connected to a proximal end portion of the body portion so as to advance and retreat in the second direction, wherein the plurality of holding portions may include a first holding portion provided to a distal end portion of the body portion and a second holding portion provided to the movable portion.

According to this configuration, the plate member is held by the receiving portion of the first holding member provided to the distal end portion of the body portion of the hand and the receiving portion of the second holding portion provided to the movable portion of the hand, and therefore the plate member is held stably.

Moreover, the hand may be configured so that the peripheral edge portions of the plurality of plate members are held so as to be pinched by the first holding portion and the second holding portion when the movable portion advances, and the peripheral edge portions of the plurality of plate members are released from the second holding portion when the movable portion retreats.

According to this configuration, as the plurality of plate members are pinched by the first holding portion and the second holding portion, the plate members can be prevented from positional deviation when moving the hand.

The first reference example of the present invention can provide an end effector device which holds a plurality of plate members and comprises a pitch converting mechanism converting intervals between the held plate members, capable of reducing contamination of the plate members with particles generated by the pitch converting mechanism.

The second reference example of the present invention according to the first aspect is an end effector mounted on a robot arm, comprising independently drivable first and second hands, wherein the first hand has a hand body insertable between vertically adjacent substrates stored in a substrate storing portion, the first hand being configured to hold a substrate immediately above or immediately below the hand body inserted between the vertically adjacent substrates, and wherein the second hand has a hand base portion which at least partially advances below a lowermost substrate or above an uppermost substrate of a plurality of substrates stored in the substrate storing portion and a substrate holding unit provided to the hand base portion so as to hold two or more substrates including the lowermost substrate or the uppermost substrate.

The second reference example of the present invention according to the second aspect is that, in the second reference example of the present invention according to the first aspect, the first and second hands are each switchable between an operative position upon accessing the substrate storing portion and a retreat position upon not accessing the substrate storing portion.

The second reference example of the present invention according to the third aspect is that, in the second reference example of the present invention according to the first or second aspect, the substrate holding unit has a plurality of substrate supporting portions for supporting each bottom surface edge portion of the two or more substrates, the substrate supporting portions being arranged at different heights in a vertical direction at least in a substrate holding state.

The second reference example of the present invention according to the fourth aspect is that, in the second reference example of the present invention according to the third aspect, the plurality of substrate supporting portions are changeable in vertical pitch, wherein the substrate holding unit is configured to change in height in accordance with change in the vertical pitch of the plurality of substrate supporting portions.

The second reference example of the present invention according to the fifth aspect is that, in the second reference example of the present invention according to the third or fourth aspect, the plurality of substrate supporting portions are arranged to positions where they do not overlap each other at least partially in a view from a moving direction of the substrate supporting portion.

The second reference example of the present invention according to the sixth aspect is that, in the second reference example of the present invention according to the fifth aspect, the plurality of substrate supporting portions are changeable in vertical pitch, wherein positions of the plurality of substrate supporting portions in a view from the vertical direction do not change even when the vertical pitch is changed.

The second reference example of the present invention according to the seventh aspect is that, in the second reference example of the present invention according to any one of the first to sixth aspects, the first hand has the plurality of hand bodies.

The second reference example of the present invention according to the eighth aspect is that, in the second reference example of the present invention according to the seventh aspects, the plurality of hand bodies are changeable in vertical pitch.

The second reference example of the present invention according to the ninth aspect is that, in the second reference example of the present invention according to any one of the first to eighth aspects, a diameter of the substrate is 300 mm, the number of substrates to be held by the second hand is five, and, of the whole second hand, a height of a part which passes a region overlapping with the substrate stored in the substrate storing portion in a view of the vertical direction when conveying the substrate is 60 mm or less.

The second reference example of the present invention according to the tenth aspect is that, in the second reference example of the present invention according to any one of the first to eighth aspects, a diameter of the substrate is 450 mm, the number of substrates to be held by the second hand is five, and, of the whole second hand, a height of a part which passes a region overlapping with the substrate stored in the substrate storing portion in a view of the vertical direction when conveying a substrate is 72 mm or less.

A substrate conveying robot of the second reference example of the present invention according to the eleventh aspect comprises the end effector of the invention according to any one of the first to tenth aspects, and a robot arm on which the end effector is mounted.

A substrate treating system of the second reference example of the present invention according to the twelfth aspect comprises a substrate conveying system including the substrate conveying robot according to the eleventh aspect, and a substrate treating device for treating a substrate conveyed by the substrate conveying system.

The second reference example of the present invention according to the thirteenth aspect is a substrate conveying system comprising the substrate conveying robot of the invention according to the eleventh aspect and the substrate storing portion for storing a plurality of substrates, wherein H>h and (N−M)=n×(positive integer) is established, where the number of substrates to be stored in the substrate storing portion is N, the number of substrates to be carried out by the first hand from one vertical end region of the substrate storing portion is M, the number of substrates to be held by the second hand is n, a height of a space formed in the one end region of the substrate storing portion when M-number of substrates are carried out by the first hand is H, and a height of a part, of the whole second hand, which passes a region overlapping with the substrate stored in the substrate storing portion in a view of the vertical direction when conveying the substrate is h.

The second reference example of the present invention according to the fourteenth aspect is a substrate conveying method using the substrate conveying robot of the present invention according to the eleventh aspect comprising a first conveying step for carrying-out one or a plurality of substrates in one vertical end region of the substrate storing portion of a conveying source by the first hand, and a second conveying step for carrying-out a plurality of substrates simultaneously by inserting the second hand into the one end region where the one or plurality of substrates has/have been carried out according to the first conveying step.

The second reference example of the present invention according to a fifteenth aspect is that, in the second reference example of the present invention according to the fourteenth aspect, all of substrates left in the substrate storing portion of the conveying source after the first conveying step are carried out by the second hand.

The second reference example of the present invention according to the sixteenth aspect satisfies M=N−n×(positive integer), in the second reference example of the present invention according to the fourteenth aspect, where the number of substrates to be carried out by the first hand in the first conveying step is M, the number of substrates to be stored in the substrate storing portion is N, and the number of substrates to be held by the second hand is n.

The second reference example of the present invention according to the seventeenth aspect is that M=5, n=5 in the present invention according to the sixteenth aspect.

The second reference example of the present invention according to the eighteenth aspect is that, in the second reference example of the present invention according to any one of the fourteenth to seventeenth aspects, a substrate carried out from the one end region of the substrate storing portion of the conveying source in the first conveying step is carried into one vertical end region in a substrate storing portion of a conveying destination, wherein the one end region in the substrate storing portion of the conveying source and the one end region in the substrate storing portion of the conveying destination are vertically opposite end regions.

The second reference example of the present invention according to the nineteenth aspect is that, in the second reference example of the present invention according to the fourteenth aspect, a part of the substrates left in the substrate storing portion of the conveying source after the first conveying step is carried out by the second hand and carried into a vertically intermediate region in a substrate storing portion of a conveying destination, wherein a substrate left in the other vertical end region in the substrate storing portion of the conveying source is carried out by the first hand and carried into one vertical end region in the substrate storing portion of a conveying destination, and wherein the one end region in the substrate storing portion of the conveying source and the one end region in the substrate storing portion of the conveying destination are vertically opposite end regions.

The second reference example of the present invention according to the twentieth aspect is that, in the second reference example of the present invention according to any one of the fourteenth to nineteenth aspects, the end effector is the end effector of the invention according to the fourth aspect, wherein in the second conveying step, a height of the substrate holding unit is set to a height lower than its maximum height when firstly inserting the second hand into the one end region of the substrate storing portion of the conveying source.

The second reference example of the present invention according to the 21st aspect is that, in the second reference example of the present invention according to the twentieth aspect, when the second hand is inserted into an inside of the substrate storing portion twice or more after the first conveying step, the vertical pitch of the plurality of substrate supporting portions is set to be a maximum pitch upon insertion of second time or after.

The substrate conveying robot of the second reference example of the present invention according to the 22nd aspect comprises a first robot arm, a second robot arm drivable independently from the first robot arm, a first hand mounted on the first robot arm, and a second hand drivable independently from the first hand and mounted on the second robot arm, wherein the first hand has a hand body insertable between vertically adjacent substrates stored in a substrate storing portion, the first hand being configured to hold a substrate immediately above or immediately below the hand body which is inserted between the vertically adjacent substrates, and wherein the second hand has a hand base portion which at least partially advances below a lowermost substrate or above an uppermost substrate of a plurality of substrates stored in the substrate storing portion, and a substrate holding unit provided to the hand base portion so as to hold two or more substrates including the lowermost substrate or the uppermost substrate.

The second reference example of the present invention according to the 23rd aspect is a substrate conveying system comprising a first substrate conveying robot and a second substrate conveying robot, wherein the first substrate conveying robot has a first robot arm on which a first hand is mounted, wherein the first hand has a hand body insertable between vertically adjacent substrates stored in a substrate storing portion, the first hand being configured to hold a substrate immediately above or immediately below the hand body inserted between the vertically adjacent substrates, wherein the second substrate conveying robot has a second robot arm on which a second hand in mounted, and wherein the second hand has a hand base portion which at least partially advances below a lowermost substrate or above an uppermost substrate of a plurality of substrates stored in the substrate storing portion, and a substrate holding unit provided to the hand base portion so as to hold two or more substrates including the lowermost substrate or the uppermost substrate.

The second reference example of the present invention according to the 24th aspect is an end effector to be mounted on a robot arm comprising independently drivable first and second hands, wherein the first hand has a hand body insertable between vertically adjacent substrates stored in a substrate storing portion, the first hand being configured to hold a substrate immediately above or immediately below the hand body inserted between the vertically adjacent substrates, and wherein the second hand has a hand base portion which at least partially advances below a lowermost substrate or above an uppermost substrate of a plurality of substrates stored in the substrate storing portion, and a substrate holding unit extendable in a vertical direction over a range including two or more substrates stored in the substrate storing portion in a state that the hand base portion is at least partially positioned below the lowermost substrate or above the uppermost substrate.

The second reference example of the present invention according to the 25th aspect is that the state that the substrate holding unit is extended in the vertical direction over the range including two or more substrates stored in the substrate storing portion can be achieved without moving the hand base portion in a vertical direction in the state that the hand base portion is at least partially positioned below the lowermost substrate or above the uppermost substrate.

Note that, in the description, "upper (upper side, upward)" and "lower (lower side, downward)" refer to the top surface side of a substrate and the bottom surface side of the substrate respectively, in a direction perpendicular to the surface of the substrate held by an end effector.

According to the second reference example of the present invention, a substrate conveyance using a batch conveying type hand can be performed without any problem even when the use of the batch conveying type hand is restricted due to a circumstance of the substrate storing portion side.

A third reference example of the present invention is that, in an end effector mounted on a distal end of a robot arm, an end effector body connected to the distal end of the robot arm and arranged on a bottom surface side of a substrate, a substrate supporting portion provided on the distal end side of the end effector body and including a substrate placing surface supporting a bottom surface edge portion of the substrate, and a substrate supporting portion connecting mechanism connecting the substrate supporting portion to the distal end side of the end effector body so that the substrate supporting portion is displaced in response to an external force when the external force is applied to the substrate supporting portion are provided.

Also, it is preferable that the substrate supporting portion connecting mechanism has a unit for pivotably connecting a proximal end portion of the substrate supporting portion to the distal end side of the end effector body.

Also, it is preferable that the substrate supporting portion connecting mechanism has a resistance applying unit for applying a resistance to a pivotal operation of the substrate supporting portion with respect to the end effector body.

Also, it is preferable that a pivotal axis line of a pivotal operation of the substrate supporting portion with respect to the end effector body is oriented in a direction orthogonal to a vertical direction.

Also, it is preferable that a displacement prohibiting unit for prohibiting a displacement of the substrate supporting portion when the external force is applied to the substrate supporting portion is further provided.

Also, it is preferable that the displacement prohibiting unit has an abutting portion capable of advancing and retreating with respect to the substrate supporting portion and an abutting portion drive unit for moving the abutting portion between a reaching position capable of reaching the substrate supporting portion in a non-displaced position and a separate position separated from the substrate supporting portion in the non-displaced position.

Also, it is preferable that a substrate supporting portion drive unit for moving the substrate supporting portion between an upper position and a lower position is further provided, wherein a limited state and a non-limited state of a displacement of the substrate supporting portion by the displacement prohibiting unit are switched therebetween according to a position of the substrate supporting portion in a vertical direction.

Also, it is preferable that the substrate supporting portion is pivotable about its proximal end portion as the center in response to the external force, and the displacement prohibiting unit has an abutting portion abutted on the substrate supporting portion when the substrate supporting portion which has pivoted in response to the external force is moved downward by the substrate supporting portion drive unit so as to return the substrate supporting portion to a non-pivoted position.

Also, it is preferable that the plurality of substrate supporting portions arranged in their respective different positions in a vertical direction are provided, wherein the substrate supporting portion drive unit is a unit for changing a pitch of the plurality of substrate supporting portions in the vertical direction.

Also, it is preferable that the substrate supporting portion is displaced in response to the external force generated when the substrate supporting portion collides with an object around the same during movement of the end effector in an advance direction from a proximal end side toward a distal end side of the end effector.

Also, it is preferable that a displacement detecting unit for detecting a displacement of the substrate supporting portion by the external force is further provided.

A substrate conveying robot according to the third reference example of the present invention comprises the end effector according to any one of the above and an articulated arm on whose distal end the end effector is mounted.

Note that "upper (upper side)" and "lower (lower side)" herein refer to the top surface side of a substrate and the bottom surface side of the substrate, respectively, in a direction perpendicular to the surface of the substrate held by an end effector.

According to the third reference example of the present invention, an impact force when the end effector collides with a structure around the same can be mitigated with high sensitivity.

Advantageous Effect of Invention

According to the invention, it is possible to provide an end effector and a substrate conveying robot capable of simplifying a mechanism for enabling the protrusion amount of a substrate holding unit in the vertical direction from a hand base portion to be changed.

BRIEF DESCRIPTION OF THE DRAWINGS

FIG. 13 (a), (b) is a side view illustrating a second variation of the pitch converting mechanism.

FIG. 14 (a), (b) is a side view illustrating a third variation of the pitch converting mechanism.

FIG. 15 (a), (b) is a side view illustrating a variation of the receiving portion.

FIG. 25 is a schematic view illustrating a variation of the substrate conveying process in FIG. 24C.

FIG. 26 is a schematic view illustrating a hand switchover mechanism of the substrate conveying robot in FIG. 16.

FIG. 33 is a schematic view for illustrating the hand switchover mechanism in FIG. 32.

DESCRIPTION OF EMBODIMENTS

Hereunder, an embodiment of the first reference example of the present invention will be described in detail using drawings. Note that, the same numerals are allocated to the same or corresponding parts in all of the drawings in the description below so as to omit overlapping descriptions. Also, the vertical direction refers to the direction along the vertical line in the description below.

<General Configuration of Plate Member Conveying Robot>

The first reference example of the present invention relates to an end effector mounted to a distal end portion of an arm of a plate member conveying robot. First, the plate member conveying robot will be generally described. Also, although a disk-shaped semiconductor wafer is exemplified as a plate member conveyed by the plate member conveying robot, the plate member is not limited to the semiconductor wafer. For example, the plate member may be a glass substrate for a thin liquid crystal display or an organic EL display treated by a semiconductor process. Also, the semiconductor wafer is a substrate material of a semiconductor device, including a silicon wafer, a silicon carbide wafer, a sapphire wafer, or the like.

In the embodiment, the plate member conveying robot comprises a pitch converting mechanism converting a vertical pitch of adjacent semiconductor wafers when conveying a plurality of semiconductor wafers from a hoop to another spot for performing a predetermined treatment as hereunder. In the description below, the pitch converting mechanism performs the operation of widening a vertical pitch of adjacent semiconductor wafers when conveying a plurality of semiconductor wafers from a hoop to another spot.

Figure 1A:
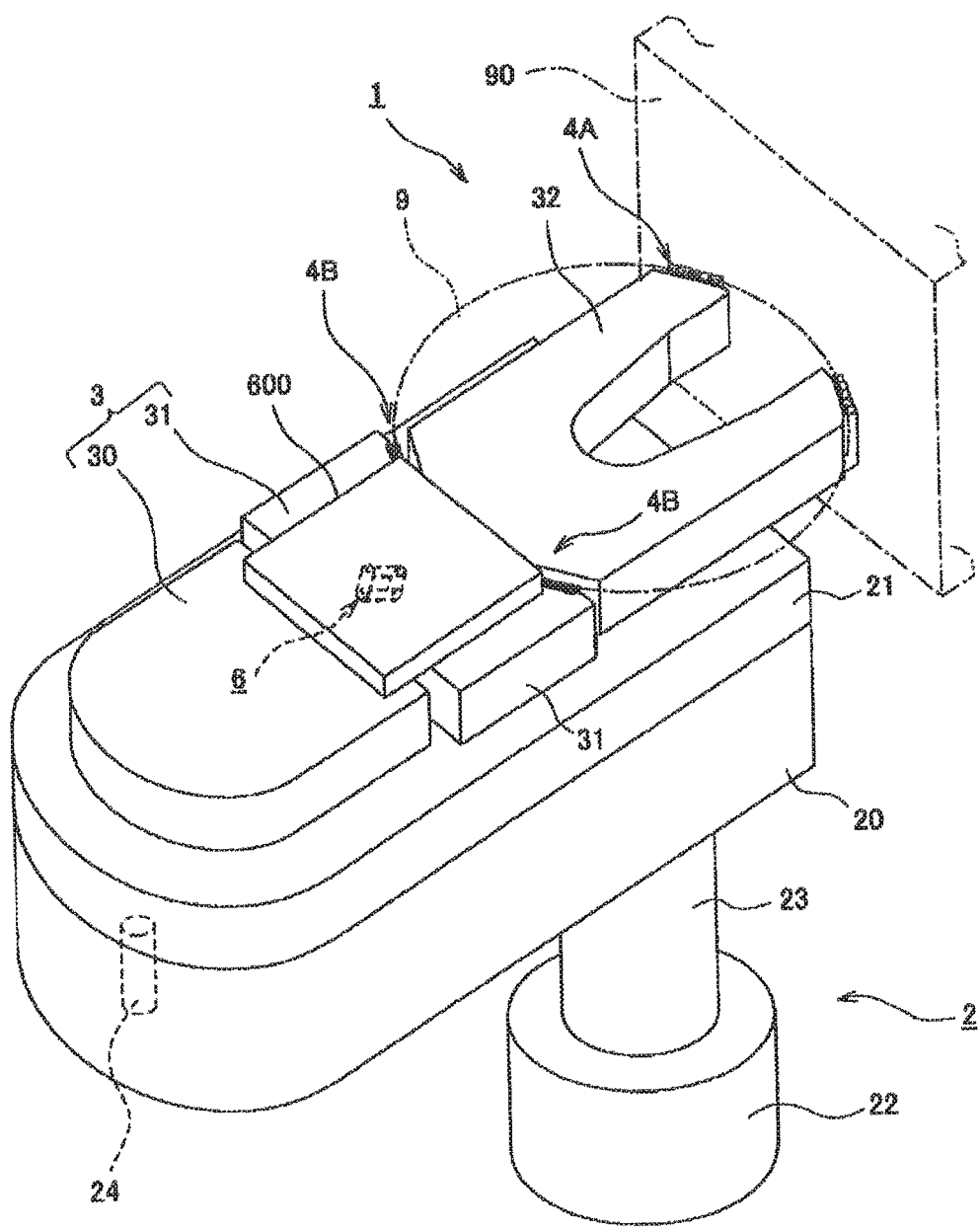
FIG. 1A is an entire perspective view illustrating a plate member conveying robot in which the end effector device according to an embodiment of the first reference example of the present invention is used.
Figure 1B:
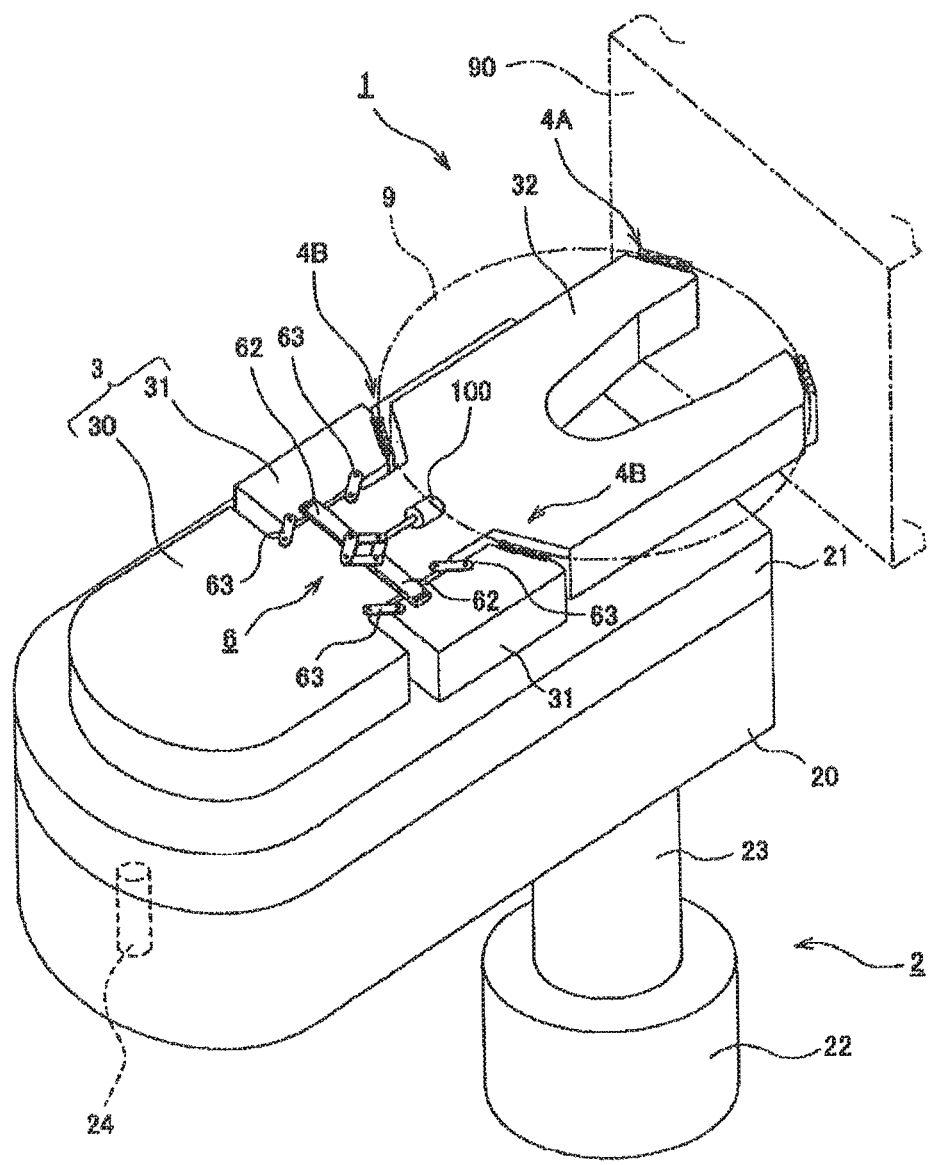
FIG. 1B is an entire perspective view illustrating a plate member conveying robot in which the end effector device according to an embodiment of the first reference example of the present invention is used.

Each of FIGS. 1A and 1B is an entire perspective view of a plate member conveying robot 2, FIG. 1A illustrating a state that a cover 600 described later is mounted and FIG. 1B illustrating a state that the cover 600 is removed, respectively. The plate member conveying robot 2 is a robot arranged in a semiconductor treating equipment so as to convey a plurality of semiconductor wafers, for example, being so called a horizontal articulated robot. The plate member conveying robot 2 is configured by a supporting base 22 fixed to a floor surface, an arm supporting shaft 23 liftably and pivotably provided on the supporting base 22, and an arm 20 extending in the horizontal direction whose one end portion is rotatably mounted to an upper end portion of the arm supporting shaft 23, for example. One end portion of a base 21 extending in the horizontal direction overlapping with the arm 20 is provided to the other end portion of the arm 20 so as to rotate in the horizontal plane via a shaft body 24 extending vertically. Operations of the plate member conveying robot 2 and an end effector device 1 which will be described later are controlled by a control device which is not illustrated.

A hand 3 formed to be thick is provided on the base 21. A hoop 90 storing a plurality of semiconductor wafers 9 at vertical intervals is provided in the semiconductor treating equipment opposing to a distal end portion of the hand 3. For convenience of explanation, in the embodiment, five semiconductor wafers 9 are stored in the height direction at equal intervals in the hoop 90. The arm 20 rotates in the horizontal plane about the arm supporting shaft 23 as the center and also the base 21 rotates about the shaft body 24 as the center. Thereby the hand 3 can approach and be separated with respect to the hoop 90. In the description below, a direction of the hand 3 toward the hoop 90 is referred to as a front(forward) direction, and a direction that the hand 3 is separated from the hoop 90 is referred to as a rear(rearward) direction. Also, a direction orthogonal to the forward and rearward direction in the horizontal plane is referred to as left and right directions. Additionally, movements of the hand 3 in the front direction and the rear direction are referred to as advance and retreat, respectively.

Here, the semiconductor treating equipment may be configured by a treating device and a conveying device. The treating device is a device performing a predetermined treatment to a semiconductor wafer. The conveying device is a device conveying a semiconductor wafer between the hoop 90 and the treating device. The plate member conveying robot 2 may be arranged in the treating device or may be arranged in the conveying device.

Also, a mechanism which drives the hand 3 is referred to as a hand drive mechanism. In the embodiment, the hand drive mechanism is configured by the arm 20, the base 21, the supporting base 22, the supporting shaft 23, and the shaft body 24. The hand drive mechanism is not limited to this configuration, and various configurations capable of conveying a semiconductor wafer by driving the hand 3 can be employed. For example, configurations of orthogonal coordinate type, cylindrical coordinate type, articulated type, and parallel link type can be employed.

The hand 3 comprises a body portion 30 fixed to the base 21 so that the longitudinal direction thereof is along the base 21, and two movable portions 31 positioned on both sides of the center portion in the longitudinal direction of the body portion 30 and provided so as to advance and retreat on the base 21. Both the body portion 30 and the movable portions 31 are formed to be hollow, and storing spaces consisting of the hollow parts are formed thereinside. A horizontal opposed surface 32 is formed in an area for holding a semiconductor wafer 9 on a distal end portion of the body portion 30, and a plurality of, four in FIGS. 1A and 1B, holding portions each of which holds the corresponding peripheral edge portions of the semiconductor wafers 9 are provided around the opposed surface 32. The holding portions are comprised of two first holding portions 4A provided so as to be separated from each other on the left and right on the distal end portion of the body portion 30 and two second holding portions 4B each provided on a distal end portion of the corresponding movable portion 31. Namely, portions different from each other of the peripheral edge portion of the semiconductor wafer 9 are held by a plurality of first holding portions 4A and second holding portions 4B. The main portion of the end effector 1 to be mounted on a distal end portion of the plate member conveying robot 2 is configured by the hand 3 and the both holding portions 4A, 4B.

As illustrated in FIG. 1A, a cover 600 is provided on the center portion in the longitudinal direction of the body portion 30, and a four-joint link mechanism 6 in a parallelogram shape is provided inside of the cover 600, as illustrated in FIG. 1B.

Figure 2:
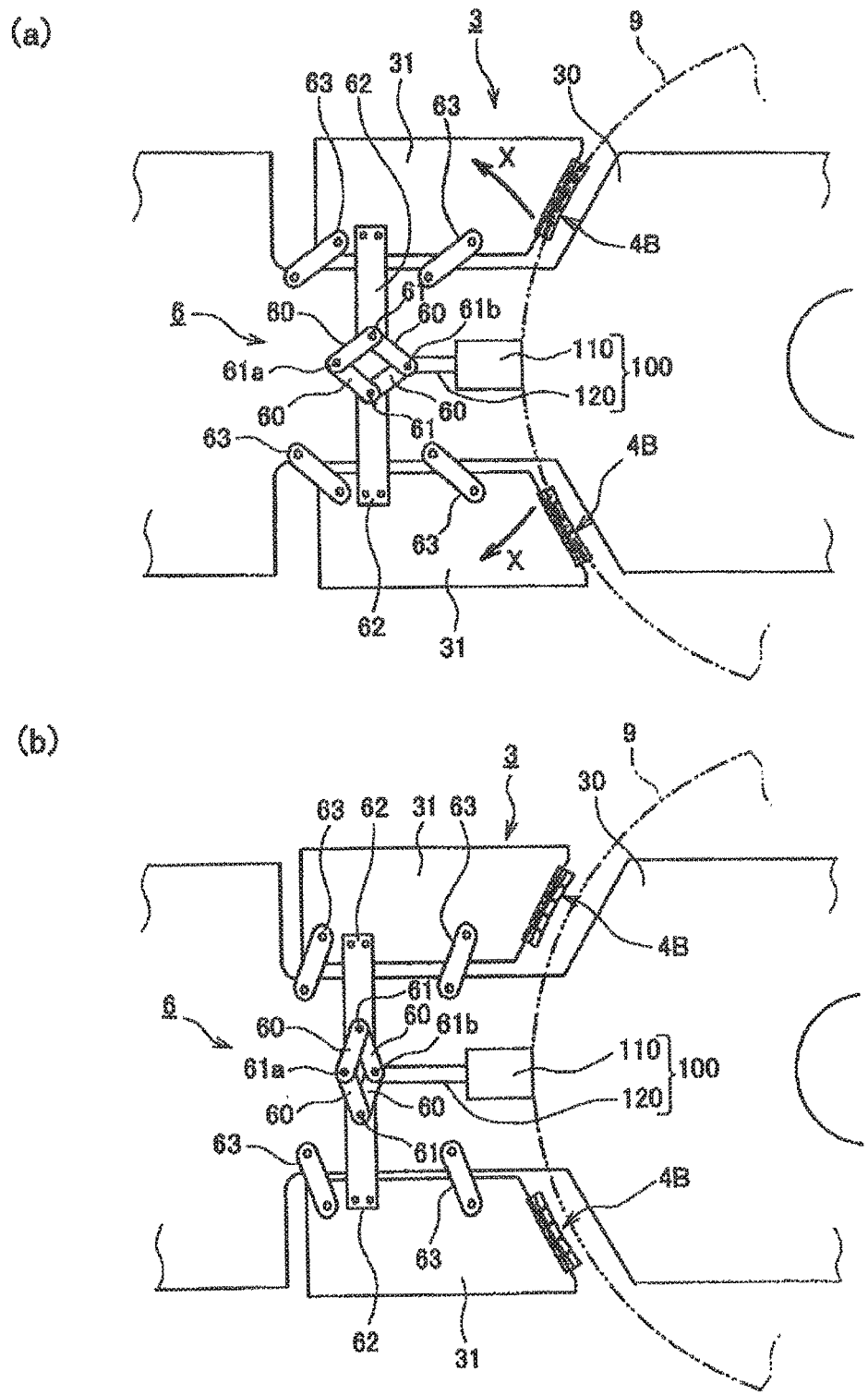
FIG. 2 (a), (b) is a plan view illustrating a positional relation between a body portion and a movable portion.

FIG. 2 (*a*), (*b*) is a plan view illustrating a positional relation between the body portion 30 and the movable portion 31. The four-joint link mechanism 6 on the body portion 30 is configured by connecting four small link plates 60 with four connecting shafts 61, 61*a*, 61*b* so as to form a parallelogram shape. An actuator 100 is provided in front of the four-joint link mechanism 6, and the actuator 100 is configured to provide a piston 120 in a housing 110 retractably in the forward and rearward direction.

Of the four connecting shafts, the rearmost connecting shaft is fixed to the body portion 30, and this connecting shaft is referred to as a fixed connecting shaft 61*a*. The piston 120 of the actuator 100 is mounted to a connecting shaft positioned on a diagonal of the four-joint link mechanism 6 with respect to the fixed connecting shaft 61*a*. Thereby, the connecting shaft is driven forward and rearward. This connecting shaft is referred to as a driven connecting shaft 61*b*. Of the four connecting shafts, two connecting shafts 61 other than the fixed connecting shaft 61*a* and the driven connecting shaft 61*b* are connected to the movable portion 31 via connecting plates 62 extending to the left and right, respectively.

Two pivoting auxiliary link plates 63 connecting the movable portion 31 movably forward and rearward with respect to the body portion 30 are provided in parallel with each other and separated forward and rearward between the body portion 30 and each movable portion 31. Namely, the body portion 30, the movable portion 31, and two pivoting auxiliary link plates 63 are connected to one another so as to configure a parallel link.

A mechanism driving the second holding portion 4B with respect to the body portion 30 is referred to as a second holding portion drive mechanism. The second holding portion drive mechanism is configured by the four-joint link mechanism 6, the connecting plates 62, the pivoting auxiliary link plates 63, and the movable portions 31 above in the embodiment. The second holding portion drive mechanism is not limited to this configuration, and an actuator such as an air cylinder in which a piston is fixed to the body portion 30 and a housing is fixed to the second holding portion 4B can be employed.

In a state that the piston 120 is retracted into the housing 110 as illustrated in FIG. 2 (*a*), the movable portions 31 are in an advanced state and the second holding portions 4B hold peripheral edge portions of the semiconductor wafer 9. When the piston 120 protrudes from the housing 110 from this state as illustrated in FIG. 2 (*b*), the driven connecting shaft 61*b* moves to the rear. The two small link plates 60 positioned on the both sides of the fixed connecting shaft 61*a* pivot so as to open from each other. Thereby the connecting plates 62 arcuately move to the rear about the fixed connecting shaft 61*a* as the center. Note that, the small link plates 60 and pivoting auxiliary link plates 63 are in parallel with each other, and the small link plates 60 and pivoting auxiliary link plates 63 configure a parallelogram. The movable portion 31 is restricted by the pivoting auxiliary link plates 63 and retreats in a rotational direction (direction of arrow X in FIG. 2 (*a*)) of each pivoting auxiliary link plate 63. As illustrated in FIG. 2 (*b*), the second holding portions 4B are separated from the peripheral edge portions of the semiconductor wafer 9 so as to release the holding of the semiconductor wafer 9.

Namely, when taking the semiconductor 9 from the hoop 9, the movable portion 31 rotates in the advance direction and the second holding portions 4B hold the peripheral portions of the semiconductor wafer 9 as illustrated in FIG. 2 (*a*). When placing the taken semiconductor wafer 9 on another spot for performing a predetermined treatment, the actuator 100 is actuated so as to rotate the movable portion 31 in the retreat direction as illustrated in FIG. 2 (*b*). The second holding portions 4B are separated from the peripheral edge portions of the semiconductor wafer 9 so as to release the holding of the semiconductor wafer 9.

When the small link plates 60 pivot, the small link plates 60 sometimes rub each other, causing particles as a result. The cover 600 is put over the four-joint link mechanism 6 in order to prevent the particles from scattering. Accordingly, the cover 600 does not need to be provided when the four-joint link mechanism 6 is stored in the body portion 30.

In the embodiment, the first holding portions 4A are not displaced relatively in the horizontal direction with respect to the body portion 30. On the other hand, the second holding portions 4B are displaced relatively in the horizontal direction, specifically in the forward and rearward direction with respect to the body portion 30 of the hand 3. By configuring in this way, the operation of the second holding portion drive mechanism does not need to be transferred to the first holding portions 4A, enabling a drive system to be configured simply. Note that the operation of the first holding portions 4A in the horizontal direction is realized by driving the hand 3 by the hand drive mechanism.

Figure 3:
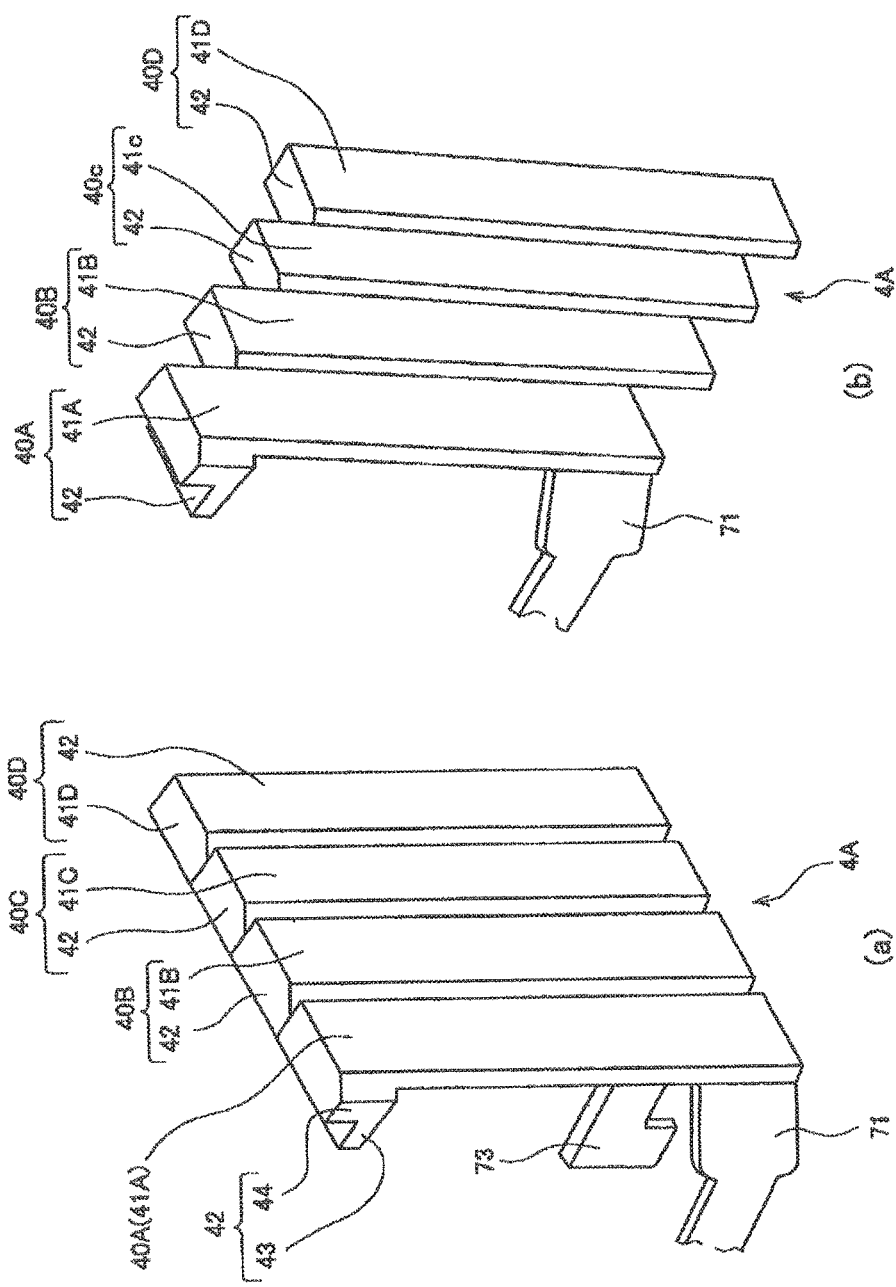
FIG. 3 (a), (b) is a perspective view illustrating a first holding portion.

FIG. 3 (*a*) (*b*) is a perspective view of the first holding portion 4A. Although FIG. 3 (*a*), (*b*) illustrates a state of the first holding portion 4A on the left side of the body portion 30 in a view from the front, the first holding portion on the right side of the body portion 30 has the same configuration.

The first holding portion 4A comprises four linearly moving bodies 40A, 40B, 40C, 40D continued along a peripheral edge portion of the semiconductor wafer 9 corresponding to the number of semiconductor wafers 9 to be gripped and elevated and a pitch converting mechanism described later for elevating the linearly moving portions 40A, 40B, 40C, 40D by their respective heights different from each other. While the number of semiconductor wafers 9 to be gripped is five, the number of the linearly moving bodies 40A, 40B, 40C, 40D is four. This is because the lowermost semiconductor wafer 9 is supported by receiving portions 42 fixed on the hand 3 and is not elevated.

The four linearly moving bodies 40A, 40B, 40C, 40D are provided so as to be moved vertically, and each linearly moving body 40A, 40B, 40C, 40D is configured providing the receiving portion 42 supporting a lower surface of a peripheral edge portion of the semiconductor wafer 9 to a distal end portion, namely upper end portion of each of linearly moving portions 41A, 41B, 41C, 41D which is a rectangular plate material. The receiving portion 42 is formed so that an abutting wall 44 protrudes upward from a proximal end portion of a horizontal piece 43, the horizontal piece 43 receives and supports the lower surface of the peripheral edge portion of the semiconductor wafer 9, and the abutting wall 44 abuts on a peripheral surface of the semiconductor wafer 9. In a state that the first holding portions 4A and the second holding portions 4B hold the semiconductor wafer 9, the semiconductor wafer 9 is pressed and held inwardly, specifically toward the center in the radial direction by the abutting walls 44 of the respective receiving portions 42 of the first holding portions 4A and the abutting walls 44 of the second holding portions 4B (refer to FIG. 15 (*a*)). Namely, the semiconductor wafer 9 is gripped by an edge grip by the both holding portions 4A, 4B. Thereby, the semiconductor wafer 9 is surely gripped even when the base 21 and the arm 20 rotate at a high speed.

The four linearly moving portions 41A, 41B, 41C, 41D move from the state that heights of the respective receiving portions 42 are uniform at the lowermost position as illustrated in FIG. 3 (*a*) to the state that they elevate by their respective straight distances corresponding to arrangement height positions of the semiconductor wafers 9 to be received by the respective receiving portions 42, as illustrated in FIG. 3 (*b*). The linearly moving portion 41A, 41B, 41C, 41D elevate so as to lower in order along the peripheral edge portion of the semiconductor wafer 9, for example. Namely, the linearly moving portion 41A elevates to the highest level and the linearly moving portion 41D elevates to the lowest level. Thereby, a pitch as vertical intervals of a plurality of semiconductor wafers 9 held by the respective linearly moving portions 41A, 41B, 41C, 41D is converted. In the following description, a linear moving portion which elevates to the highest level is referred to as a first linearly moving portion 41A, and the other linear moving portions are referred to as a second, third, and fourth linearly moving portions 41B, 41C, 41D, respectively in the order of higher elevating height, for convenience of explanation. Note that, the order of elevation of the first to the fourth linearly moving portions 41A, 41B, 41C, 41D may be opposite to the above.

Note that, the second holding portion 4B is configured so as to comprise the four linearly moving portions 41A, 41B, 41C, 41D elevating so as to be high or low in order along the peripheral edge portion of the semiconductor wafer 9 and the pitch converting mechanism, like the first holding portion 4A. The semiconductor wafer 9 is held by the receiving portions 42 of the first holding portion 4A and the receiving portions 42 of the second holding portion 4B positioned at the same height as the receiving portions 42 of the first holding portion 4A. In the state of being held by the receiving portions 42, the semiconductor wafer 9 is positioned in a plane substantially in parallel with the opposed surface 32 of the hand 3. Namely, the opposed surface 32 corresponds to "one plane" in the first reference example of the present invention, and the vertical direction corresponds to "first direction" in the first reference example of the present invention. Also, the forward and rearward direction is "second direction" in the first reference example of the present invention.

In the embodiment illustrated in FIG. 3 (*a*), (*b*), all of the horizontal pieces 43 comprised by one first holding portion 4A are arranged so as not to be overlapped with each other in a view from the top. Thereby, the pitch can be converted without interference of the horizontal pieces 43 with each other. Also, thereby, heights of the respective receiving portions 42 can be uniform at the lowermost position as illustrated in FIG. 3 (*a*), and therefore the total height of the distal end portion of the body portion 30 and the first holding portions when the pitch is the smallest (including 0 mm) can be small.

Also, when at least two of the plurality of horizontal pieces 43 comprised by one first holding portion 4A are arranged so as not to be overlapped with each other in a view from the top, the pitch can be converted without interference of the at least two horizontal pieces 43 with each other.

Figure 4:
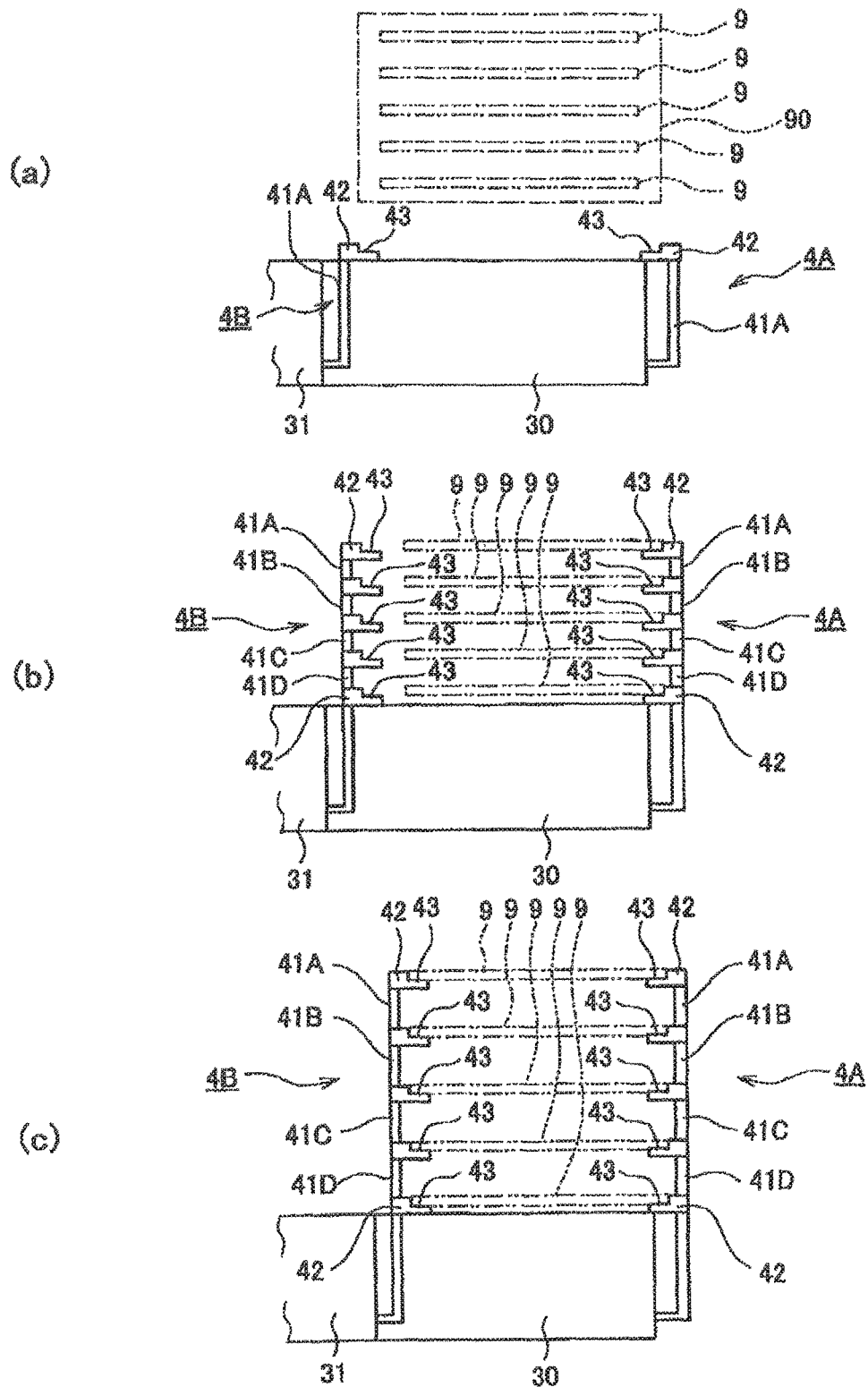
FIG. 4 (a), (b), (c) is a side view illustrating an example of the operation of the first holding portion and a second holding portion to hold a semiconductor wafer and lift the same.

FIG. 4 (*a*), (*b*), (*c*) is a side view illustrating an example of the operation of the first holding portions 4A and the second holding portions 4B holding and elevating the semiconductor wafers 9, however, an operation of holding and elevating the semiconductor wafers 9 is not limited to this. In FIG. 4 (*b*), (*c*), the hoop 90 is not illustrated for convenience of explanation. The plate member conveying robot 2 of the embodiment simultaneously takes five semiconductor wafers 9 having different height positions from each other out from the hoop 90 and widens a pitch of adjacent semiconductor wafers 9. In this state, the semiconductor wafers 9 are conveyed to another spot for treatment. The receiving portions 42 receiving the lowermost semiconductor wafer 9 are provided on the hand 3, and the first holding portions 4A and the second holding portions 4B elevate the remaining four semiconductor wafers 9.

The movable portions 31 are in a state of being separated to the rear with respect to the body portion 30 as illustrated in FIG. 2 (*b*) in a state that the hand 3 is opposed to the hoop 90 (refer to FIG. 1B). From this state, the arm supporting shaft 23 lowers, and the arm 20 and the base 21 rotate in the horizontal plane so that the hand 3 advances. The hand 3 passes below the hoop 90, and the first holding portions 4A are positioned on the front side below the semiconductor wafers 9 in the hoop 90 and the second holding portions 4B are positioned on the rear side below the semiconductor wafers 9 in the hoop 90. The first holding portions 4A and the second holding portions 4B are in a state that respective receiving portions 42 are uniform at the lowermost level as illustrated in FIG. 3 (*a*).

After that, the arm supporting shaft 23 elevates and also the receiving portions 42 of the first to fourth linearly moving portions 41A, 41B, 41C, 41D elevate by their respective different heights so that the horizontal piece 43 of each receiving portion 42 reaches a height corresponding to the lower surface (slightly lower position) of the corresponding semiconductor wafer 9. The arm 20 and the base 21 rotate in the horizontal plane and the hand 3 retreats slightly so that a state that each receiving portion 42 of the first holding portions 4A comes in contact with a peripheral edge portion of the corresponding semiconductor wafer 9 as illustrated in FIG. 4 (*b*) is achieved. In this state, the second holding portions 4B are positioned in the rear of the semiconductor wafer 9.

After that, as illustrated in FIG. 2 (*a*), the piston 120 of the actuator 100 is retracted into the housing 110, and the movable portions 31 rotate in the advance direction so that the second holding portions 4B comes in contact with the peripheral edge portions of the semiconductor wafers 9. In this state, the arm supporting shaft 23 elevates slightly, and the first holding portions 4A and the second holding portions 4B lift the semiconductor wafers 9 slightly from the hoop 90. The arm 20 and the base 21 rotate in the horizontal plane and the hand 3 retreats so that the semiconductor wafers 9 can be taken out from the hoop 90.

After taking the semiconductor wafers 9 out from the hoop 90, the receiving portions 42 of the first to fourth linearly moving portions 41A, 41B, 41C, 41D further elevate by their respective different heights so that the pitch between the adjacent semiconductor wafers 9 can be widen as illustrated in FIG. 4 (*c*). The arm 20 and the base 21 rotate in the horizontal plane, and the plurality of semiconductor wafers 9 whose pitch is widened are conveyed to another spot for treatment. Note that it is expected that differences in height between the receiving portions 42 of adjacent linearly moving portions are all equal in a state that the receiving portions 42 of all of the linearly moving portions 41A, 41B, 41C, 41D have finished elevating. Hereunder, a pitch converting mechanism 7 elevating the receiving portions 42 of the respective linearly moving portions 41A, 41B, 41C, 41D by their respective different heights will be described.

<Configuration and Operation of Pitch Converting Mechanism>

Figure 5:
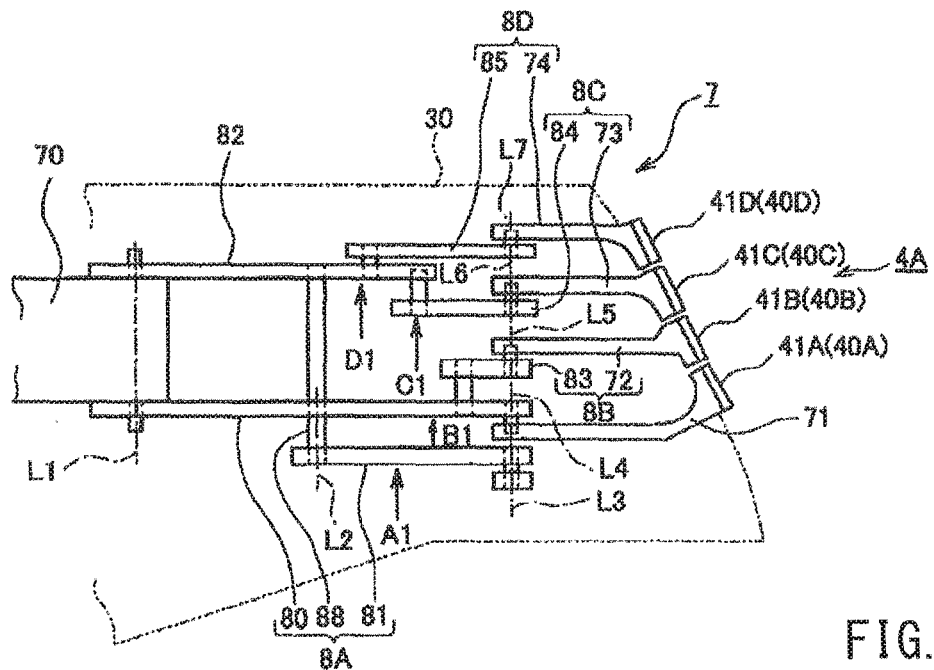
FIG. 5 is a plan view illustrating a storing space of a body portion of a hand.
Figure 6:
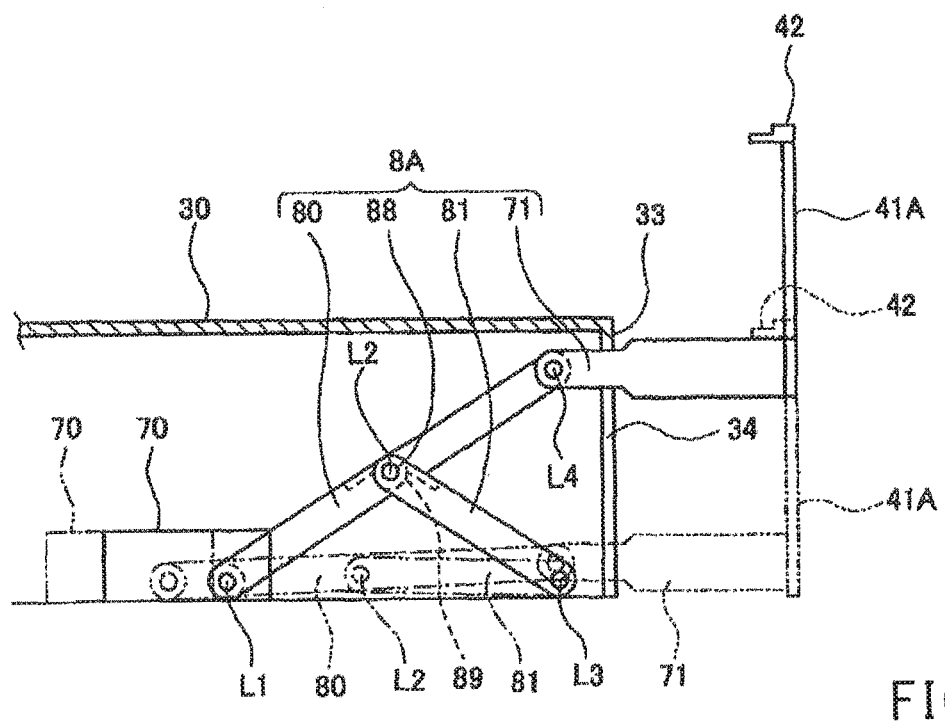
FIG. 6 is a side view illustrating a pitch converting mechanism of FIG. 5 in a view from the A1 direction.

FIG. 5 is a plan view illustrating the storing space of the body portion 30 of the hand 3, illustrating the pitch converting mechanism 7. FIG. 6 is a side view of the pitch converting mechanism 7 in FIG. 5 in a view from the A1 direction, and the base 21 is not illustrated. The first holding portions 4A and the second holding portions 4B each comprise the same pitch converting mechanism 7, and the pitch converting mechanism 7 of the first holding portion 4A positioned on the left side of the hand 3 in FIG. 1B is illustrated in FIG. 5 for convenience of explanation.

The pitch converting mechanism 7 is configured comprising the linearly moving portions 41A, 41B, 41C, 41D, a first slider 70 sliding forward and rearward in the body portion 30, and first to fourth link mechanisms 8A, 8B, 8C, 8D which are coupled to the first slider 70 and the respective linearly moving portions 41A, 41B, 41C, 41D and converting a forward and rearward movement of the first slider 70 into the respective vertical movements and arranged in the storing space in the body portion 30. Namely, in the pitch converting mechanism 7, the first to fourth linearly moving portions 41A, 41B, 41C, 41D are positioned outside of the body portion 30, and the first slider 70 and the first to fourth link mechanisms 8A, 8B, 8C, 8D are positioned in the storing space of the body portion 30. Also, since the semiconductor wafers 9 are positioned above the body portion 30 as illustrated in FIG. 1B, the first slider 70 of the pitch converting mechanism 7 and the first to fourth link mechanisms 8A, 8B, 8C, 8D exist immediately close to the receiving portions 42 holding the semiconductor wafers 9. "Drive portion" of the first reference example of the present invention is configured by the first slider 70 and the first to fourth link mechanisms 8A, 8B, 8C, 8D.

In FIG. 5, a link mechanism positioned innermost of the body portion 30 is referred to as the first link mechanism 8A, and the other link mechanisms are referred to as the second, third, fourth link mechanism 8B, 8C, 8D respectively toward the outside. The first to fourth link mechanisms 8A, 8B, 8C, 8D are connected to the corresponding first to fourth linearly moving portions 41A, 41B, 41C, 41D.

As illustrated in FIG. 6, the first link mechanism 8A comprises a first link member 80 as a long plate which is provided to one side portion of the first slider 70 and whose proximal end portion is mounted on the first slider 70 pivotably, a second link member 81 whose distal end portion is pivotably mounted around a connecting shaft 88 positioned in the middle in the longitudinal direction of the first link member 80 and whose proximal end portion is pivotably mounted on the bottom surface of the body portion 30, and a second slider 71 pivotably mounted on a distal end portion of the first link member 80 and fixed to a lower end portion of the first linearly moving portion 41. The first link member 80 pivots about a first axis line L1 which is the center of a mounting point with the first slider 70 and extends in the left and right direction, and the connecting shaft 88 is centered at a second axis line L2 in parallel with the first axis line L1. A mounting point of the second link member 81 to the bottom surface of the body portion 30 is centered at a third axis line L3 in parallel with the first axis line L1 and the second axis line L2. The second slider 71 is centered at a fourth axis line L4 in parallel with the first axis line L1 and the second axis line L2. The distance between the second axis line L2 and the third axis line L3 is substantially equal to the distance between the first axis line L1 and the second axis line L2 and the distance between the second axis line L2 and the fourth axis line L4. The first axis line L1, the second axis line L2, and the fourth axis line L4 are positioned on substantially the same plane.

The second slider 71 is fitted in a vertically long hole 34 made in a front wall 33 which is a front end portion of the body portion 30, and therefore the forward and rearward movement is restricted and only the vertical movement is allowed.

Note that, as illustrated in FIG. 5, on a side portion of the first slider 70 which is the opposite side of the side to which the first link member 80 is provided, the proximal end portion of a third link member 82 which is a long plate and shorter than the first link member 80 is mounted, and the third link member 82 is pivotably provided about the first axis line L1 as the center. The connecting shaft 88 is extended in parallel with the first axis line L1 and connected to the third link member 82. As described later, when the first link member 80 and the second link member 81 pivot, the third link member 82 pivots as well via the connecting shaft 88.

In a state that the first slider 70 retreats, as shown by short dash lines in FIG. 6, both the first link member 80 and the second link member 81 are in a substantially horizontal position, and the second slider 71 and the receiving portion 42 of the first linearly moving portion 41A are positioned at the lowermost level.

As illustrated by solid lines in FIG. 6, when the first slider 70 advances, the second slider 71 cannot move fourth-back and only the vertical movement is allowed, and therefore, the first link member 80 pivots about the first axis line L1 as the center so that the second slider 71 moves upward. The second link member 81 also pivots about the third axis line L3 as the center so that the connecting shaft 88 moves upward. When the first slider 70 advances by a predetermined distance, the second slider 71 and the receiving portion 42 of the first linearly moving portion 41 reach to the uppermost level. When the first slider 70 retreats from this state, the first linearly moving portion 41A lowers following an operation opposite to the operation above. Note that, as the second link member 81 is for supporting the pivoting of the first link member 80, this may be omitted.

Note that, when the first slider 70 advances from a state that the first link member 80 and the second link member 81 are in the substantially horizontal position, there is a possibility that both the link members 80, 81 become stiff and they do not pivot upward. In other words, when the second axis line L2 of the connecting shaft 88 is in a dead center position of the first link member 80 and the second link member 81, there is a possibility that both the link members 80, 81 become stiff and they do not pivot upward.

Then, a torsion spring 89 shown by short dash lines in FIG. 6 may be provided about the connecting shaft 88 and leg pieces of the torsion spring 89 may be mounted on the first link member 80 and the second link member 81 so as to impart an upward bias to the connecting shaft 88. Namely, the torsion spring 89 configures "bias mechanism imparting a bias in the direction opposite to the dead center position" in the first reference example of the present invention. Also, when the second axis line L2 is positioned above the first axis line L1 and the third axis line L3 in a state that the second slider 71 is positioned in the lowermost level, the possibility that both the link members 80, 81 become stiff when the first slider 70 advances is eliminated.

Figure 7:
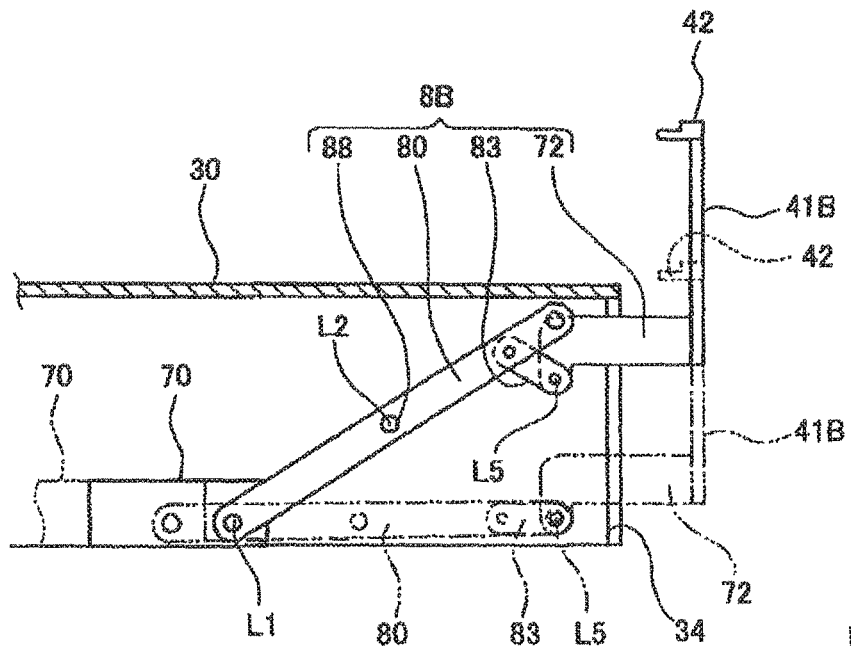
FIG. 7 is a side view illustrating a pitch converting mechanism of FIG. 5 in a view from the B1 direction.

FIG. 7 is a side view of the pitch converting mechanism 7 in FIG. 5 in a view from the B1 direction, illustrating the second link mechanism 8B. The second link mechanism 8B comprises the first link member 80, a fourth link member 83 whose one end portion is pivotably mounted on the distal end portion of the first link member 80, and a third slider 72 mounted pivotably on the other end portion of the fourth link member 83 and fixed to the lower end portion of the second linearly moving portion 41B. A mounting point of the fourth link member 83 and the third slider 72 is centered at a fifth axis line L5 in parallel with the fourth axis line L4 such that these axis lines are positioned on substantially the same vertical plane. The fourth link member 83 is mounted on a surface opposite to the surface of the first link member 80 on which the second link member 81 is mounted.

In a state that the first slider 70 retreats, both the first link member 80 and the fourth link member 83 are in a substantially horizontal position as shown by short dash lines in FIG. 7, and the third slider 72 and the receiving portion 42 of the second linearly moving portion 41B are positioned at the lowermost level.

As shown by solid lines in FIG. 7, when the first slider 70 advances, the first link member 80 pivots about the first axis line L1 as the center so that the third slider 72 moves upward as above. When the first slider 70 advances by a predetermined distance, the fourth link member 83 is inclined so that the other end portion thereof moves downward by the weight of the second linearly moving portion 41B, and the third slider 72 and the receiving portion 42 of the second linearly moving portion 41B reach the uppermost level.

Figure 8:
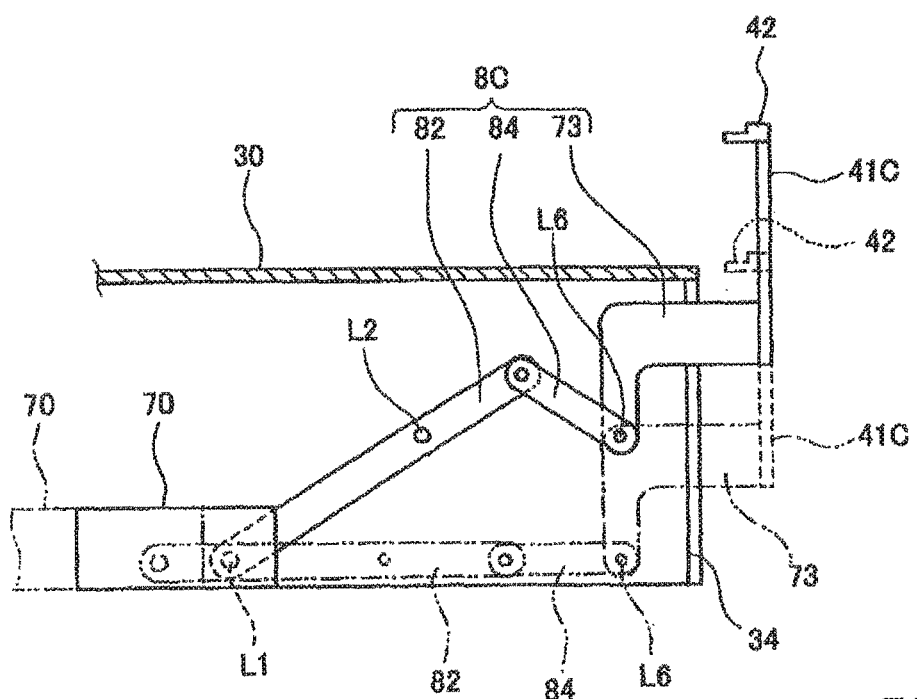
FIG. 8 is a side view illustrating a pitch converting mechanism of FIG. 5 in a view from the C1 direction.

FIG. 8 is a side view of the pitch converting mechanism 7 in FIG. 5 in a view from the C1 direction, illustrating the third link member 8C. The third link member 8C comprises the third link member 82, a fifth link member 84 whose one end portion is pivotably mounted on the distal end portion of the third link member 82, and a fourth slider 73 mounted pivotably on the other end portion of the fifth link member 84 and fixed to the lower end portion of the third linearly moving portion 41C. A mounting point of the fifth link member 84 and the fourth slider 73 is centered at a sixth axis line L6 in parallel with the fourth axis line L4 and positioned on the above-stated vertical plane.

In the state that the first slider 70 retreats, both the third link member 82 and the fifth link member 84 are in a substantially horizontal position as shown by short dash lines in FIG. 8, and the fourth slider 73 and the receiving portion 42 of the third linearly moving portion 41C are positioned at the lowermost level.

As shown by solid lines in FIG. 8, when the first slider 70 advances, the third link member 82 pivots about the first axis line L1 as the center so that the fourth slider 73 moves upward as above. When the first slider 70 advances by a predetermined distance, the fifth link member 84 is inclined so that the other end portion thereof moves downward by the weight of the third linearly moving portion 41C, and the fourth slider 73 and the receiving portion 42 of the third linearly moving portion 41C reach the uppermost level.

Figure 9:
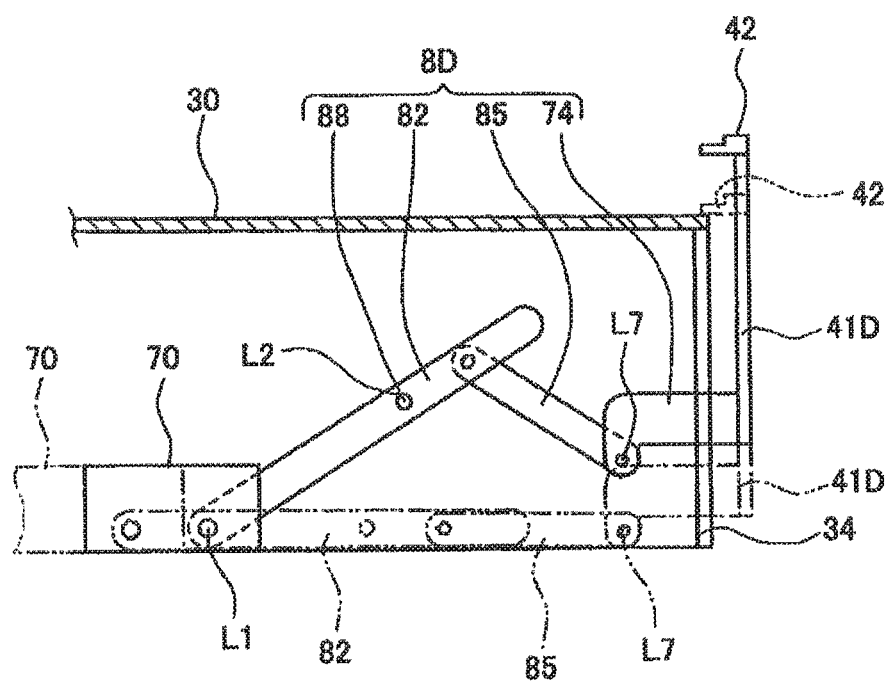
FIG. 9 is a side view illustrating a pitch converting mechanism of FIG. 5 in a view from the D1 direction.

FIG. 9 is a side view of the pitch converting mechanism 7 in FIG. 5 in a view from the D1 direction, illustrating the fourth link mechanism 8D. The fourth link mechanism 8D comprises the third link member 82, a sixth link member 85 whose one end portion is pivotably mounted on the distal end portion of the third link member 82, and a fifth slider 74 mounted pivotably on the other end portion of the sixth link member 85 and fixed to the lower end portion of the fourth linearly moving portion 41D. A mounting point of the sixth link member 85 and the fifth slider 74 is centered at a seventh axis line L7 in parallel with the fourth axis line L4 and positioned on the above-stated vertical plane. The sixth link member 85 is mounted on a surface opposite to the surface of the third link member 82 on which the fifth link member 84 is mounted.

In the state that the first slider 70 retreats, both the third link member 82 and the sixth link member 85 are in a substantially horizontal position as shown by short dash lines in FIG. 9, and the fifth slider 74 and the receiving portion 42 of the fourth linearly moving portion 41D are positioned at the lowermost level.

When the first slider 70 advances, as shown by solid lines in FIG. 9, the third link member 82 pivots about the first axis line L1 as the center so that the fifth slider 74 moves upward as above. When the first slider 70 advances by a predetermined distance, the sixth link member 85 is inclined so that the other end portion thereof moves downward by the weight of the fourth linearly moving portion 41D, and the fifth slider 74 and the receiving portion 42 of the fourth linearly moving portion 41D reach the uppermost level.

The torsion spring 89 may be fitted in the connecting shaft 88 and leg pieces of the torsion spring 89 may be mounted on the third link member 82 and the sixth link member 85 so as to impart an upward bias to the connecting shaft 88.

Note that, although the pitch converting mechanism 7 of the first holding portion 4A provided in the body portion 30 is described above, the second holding portion 4B provided to the movable portion 31 also has the pitch converting mechanism 7 having the same configuration as above. Accordingly, the receiving portions 42 of both the holding portions 4A, 4B holding the semiconductor wafers 9 are changeable in height by the pitch converting mechanism 7. The four pitch converting mechanisms 7 in total of the first holding portions 4A and the second holding portions 4B are driven synchronously. Namely, the first sliders 70 of the four pitch converting mechanisms 7 are driven synchronously. A configuration driving the four first sliders 70 synchronously will be described later.

As above, the respective mounting points of the link members 81, 82, 83, 84 and the sliders 71, 72, 73, 74 elevatingly driving the first to fourth linearly moving portions 41A, 41B, 41C, 41D are centered at the fourth to seventh axis lines L4 to L7 all positioned on the same vertical plane. Namely, a plurality of mounting points are all positioned in the same position in the fourth-back direction.

In addition, the first link member 80 and the third link member 82 pivot synchronously with each other by the connecting shaft 88 passing through the second axis line L2. Namely, the respective sums of a first distance between the first axis line L1 and the second axis line L2 and respective second distances between the second axis line L2 and the fourth to seventh axis lines L4 to L7 when the first link member 80 and the third link member 82 are in the horizontal state are the same for the first to fourth link mechanisms 8A, 8B, 8C, 8D.

With regard to the first to fourth link mechanisms 8A, 8B, 8C, 8D, a mounting point of each second link member 81 and the fourth link member 83 on the first link member 80, and a mounting point of the fifth link member 84 and the sixth link member 85 on the second link member 82 are in different positions in the forward and rearward direction. Accordingly, the respective second distances between the second axis line L2 and the fourth to seventh axis lines L4 to L7 when the first link member 80 and the third link member 82 elevatingly pivot are different for the first to fourth link mechanisms 8A, 88B, 8C, 8D. Namely, as the predetermined distance as an advance distance of the first slider 70 is the same for the first to fourth link mechanisms 8A, 8B, 8C, 8D, ratios of the second distances with respect to the predetermined distance when the first link member 80 and the third link member 82 pivot upward are different for the first to fourth linearly moving portions 41A, 41B, 41C, 41D.

Thereby, elevating heights of the respective receiving portions 42 of the first to fourth linearly moving portions 41A, 41B, 41C, 41D are different from each other. Namely, a link mechanism elevating the first to fourth linearly moving portions 41A, 41B, 41C, 41D can be suitably realized according to the corresponding height positions of the semiconductor wafers 9 to be held by the respective receiving portions 42 of the first to fourth linearly moving portions 41A, 41B, 41C, 41D.

Component members of the first to fourth link mechanisms 8A, 8B, 8C, 8D are pivoted as above in order to convert the pitch of vertically adjacent semiconductor wafers 9, and then the component members of the link mechanisms are sometimes rubbed with each other, causing particles as a result. When such particles are adhered to the semiconductor wafers 9, the semiconductor wafers 9 may deteriorate in quality.

In the embodiment, as the first to fourth link mechanisms 8A, 8B, 8C, 8D are arranged in storing spaces of the body portion 30 and the movable portions 31 of the hand 3, the particles do not go out of the body portion 30 and the movable portions 31, and therefore there is no possibility that the particles are adhered to the semiconductor wafers 9. Further, in order to prevent the particles from going out of the body portion 30 and the movable portions 31, the insides of the storing spaces of the body portion 30 and the movable portions 31 are set to a negative pressure.

Incidentally, the pitch converting mechanism 7 is positioned immediately below the receiving portions 42 of each linearly moving body 40A, 40B, 40C, 40D. Thereby, accuracy of the operation of converting intervals of the receiving portions 42 can be enhanced.

<Drive Mechanism of First Slider>

Figure 10:
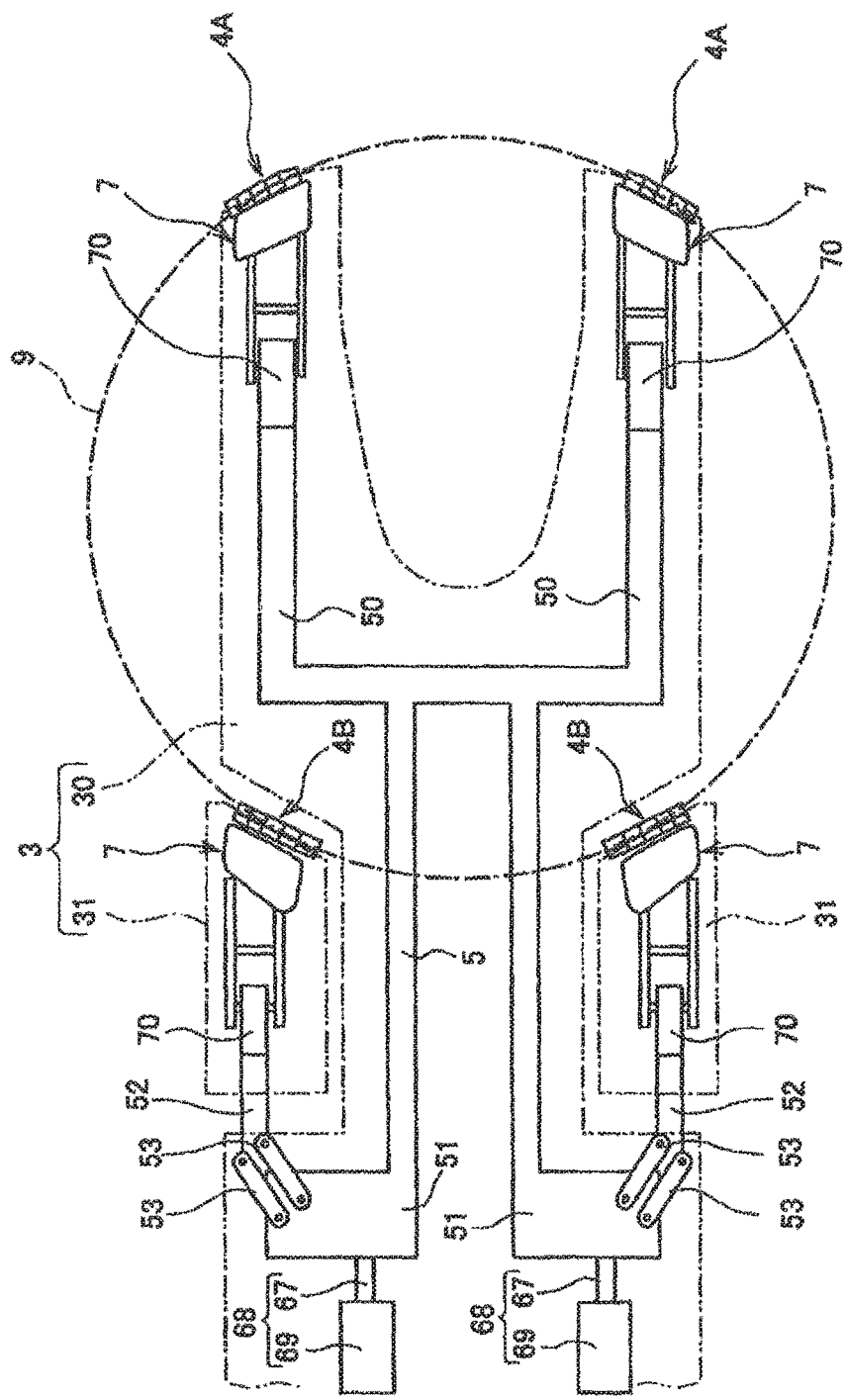
FIG. 10 is a plan view illustrating a mechanism synchronously driving four first sliders forward and rearward.

FIG. 10 is a plan view illustrating a mechanism which synchronously drives the four first sliders 70 forward and rearward, showing the body portion 30 and the movable portion 31 configuring the hand 3 by short dash lines. In the storing space of the body portion 30, a main slide body 5 which is a rigid body extending forward and rearward is provided so as to move forward and rearward. The main slide body 5 has a pair of first drive pieces 50 separated from each other along the left and right direction of the body portion 30 on the front end portion thereof and has a pair of second drive pieces 51 separated from each other along the left and right direction of the body portion 30 on the rear end portion thereof. A first slider 70 configuring the pitch converting mechanism of the first holding portion 4A is mounted on the distal end portion of each first drive piece 50.

Air cylinders 68 are opposed to the respective second drive pieces 51, and each air cylinder 68 is configured providing a piston 67 in a housing 69 retractably. The distal end portion of the piston 67 is connected to the second drive piece 51, and the main slide body 5 is driven forward and rearward by both the air cylinders 68. Note that, although the main slide body 5 is driven by the two air cylinders 68, it may be driven by one air cylinder 68.

A sub-slide body 52 extending forward and rearward is provided in each movable portion 31 movably forward and rearward, and each sub-slide body 52 is coupled to the second drive piece 51 by a pair of coupling links 53 pivoting in a horizontal plane. A first slider 70 configuring the pitch converting mechanism 7 of the second holding portion 4B is provided to the front end portion of each sub-slide body 52.

Figure 11:
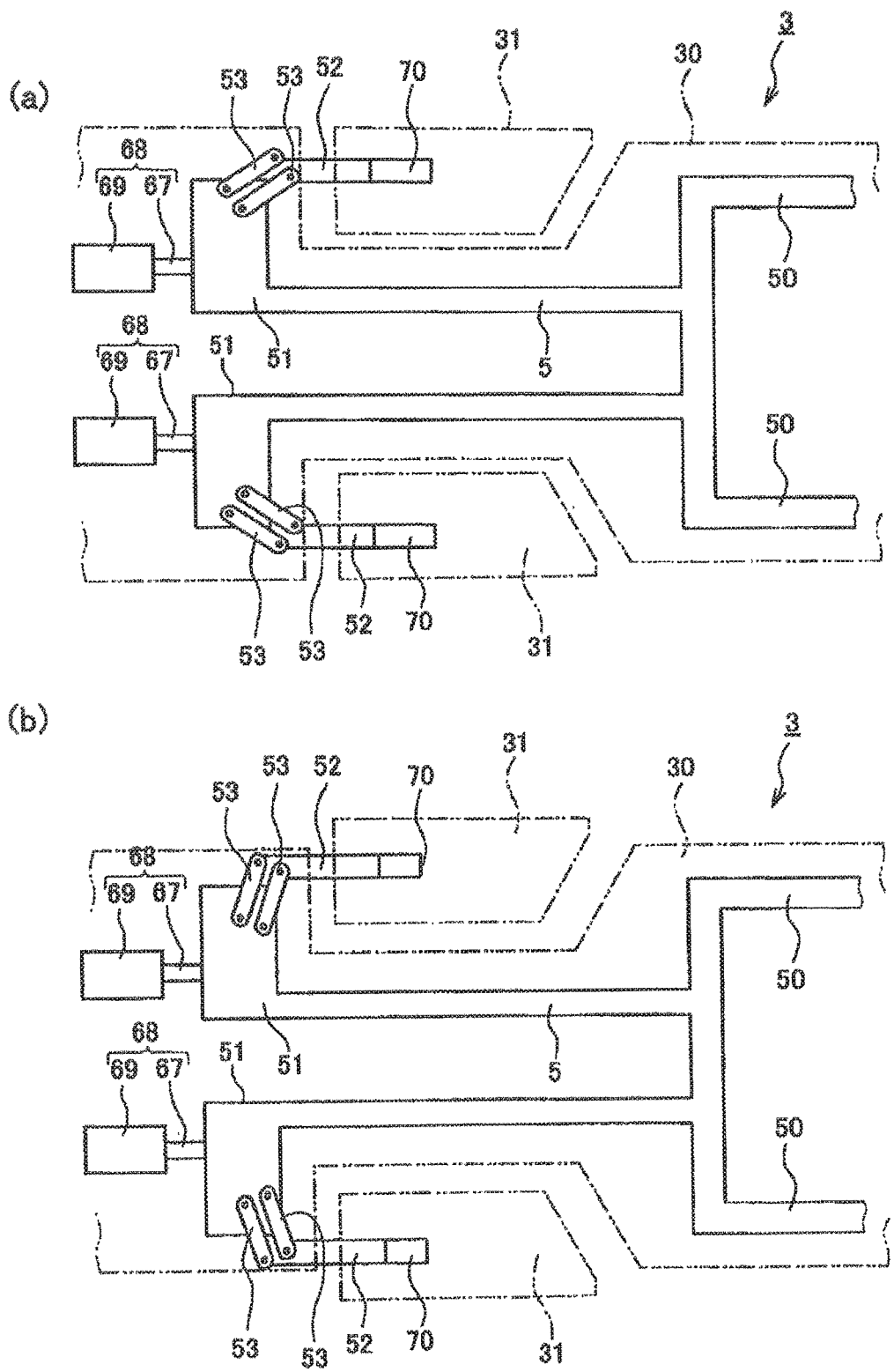
FIG. 11 (a) (b) is a plan view illustrating a positional relation between a second drive piece and a sub-slide body.

FIG. 11 (a), (b) is a plan view illustrating a positional relation of each second drive piece 51 and the corresponding sub-slide body 52, not illustrating the configuration of the pitch converting mechanisms 7 and the second holding portions 4B of the movable portions 31. FIG. 11 (a) illustrates a position where each movable portion 31 turns in the advance direction corresponding to FIG. 2 (a). FIG. 11 (b) illustrates a position where each movable portion 31 rotates in the retreat direction corresponding to FIG. 2 (b). The first slider 70 driving the second holding portion 4B is provided to the distal end portion of the sub-slide body 52, and the second holding portion 4B is provided to the movable portion 31. Therefore, when the movable portion 31 rotates in the forward and rearward direction, the sub-slide body 52 also moves in the forward and rearward direction. Each sub-slide body 52 is coupled to the main slide body 5 via the coupling links 53 so that the sub-slide body 52 can move to forward and rearward even in a state that the main slide body 5 is stopped. Note that the coupling links 53 and the pivoting auxiliary link plates 63 and the small link plates 60 are in parallel with one another, and these links configure their respective parallelogram.

When the four-joint link mechanism 6 (FIG. 2 (a), (b)) actuates and the movable portion 31 rotates in the retreat direction as illustrated in FIG. 11 (b) from the state illustrated in FIG. 11 (a), the coupling link 53 pivots about the mounting point with the second drive piece 51 as the center, allowing the sub-slide body 52 to retreat in a state that the main slide body 5 is stopped. Thereby, the receiving portions 42 of the second holding portion 4B separate from the respective peripheral edge portions of the semiconductor wafers 9 (refer to FIG. 2 (b)).

When the four-joint link mechanism 6 actuates and the movable portion 31 rotates in the advance direction as illustrated in FIG. 11 (a) from the state illustrated in FIG. 11 (b), the receiving portions 42 of the second holding portion 4B come in contact with the respective peripheral edge portions of the semiconductor wafers 9, and the semiconductor wafers 9 are held by the receiving portions 42 of the first holding portions 4A and the second holding portions 4B (refer to FIG. 2 (a)).

In the state that the movable portion 31 rotates in the advance direction and the semiconductor wafers 9 are held by the receiving portions 42 of both the holding portions 4A, 4B as illustrated in FIG. 11 (a), the air cylinder 68 drives the main slide body 5 forward. The first drive piece 50 and the second drive piece 51 advance and the sub-slide body 52 also advances via the coupling link 53 in the state that the coupling link 53 does not pivot. Since the main slide body 5 and the sub-slide bodies 52 move interlockingly, the four first sliders 70 advance synchronously. Thereby, the respective first to fourth linearly moving portions 41A, 41B, 41C, 41D of the first holding portions 4A and the second holding portions 4B elevate synchronously. Since the four first sliders 70 advance by the same distance, four linearly moving bodies holding one semiconductor wafer 9 elevate by the same height. Thereby, the semiconductor wafer 9 elevates in a horizontal posture.

In the end effector device 1 of the embodiment, the respective first to four linearly moving portions 41A, 41B, 41C, 41D of the all pitch converting mechanisms 7 are elevated only by the forward and rearward movement operation of the first sliders 70. Thereby, a mechanism driving the first to fourth linearly moving portions 41A, 41B, 41C, 41D so as to elevate them becomes simple.

<First Variation of Pitch Converting Mechanism>

Figure 12:
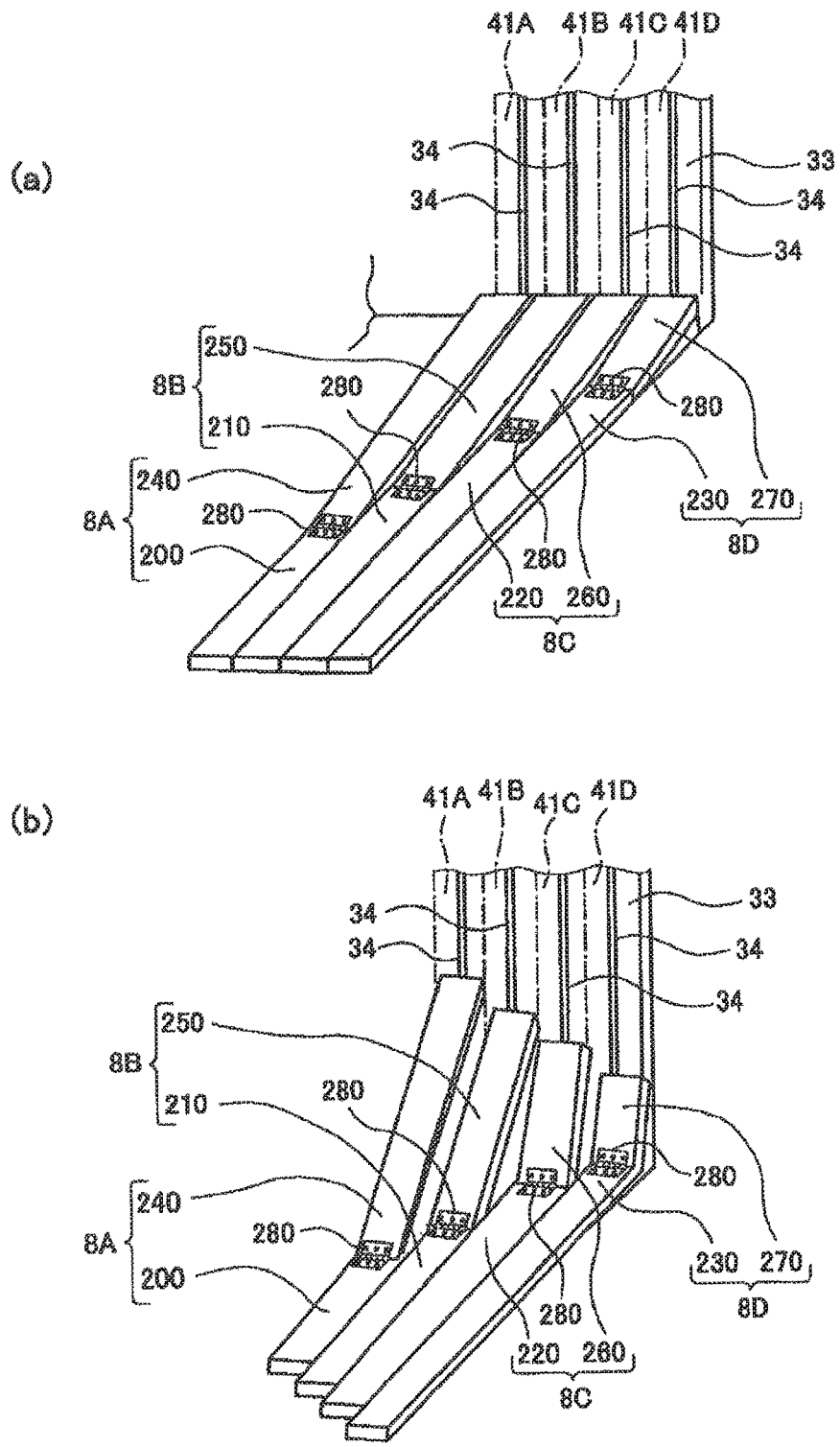
FIG. 12 (a), (b) is a perspective view illustrating a first variation of the pitch converting mechanism.

FIG. 12 (a), (b) is a perspective view illustrating a first variation of the pitch converting mechanism 7. In the variation, the first to fourth link mechanisms 8A, 8B, 8C 8D are arranged from the left side to the right side in the figure. Thereby, the first to fourth linearly moving portions 41A, 41B, 41C, 41D are also arranged from the left side to the right side in the figure. In the variation, configurations of the first to fourth link mechanisms 8A, 8B, 8C, 8D are different from the link mechanisms above.

Specifically, as illustrated in FIG. 12 (a), the first link mechanism 8A is configured by a first link piece 200 driven forward and rearward in the horizontal posture facing its surface upward and a fifth link piece 240 connected vertically pivotably to the distal end portion of the first link piece 200 by a hinge 280.

Similarly, the second link mechanism 8B is configured by a second link piece 210 longer than the first link piece 200 and a sixth link piece 250 connected vertically pivotably to the distal end portion of the second link piece 210 by the hinge 280 and shorter than the fifth link piece 240. The third link mechanism 8C is configured by a third link piece 220 longer than the second link piece 210 and a seventh link piece 260 connected vertically pivotably to the distal end portion of the third link piece 220 by the hinge 280 and shorter than the sixth link piece 250. The fourth link mechanism 8D is configured by a fourth link piece 230 longer than the third link piece 220 and an eighth link piece 270 connected vertically pivotably to the distal end portion of the fourth link piece 230 by the hinge 280 and shorter than the seventh link piece 260.

The distal end portions of the fifth to eighth link pieces 240, 250, 260, 270 abut on the front wall 33. Thereby, the fifth to eighth link pieces 240, 250, 260, 270 are restricted from advancing. The fifth to eighth link pieces 240, 250, 260, 270 are connected to the corresponding first to fourth linearly moving portions 41A, 41B, 41C, 41D through vertically long holes 34 made on the front wall 33, respectively. The first to fourth link mechanisms 8A, 8B, 8C, 8D are driven forward and rearward by a common first slider (not illustrated).

When the first slider presses the first to fourth link pieces 200, 210, 220, 230 forward from the posture illustrated in FIG. 12 (a), the distal end portions of the fifth to eighth link pieces 240, 250, 260, 270 are abutted on the front wall 33 and restricted from advancing. Therefore, the fifth to eighth link pieces 240, 250, 260, 270 pivot so that the distal end portions coupled to the first to fourth linearly moving portions 41A, 41B, 41C, 41D elevate about the respective hinges 280 as illustrated in FIG. 12 (b). Thereby, the receiving portions (not illustrated in FIG. 12 (a), (b)) of the first to fourth linearly moving portions 41A, 41B, 41C, 41D can elevate while receiving the respective peripheral edge portions of the semiconductor wafers 9.

<Second Variation of Pitch Converting Mechanism>

FIG. 13 (a), (b) is a side view illustrating a second variation of the pitch converting mechanism 7. In the variation, although the pitch converting mechanism 7 comprises the first to fourth link mechanisms connected respectively to the first to fourth linearly moving portions 41A, 41B, 41C, 41D, configurations of the link mechanisms are different from the configurations of the link mechanisms above. For convenience of explanation, only the first link mechanism 8A is illustrated.

The first link mechanism 8A comprises a follower slider 300 sliding on the bottom surface of the body portion 30, the first link member 80 whose proximal end portion is mounted pivotably on the follower slider 300, the second slider 71 mounted pivotably on the distal end portion of the first link member 80 and fixed to the lower end portion of the first linearly moving portion 41, and an elongated rocking member 310 whose one end portion is mounted pivotably on the distal end portion of the first link member 80.

The second slider 71 is fitted in the vertically long hole 34 made in the front wall 33 which is the front end portion of the body portion 30 and allowed to only move vertically similarly to the above. The rocking member 310 rocks with an optional point in the longitudinal direction being supported at a fulcrum 320 in the body portion 30, and the other end portion of the rocking member 310 is opposed to a vertically driving actuator 330 arranged in the body portion 30. The vertically driving actuator 330 is configured providing a vertically moving piston 350 vertically retractably in a housing 340, and the distal end portion of the vertically moving piston 350 is connected to the other end portion of the rocking member 310.

In the state illustrated in FIG. 13 (a), the vertically moving piston 350 elevates and the first linearly moving portion 41A is positioned at the lowermost level. When the vertically moving piston 350 lowers from this state, the rocking member 310 rocks about the fulcrum 320 as the center, and one end portion of the rocking member 310 and the distal end portion of the first link member 80 are lifted as illustrated in FIG. 13 (b). Thereby, the receiving portion 42 of the first linearly moving portion 41A reaches the uppermost level.

<Third Variation of Pitch Converting Mechanism>

FIG. 14 (a), (b) is a side view illustrating a third variation of the pitch converting mechanism 7. Also in the variation, configurations of the first to fourth link mechanisms is different from the configurations of the link mechanisms above. For convenience of explanation, only the first link mechanism 8A is illustrated.

As illustrated in FIG. 14 (a), the first link mechanism 8A comprises the follower slider 300 sliding on the bottom surface of the body portion 30, the elongated first link member 80 whose proximal end portion is mounted pivotably on the follower slider 300, a second link member 81 whose distal end portion is mounted pivotably about a connecting shaft 88 positioned at the middle in the longitudinal direction of the first link member 80 and whose proximal end portion is mounted pivotably on the bottom surface of the body portion 30, and the second slider 71 mounted pivotably on the distal end portion of the first link member 80 and fixed to the lower end portion of the first linearly moving portion 41A.

A recessed portion 35 is formed on the bottom surface of the body portion 30, and the vertically driving actuator 330 opposed to the lower surface of the proximal end portion of the first link member 80 is arranged in the recessed portion 35. The vertically driving actuator 330 is configured providing the vertically moving piston 350 retractably vertically in the housing 340 as above, and the distal end portion of the vertically moving piston 350 is connected to the proximal end portion of the first link member 80.

In the state illustrated in FIG. 14 (a), the first linearly moving portion 41A is positioned at the lowermost level. When the vertically moving piston 350 elevates from this state, the first link member 80 pivot about the mounting portion with the follower slider 300 as the center and also the follower slider 300 advances. The distal end portion of the first link member 80 and the distal end portion of the second link member 81 are lifted. Thereby, the receiving portion 42 of the first linearly moving portion 41A reaches the uppermost level.

<Variation of Receiving Portion>

In the descriptions above, the lower surface of a peripheral portion of the semiconductor wafer 9 is supported by the horizontal piece 43 of the receiving portion 42, as illustrated in FIG. 15 (a). However, alternatively, the receiving portion 42 may be formed so that, in the inner surface thereof, a first inclined surface 45 and a second inclined surface 46 whose gradient is more gentle than the first inclined surface 45 are continued and a boundary SM between both the inclined surfaces 45, 46 supports the peripheral portion of the semiconductor wafer 9, as illustrated in FIG. 15 (b).

In the configuration illustrated in FIG. 15 (b), the semiconductor wafer 9 slides on the first inclined surface 45 of the receiving portion 42 so as to be placed on the boundary SM when it is held by the receiving portion 42. Thereby, a horizontal position and a horizontal posture of the semiconductor wafer 9 are corrected and held suitably. Also, since the receiving portion 42 and the semiconductor wafer 9 are in line contact with each other, a contact area between the receiving portion 42 and the semiconductor wafer 9 is small. Thereby, foreign matters adhered to the semiconductor wafer 9 are reduced.

Herein, holding the semiconductor wafer 9 means making the semiconductor wafer 9 in a state that it can be conveyed by the hand 3, and another aspect such as placement or suction other than the embodiment above may by employed. In this case, for example, the receiving portion 42 can be configured by only the horizontal piece 43 or the horizontal piece 43 and a suction pad.

(Merit of Using Present Invention for Semiconductor Wafer with Large Diameter)

In the semiconductor industry, a semiconductor wafer with a large diameter is being used in phases. Specifically, while a semiconductor wafer with a diameter of about 150 mm has been used conventionally, a semiconductor wafer with a diameter of about 200 mm or 300 mm is being used recently, and there is a possibility that a semiconductor wafer with a diameter of about 450 mm will be used in the future.

Note that, in forecited PTL 2, a configuration that a plurality of substrate holding members supported at their respective proximal end portions are inserted between a plurality of substrates so as to convey the substrates is described. When an enlarged semiconductor wafer is to be conveyed by a configuration of such a conventional technique, deflection of a robot enlarged in accordance with the enlargement of the semiconductor or deflection of the semiconductor wafer itself increases for the enlargement of the semiconductor wafer. Thereby, a problem of interference between substrate holding members and semiconductor wafers increases.

The problem can be avoided by sufficiently enlarging intervals between a plurality of arranged semiconductors wafers. However, for saving space of a device, it is preferable that a plurality of semiconductor wafers are arranged at intervals as small as possible. As for the interval, it is preferable that an interval from the lower surface of a semiconductor wafer to the lower surface of the adjacent semiconductor is 5 mm to 10 mm, preferably 6 mm, for example.

In this regard, by a configuration of the present invention, plate members such as the substrate holding members in the conventional technique above do not need to be inserted between a plurality of semiconductor wafers. Accordingly, the problem of interference between a hand and semiconductor wafers is alleviated.

As stated above, the present invention can be applied to a hand gripping a large semiconductor wafer (particularly, a semiconductor wafer with a diameter of 450 mm or more). Also, the present invention can be applied to a treating device, a conveying device, or a semiconductor treating equipment having at least one substrate placing portion including the hoop 90 or another spot to which a plurality of semiconductor wafers are arranged at intervals of 5 mm to 10 mm, preferably 6 mm.

Although two first holding portions 4A and two second holding portions 4B are provided in the description above, one or more first holding portions 4A and one or more second holding portions 4B may be provided. However, since a peripheral edge of the semiconductor wafer 9 needs to be supported at three or more points in order to position the semiconductor wafer 9 in the horizontal plane, the first holding portion(s) 4A and the second holding portion(s) 4B need to be provided so as to support at three or more points in total.

In addition, although the pitch converting mechanism 7 widens the vertical pitch of adjacent semiconductor wafers 9 when conveying the plurality of semiconductor wafers 9 from the hoop 90 to another spot in the description above, the vertical pitch may be narrowed.

Although the embodiment that the four first sliders 70 are driven synchronously forward and rearward is illustrated in FIG. 10 above or the like, the first sliders 70 of the respective pitch converting mechanisms 7 do not necessarily need to be connected to each other physically. For example, an actuator such as an air cylinder may be provided individually for the first slider 70 of each pitch converting mechanism 7. In this case, it is desirable that the operation timings of individually provided actuators such as air cylinders are synchronized.

Hereunder, a substrate conveying system comprising a substrate conveying robot and a substrate conveying method according to an embodiment of the second reference example in the present invention will be described referring to the figures.

Note that, although the embodiment is related to conveyance of a wafer (substrate) for manufacturing a semiconductor, a substrate to be conveyed by the substrate conveying robot according to the second reference example in the present invention is not limited to the wafer for manufacturing a semiconductor and includes various substrates (plate members) such as a glass substrate for manufacturing a liquid crystal panel.

Figure 16:
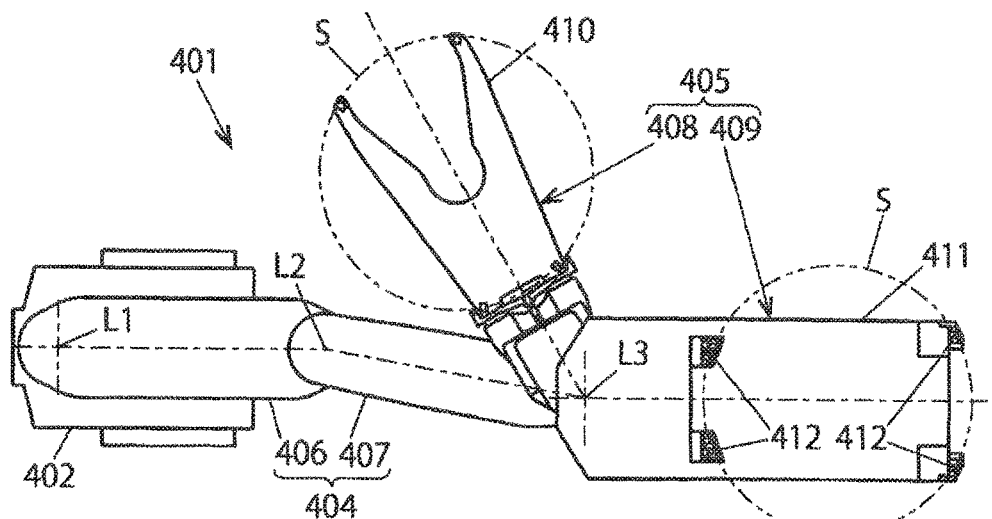
FIG. 16 is a plan view illustrating a substrate conveying robot according to an embodiment of the second reference example of the present invention.
Figure 17:
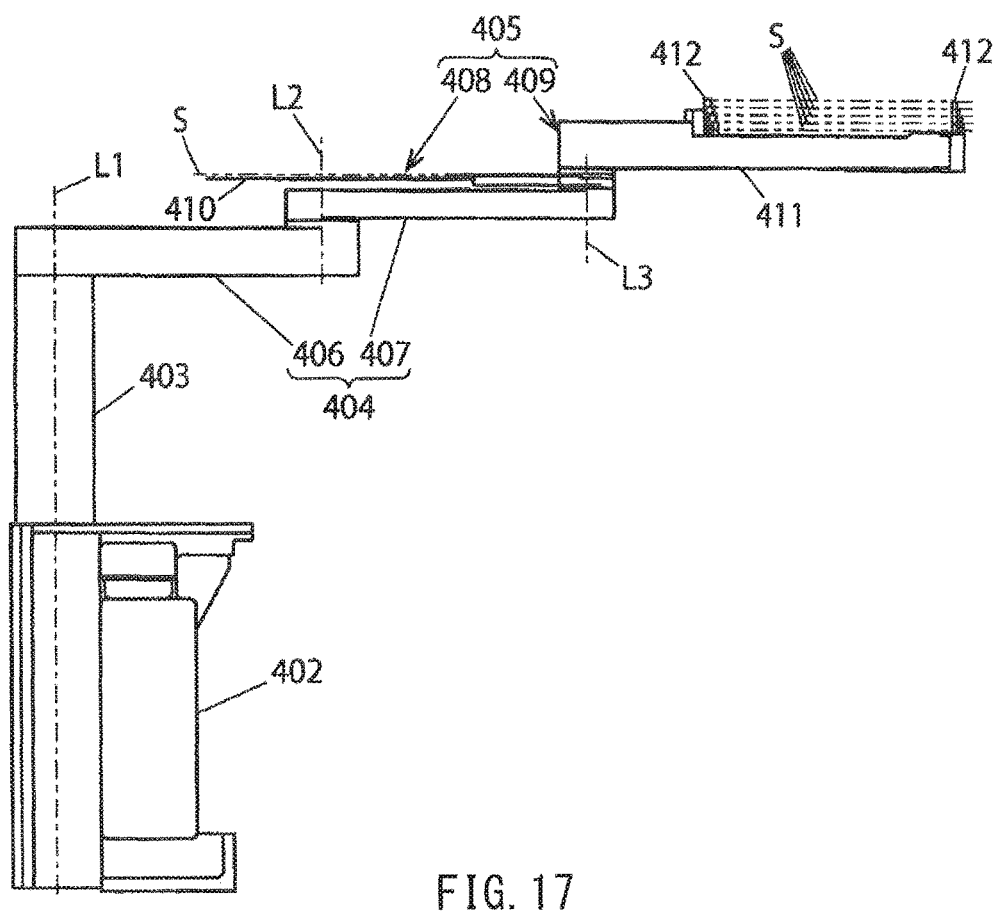
FIG. 17 is a side view of the substrate conveying robot in FIG. 16.

As illustrated in FIGS. 16 and 17, the substrate conveying robot 401 according to the embodiment comprises a base 402, and a main shaft 403 provided on the base 402 liftably along a first axial line L1, a robot arm 404 whose proximal end portion is connected to an upper end portion of the main shaft 403, and an end effector 405 connected to a distal end portion of the robot arm 404. The robot arm 404 has a first arm member 406 including the proximal end portion of the robot arm 404 and a second arm member 407 including a distal end portion of the robot arm 404, and a distal end portion of the first arm member 406 and a proximal end portion of the second arm member 407 are rotatably connected to each other about a second axial line L2.

The end effector 405 has a blade hand (first hand) 408 which is connected to a distal end portion of the second arm member 407 rotatably about a third axial line L3 and a batch conveying type hand (second hand) 409 which is also connected to the distal end portion of the second arm member 407 rotatably about the third axial line L3. Note that, although the batch conveying type hand 409 is in an upper position and the blade hand 408 is in a lower position in the example, they can be switched in the vertical position.

The blade hand 408 has a hand body 410 which can be inserted between vertically adjacent substrates stored in a substrate storing portion. Note that, although the hand body 410 is configured by a plate-shaped body in the embodiment, a member configuring the hand body is not limited to the plate-shaped body and it may be configured by a rod-shaped body, for example, including a wide range of what can be inserted between vertically adjacent substrates stored in a substrate storing portion.

The batch conveying type hand 409 has a hand base portion 411 which at least partially advances below a plurality of substrates stored in the substrate storing portion, and a substrate holding unit 412 which is provided to the hand base portion so as to hold a plurality of substrates (wafers) S.

As illustrated in FIG. 17, the hand base portion 411 of the batch conveying type hand 409 is considerably thicker than the hand body 410 of the blade hand 408, having a thickness that being inserted between vertically adjacent substrates stored in the substrate storing portion such as FOUP is generally impossible.

Note that, as illustrated in FIGS. 16 and 17, the embodiment is configured to hold the substrate S on an upper surface side of each of the blade hand 408 and the batch conveying type hand 409, and it is particularly effective when adhesion of particles should be prevented in a semiconductor wafer, for example.

The blade hand 408 and the batch conveying type hand 409 can be independently driven respectively about the third axial line L3. Thereby, each of the blade hand 408 and the batch conveying type hand 409 can be switched between an operative position upon accessing the substrate storing portion and a retreat position upon not accessing the substrate storing portion.

Figure 18:
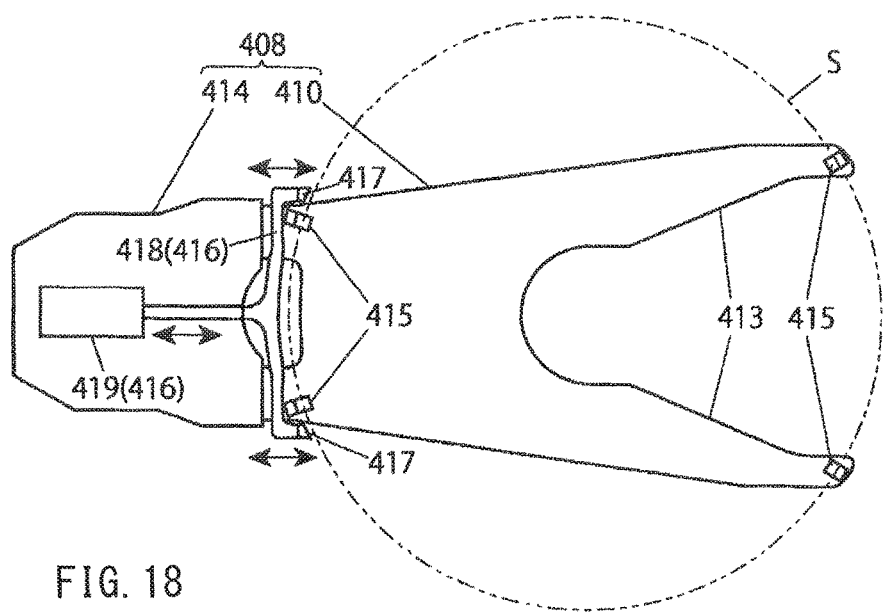
FIG. 18 is a plan view illustrating a blade hand (first hand) of the substrate conveying robot in FIG. 16.

As illustrated in FIG. 18, the blade hand 408 has the hand body 410 on whose distal end side a pair of finger portions 413 are formed and a hand base portion 414 to which a proximal end portion of the hand body 410 is connected. A substrate supporting portion 415 for supporting a bottom surface edge portion of the substrate S is provided to each distal end portion of a pair of finger portions 413. The substrate supporting portion 415 for supporting the bottom surface edge portion of the substrate S is also provided to each lateral side of the proximal end portion of the hand body 410.

Further, the blade hand 408 comprises a gripping unit 416 for gripping the substrate S placed on the substrate supporting portions 415. The gripping unit 416 has a movable member 418 including a pair of right and left abutting portions 417 abutted to the sides of the substrate S and a drive source (air cylinder, for example) 419 for driving the movable member 418 back and forth. By moving the movable portion 418 forward so as to press the abutting portions 417 to the side surfaces of the substrate, the substrate S is gripped by the pair of abutting portions 417 and vertical wall parts of a pair of substrate supporting portions 415 on the distal end portion.

Figure 19:
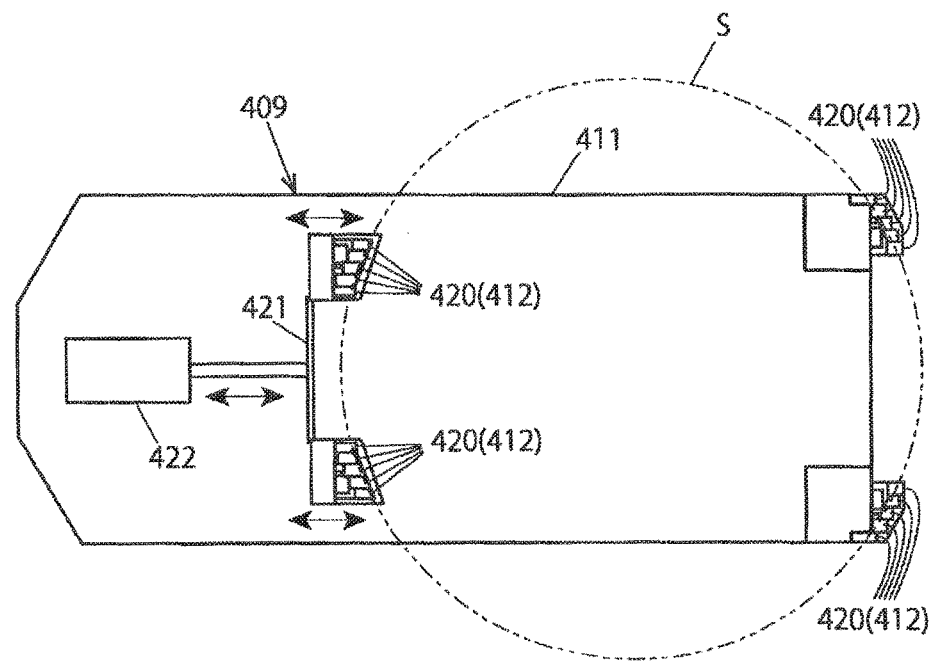
FIG. 19 is a plan view illustrating a batch conveying type hand (second hand) of the substrate conveying robot in FIG. 16.

As illustrated in FIG. 19, the substrate holding unit 412 of the batch conveying type hand 409 comprises groups of substrate supporting portions composed of a plurality of (five in the example) substrate supporting portions 420 each for supporting a bottom surface edge portion of a corresponding one of a plurality of (five in the example) substrates S on the right and left of the distal end side of the hand base portion 411 and on the right and left of the opposite side in between the substrate S, respectively. A group of substrate supporting portions 420 on the proximal end side of the hand base portion 411 is provided integrally with the movable member 421 so as to move back and forth. The movable member 421 is driven back and forth by a drive source (air cylinder, for example) 422.

Figure 20A:
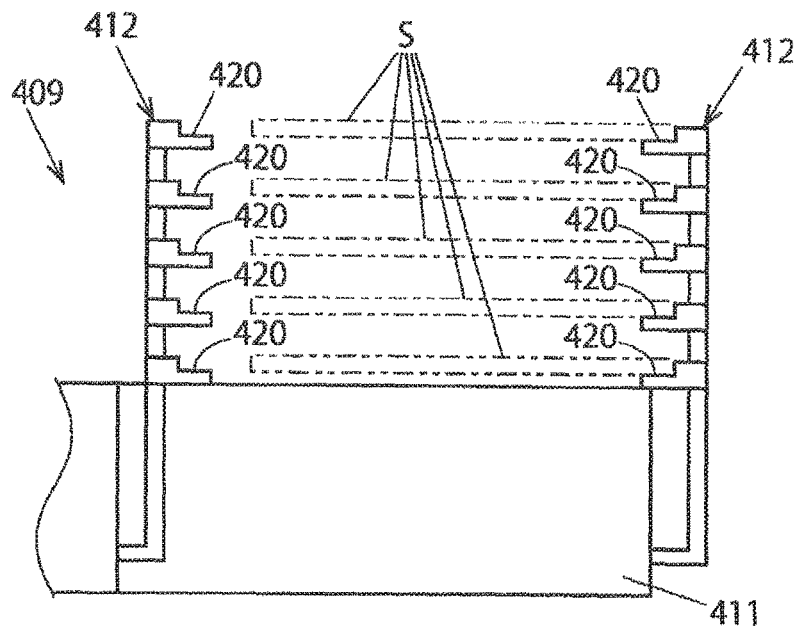
FIG. 20A is a schematic view illustrating operating of the batch conveying type hand illustrated in FIG. 19.
Figure 20B:
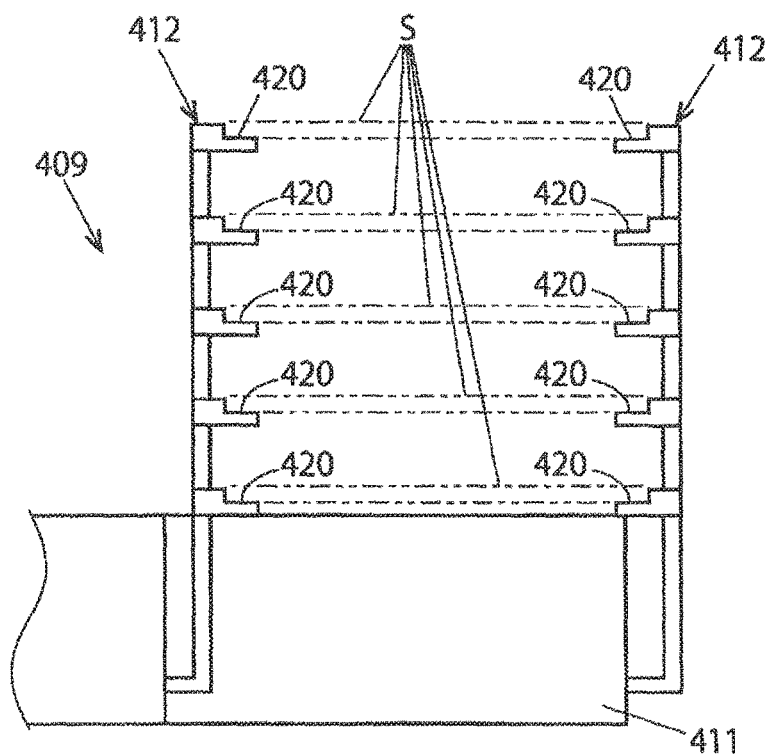
FIG. 20B is another schematic view illustrating operation of the batch conveying type hand in FIG. 19.

As illustrated in FIGS. 20A and 20B, the plurality of (five in the example) substrate supporting portions 420 belonging to each group are arranged at different heights in the vertical direction at least in a substrate holding state.

When gripping the substrate S by the substrate supporting portions 420 on the distal end side and the substrate supporting portions 420 on the proximal end side, the movable member 421 is moved forward by the drive force 422 so as to press the vertical wall parts of the substrate supporting portions 420 on the proximal end side to the side surface of the substrate. Thereby the substrate S is clamped by the vertical wall parts of the substrate supporting portions 420 on the proximal end side and the vertical wall parts of the substrate supporting portions 420 on the distal end side.

Figure 21A:
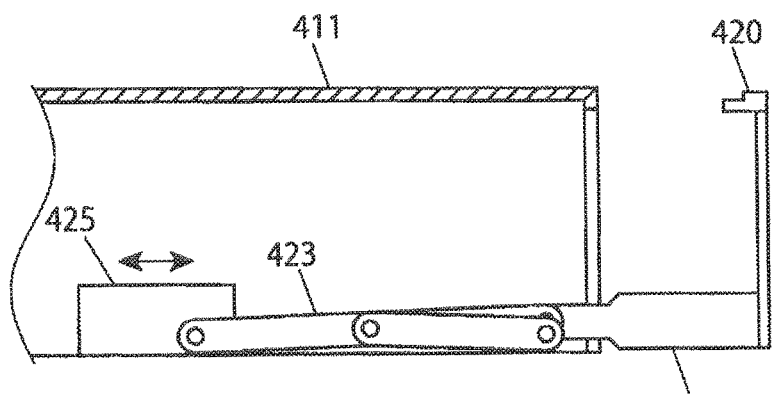
FIG. 21A is a schematic view illustrating operation of a substrate supporting unit of the batch conveying type hand in FIG. 19.
Figure 21B:
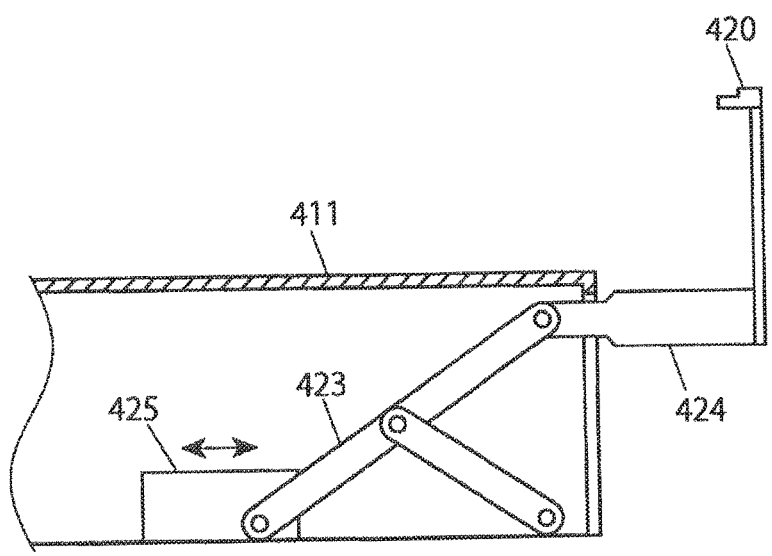
FIG. 21B is another schematic view illustrating operation of the substrate supporting unit of the batch conveying type hand in FIG. 19.

In the embodiment, the vertical pitch of the plurality of substrate supporting portions 420 belonging to each group can be changed. Specifically, as illustrated in FIGS. 21A and 21B, a lower end portion of the substrate supporting portion 420 is connected to a liftable member 424 connected to a lifting link mechanism 423 provided to the inside of the hand base portion 411. By driving the lifting link mechanism 423 by a slider 425, the liftable member 424 is lifted and lowered integrally with the substrate supporting portion 420 while maintaining its horizontal extending state.

The lifting link mechanism 423, the liftable member 424, and the slider 425 configure a substrate supporting portion drive unit for moving the substrate supporting portion 420 between the upper position and the lower position. The pitch in the vertical direction of the plurality of substrate supporting portions 420 can be changed by the substrate supporting portion drive unit.

Also, the embodiment is configured so that a height of each substrate holding unit 412 configured by the plurality of substrate supporting portions 420, namely a distance from the upper surface of the hand base portion 411 to the upper end of the substrate supporting portion 420 at the highest position is changed according to change of vertical pitch of the plurality of substrate supporting portions 420 belonging to each group. The height of each substrate holding unit 412 becomes lower when setting the vertical pitch of the plurality of substrate supporting portions 420 smaller (FIG. 20A) and becomes higher when setting the same larger (FIG. 20B).

The plurality of substrate supporting portions 420 may be arranged so that all of the plurality of substrate supporting portions 420 belonging to each group at least partially overlap each other in a view from at least a direction orthogonal to the vertical direction when the substrate supporting portions 420 are set to their respective lowest position. At this time, it is preferable that the upper end of the substrate supporting portion 420 at the highest position of the plurality of substrate supporting portions 420 becomes substantially as high as the height of the upper surface of the hand base portion 411 (refer to FIG. 21A) or becomes lower than the same. Note that, when all of the substrate supporting portions 420 belonging to each group are set to their respective lowest positions, the upper ends of all of the substrate supporting portions 420 belonging to each group may be flush with each other.

In the embodiment, as illustrated in FIG. 19, the plurality of substrate supporting portions 420 belonging to each group are arranged to positions where they do not overlap with each other at least partially in a view from the moving direction of the substrate supporting portion 420. Specifically, positions of the plurality of substrate supporting portions 420 in a view from the vertical direction are offset from each other in a circumferential direction of the substrate S. Further, positions of the plurality of substrate supporting portions 420 in a view from the vertical direction do not change even when the vertical pitch of the plurality of substrate supporting portions 420 are changed.

Here, parts which do not overlap with each other in a view from the moving direction of the substrate supporting portion 420 may be parts, of the substrate supporting portion 420, which are contacted with the substrate (wafer) S. Also, the plurality of substrate supporting portions 420 belonging to each group may be arranged to positions where they do not overlap with each other at least partially in a view from the moving direction of the substrate supporting portion 420 at least in their respective lowest positions. Further, the plurality of substrate supporting portions 420 belonging to each group may be arranged to positions where they do not overlap with each other at least partially in a view from the moving direction of the substrate supporting portion 420 in all operative ranges during operation.

Next, a method for conveying the substrate S using the substrate conveying robot 401 according to the embodiment will be described referring to the figures.

In the semiconductor production process, for example, the substrate (wafer) S is subjected to predetermined treatment (heat treatment, deposition treatment, or the like) in various treatment devices, when the substrate conveying robot 401 carries an untreated substrate into a treatment device side and carries out a treated substrate from the treatment device side. Specifically, an untreated substrate stored in FOUP as a substrate storing portion of a conveying source is carried out from FOUP by the substrate conveying robot 401 and carried into a substrate storing portion of a conveying destination arranged on a treatment device side. A treated substrate is carried out from the treatment device side by the substrate conveying robot 401 and carried into FOUP.

Note that, a substrate storing pitch of FOUP for storing a wafer with a diameter of 300 mm is 10 mm, and a thickness of the wafer is 775 μm. Also, a substrate storing pitch of FOUP for storing a wafer with a diameter of 450 mm is 12 mm, and a thickness of the wafer is 925 μm.

A substrate conveying method using the substrate conveying robot 401 according to the embodiment comprises a first conveying step for carrying-out one or a plurality of substrates (wafers) present in a lower end region of FOUP (substrate storing portion) by the blade hand 408, and a second conveying step for inserting the batch conveying type hand 409 into the lower end region of FOUP from which one or the plurality of substrates S are carried out according to the first conveying step so as to carry out a plurality of substrates S simultaneously.

FIGS. 22A to 22L illustrate that 25 substrates (wafers) S stored in FOUP 426 as a substrate storing portion of a conveying source are carried out using the substrate conveying robot 401.

Figure 22A:
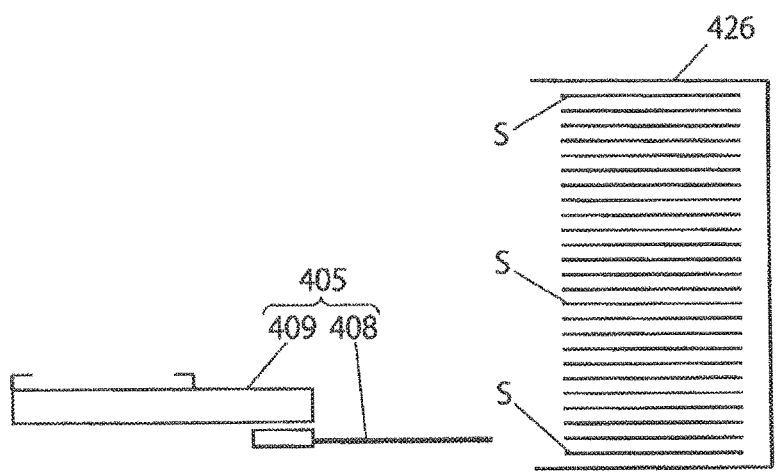
FIG. 22A is a schematic view illustrating a process for carrying-out a substrate from a substrate storing portion (FOUP) of a conveying source using the substrate conveying robot in FIG. 16.
Figure 22B:
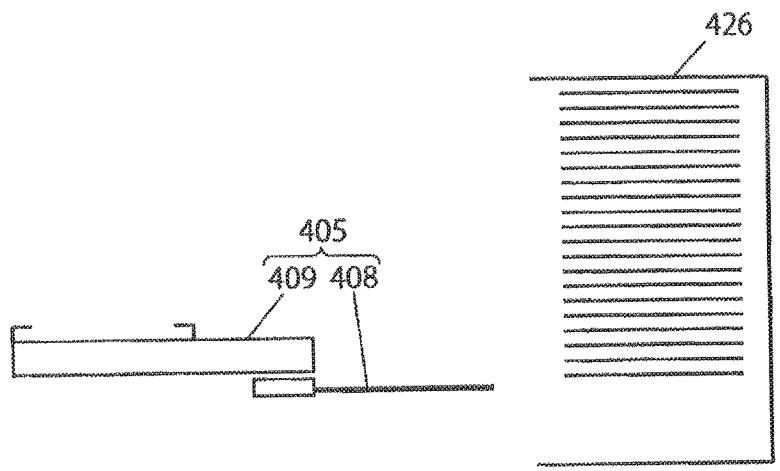
FIG. 22B is another schematic view illustrating a process for carrying-out a substrate from the substrate storing portion (FOUP) of a conveying source using the substrate conveying robot in FIG. 16.

As illustrated in FIGS. 22A and 22B, in the first conveying step, the blade hand 408 of the end effector 405 is in an operative position, and the batch conveying type hand 409 is in a retreat position. Then, the blade hand 408 in the operative position is inserted into FOUP 426 so as to carry-out a substrate S stored in the lowest position of FOUP 426 first. Subsequently, the second substrate, the third substrate, the fourth substrate, and the fifth substrate from the bottom are carried out one by one in order. By the first conveying step, a space is formed in the lower end region inside FOUP 426 as illustrated in FIG. 22B.

Figure 22C:
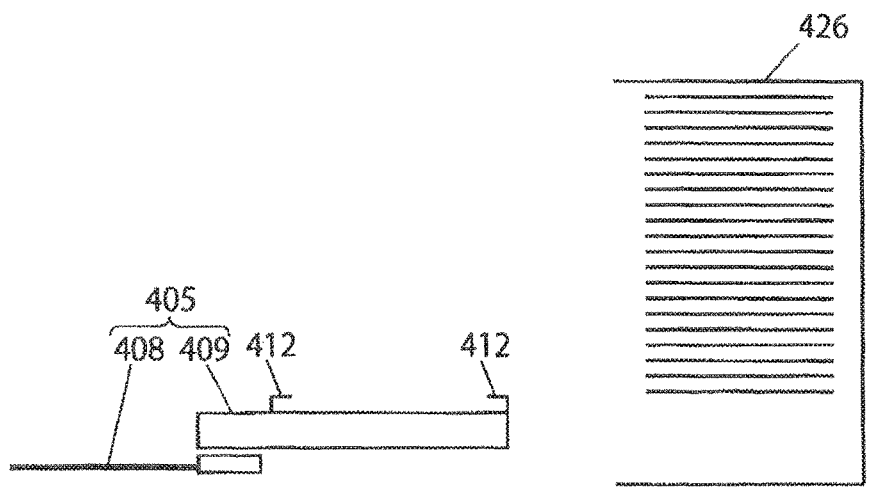
FIG. 22C is another schematic view illustrating a process for carrying-out a substrate from the substrate storing portion (FOUP) of a conveying source using the substrate conveying robot in FIG. 16.
Figure 22D:
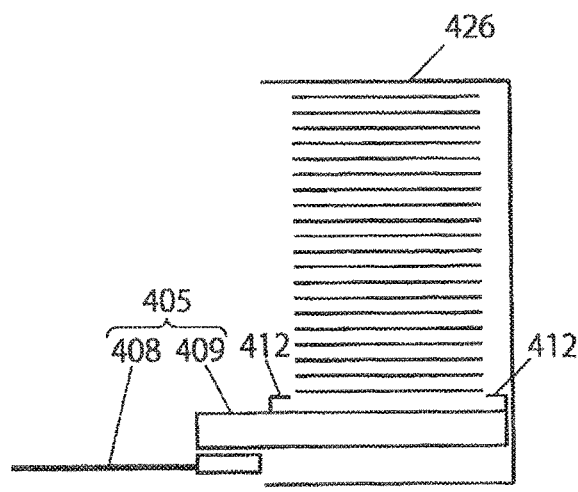
FIG. 22D is another schematic view illustrating a process for carrying-out a substrate from the substrate storing portion (FOUP) of a conveying source using the substrate conveying robot in FIG. 16.

Next, in the second conveying step, as illustrated in FIG. 22C, positions of the blade hand 408 and the batch conveying type hand 409 are switched so that the batch conveying type hand 409 is positioned in the operative position and the blade hand 408 is positioned in the retreat position. In addition, the height of the substrate holding unit 412 of the batch conveying type hand 409 is set to a height lower than its maximum height, preferably the lowest height. In this state, the batch conveying type hand 409 is inserted into a space in the lower end region inside FOUP 426, as illustrated in FIG. 22D.

Figure 22E:
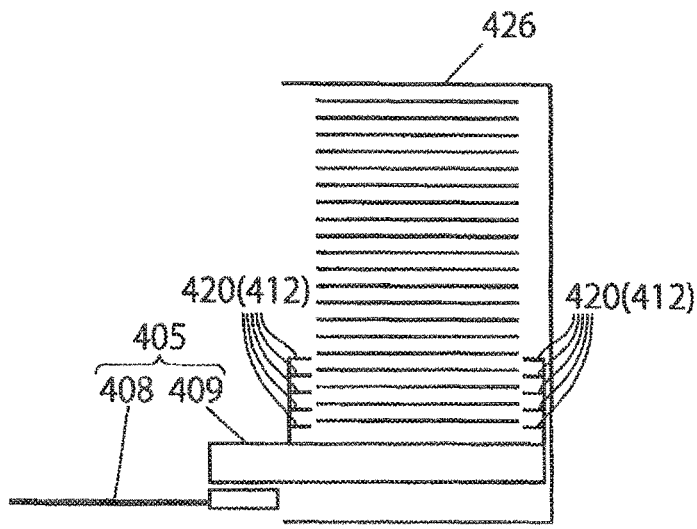
FIG. 22E is another schematic view illustrating a process for carrying-out a substrate from the substrate storing portion (FOUP) of a conveying source using the substrate conveying robot in FIG. 16.
Figure 22F:
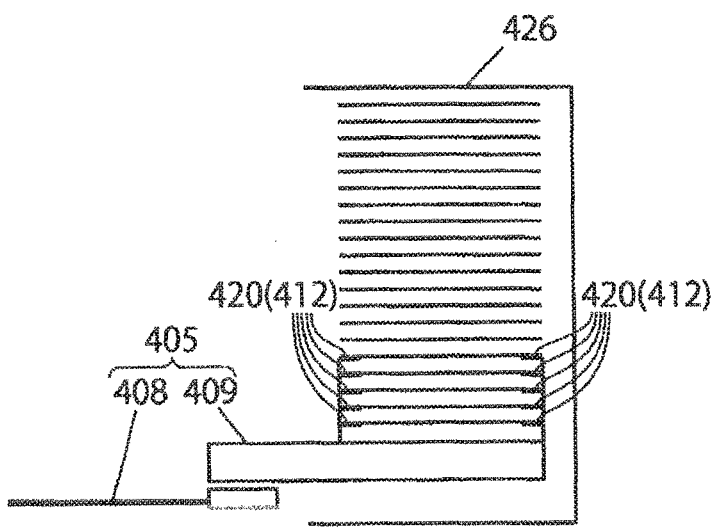
FIG. 22F is another schematic view illustrating a process for carrying-out a substrate from the substrate storing portion (FOUP) of a conveying source using the substrate conveying robot in FIG. 16.

Subsequently, as illustrated in FIG. 22E, the height of the substrate conveying unit 412 is heightened and the vertical pitch of the plurality of substrate supporting portions 420 are enlarged in accordance with a vertical pitch of the plurality of substrates S stored inside FOUP 426. Preferably, the maximum pitch of the plurality of substrate supporting portions 420 corresponds to the vertical pitch of the plurality of substrates S stored in FOUP 426. Then, as illustrated in FIG. 22F, the plurality of substrates S are held by the plurality of substrate supporting portions 420 so as to be carried out from inside FOUP 426 simultaneously.

Figure 22G:
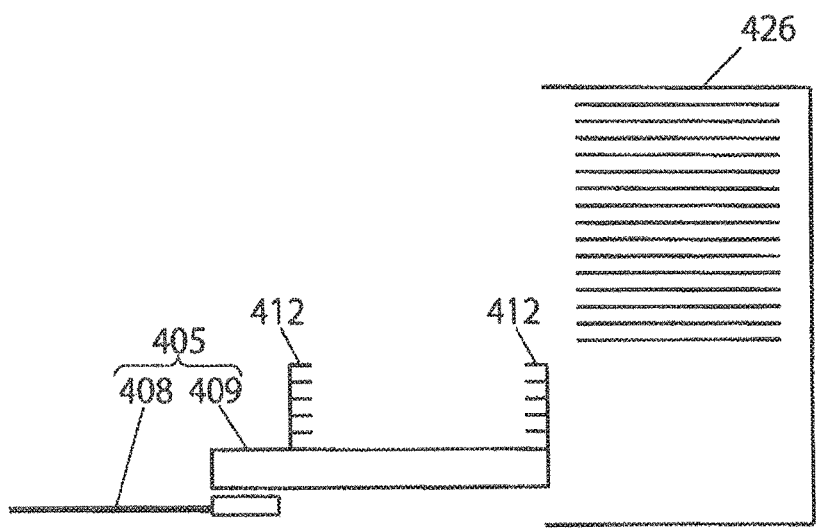
FIG. 22G is another schematic view illustrating a process for carrying-out a substrate from the substrate storing portion (FOUP) of a conveying source using the substrate conveying robot in FIG. 16.
Figure 22H:
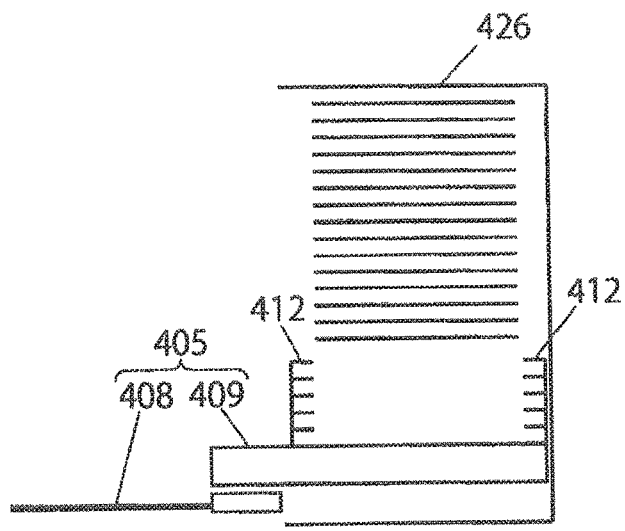
FIG. 22H is another schematic view illustrating a process for carrying-out a substrate from the substrate storing portion (FOUP) of a conveying source using the substrate conveying robot in FIG. 16.
Figure 22I:
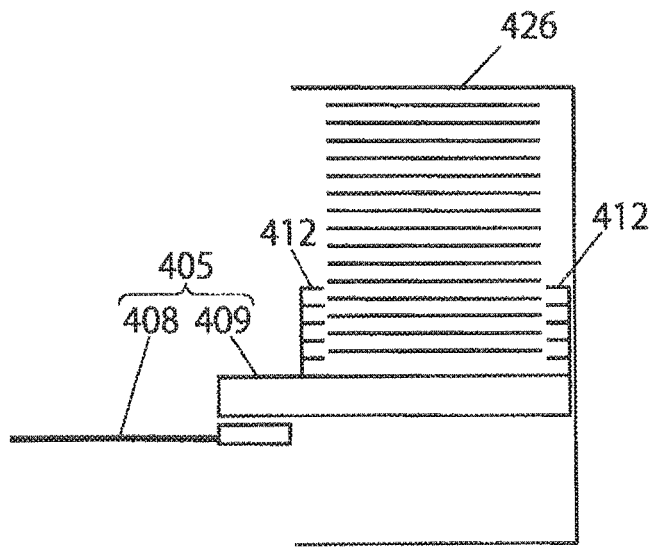
FIG. 22I is another schematic view illustrating a process for carrying-out a substrate from the substrate storing portion (FOUP) of a conveying source using the substrate conveying robot in FIG. 19.

Then, in the second or later conveyance using the batch conveying type hand 409, the height of the substrate holding unit 412 is previously heightened as illustrated in FIG. 22G, and in this state, the batch conveying type hand 409 is inserted into FOUP 426 as illustrated in FIG. 22H.

Figure 22J:
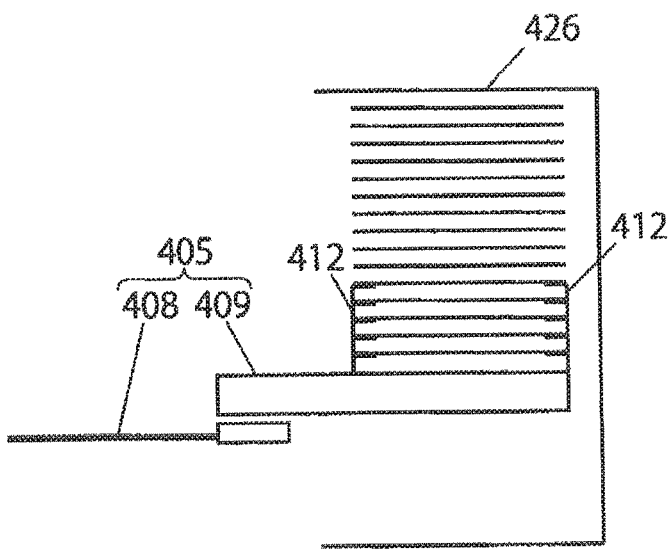
FIG. 22J is another schematic view illustrating a process for carrying-out a substrate from the substrate storing portion (FOUP) of a conveying source using the substrate conveying robot in FIG. 16.

Subsequently, the end effector 405 is lifted so as to hold a plurality of substrates S as illustrated in FIG. 22J and they are carried out simultaneously.

By previously heightening the height of the substrate holding unit 412 preceding insertion into FOUP 426, height change operation of the substrate holding unit 426 in FOUP 426 is made unnecessary, and thereby working time can be reduced.

Figure 22K:
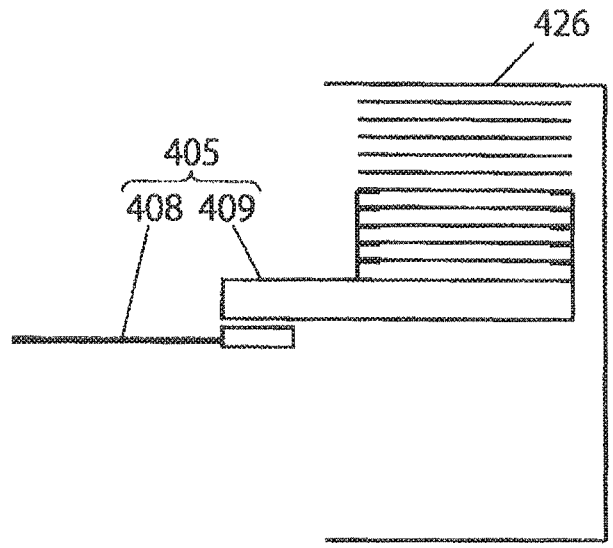
FIG. 22K is another schematic view illustrating a process for carrying-out a substrate from the substrate storing portion (FOUP) of a conveying source using the substrate conveying robot in FIG. 16.
Figure 22L:
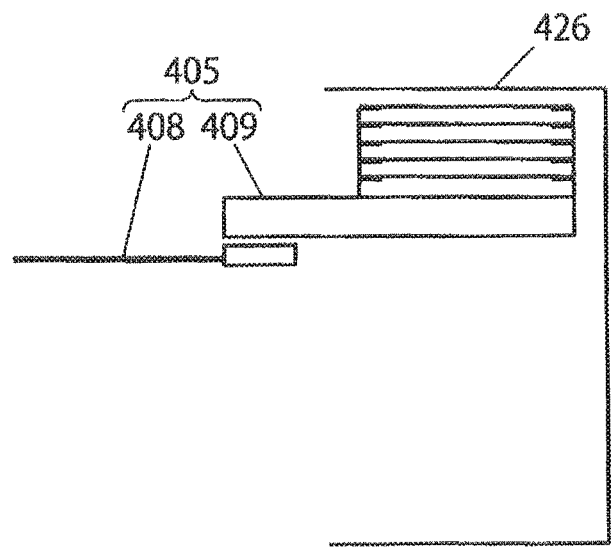
FIG. 22L is another schematic view illustrating a process for carrying-out a substrate from the substrate storing portion (FOUP) of a conveying source using the substrate conveying robot in FIG. 16.

FIG. 22K illustrates the third conveyance by the batch conveying type hand 409, and FIG. 22L illustrates the fourth conveyance by the batch conveying type hand 409. These conveyances are also performed by the same operation as the second conveyance by the batch conveying type hand 409 illustrated in FIGS. 22G to 22J.

In the embodiment, all of the substrates S left in FOUP 426 after the first conveying step are conveyed the batch conveying type hand 409.

Figure 23:
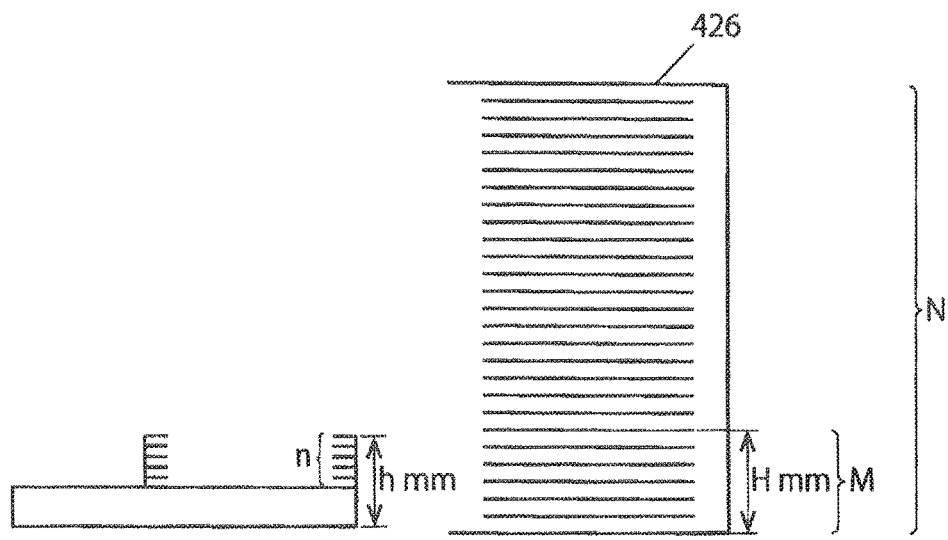
FIG. 23 is a schematic view illustrating a substrate conveying system including the substrate conveying robot in FIG. 16.

In a substrate conveying system including the substrate conveying robot 401 and FOUP 426 according to the present invention, M=N−n×(positive integer) is established, where the number of substrates S to be carried out by the blade hand 408 in the first conveying step is M, the number of substrates to be stored in FOUP is N, and the number of substrates to be held by the batch conveying type hand is n, as illustrated in FIG. 23. Thereby, an insertion space for the batch conveying type hand 409 provided in the lower end region in the substrate storing portion of the conveying destination can be minimized.

Also, H>h is established, where a height of a space formed in the lower end region of FOUP 426 when carrying-out M-number of substrates by the blade hand 408 is H, a height (the lowest height when the height is changeable) of a part, of the whole batch conveying type hand 409, which passes a region overlapping with the substrate S stored in FOUP 426 in a view of the vertical direction when conveying the substrates is h.

A preferable example for satisfying H>h while permitting the thickness of the batch conveying type hand 409 is that the diameter of the substrate S is 300 mm, the number of substrates to be held by the batch conveying type hand 409 is 3, 4, or 6, and the height h of the part, of the whole batch conveying type hand 409, which passes the region overlapping with the substrate S stored in FOUP 426 in the view of the vertical direction when conveying the substrates is 20 mm or less. For example, the height h is 10 mm or more and 20 mm or less.

Similarly, another preferable example is that the diameter of the substrate S is 300 mm, and the number of substrates to be held by the batch conveying type hand 409 is 5, and the height h of the part, of the whole batch conveying type hand 409, which passes the region overlapping with the substrate S stored in FOUP 426 in the view of the vertical direction when conveying the substrates is 60 mm or less. For example, the height h is 50 mm or more and 60 mm or less.

Similarly, another preferable example is that the diameter of the substrate S is 300 mm, and the number of substrates to be held by the batch conveying type hand 409 is 7, and the height h of the part, of the whole batch conveying type hand 409, which passes the region overlapping with the substrate S stored in FOUP 426 in the view of the vertical direction when conveying the substrates is 50 mm or less. For example, the height h is 40 mm or more and 50 mm or less.

Similarly, another preferable example is that the diameter of the substrate S is 300 mm, and the number of substrates to be held by the batch conveying type hand 409 is 6 or 9, and the height h of the part, of the whole batch conveying type hand 409, which passes the region overlapping with the substrate S stored in FOUP 426 in the view of the vertical direction when conveying the substrates is 80 mm or less. For example, the height h is 70 mm or more and 80 mm or less.

Similarly, another preferable example is that the diameter of the substrate S is 450 mm, and the number of substrates to be held by the batch conveying type hand 409 is 3, 4, or 6, and the height h of the part, of the whole batch conveying type hand 409, which passes the region overlapping with the substrate S stored in FOUP 426 in the view of the vertical direction when conveying the substrates is 24 mm or less. For example, the height h is 12 mm or more and 24 mm or less.

Similarly, another preferable example is that the diameter of the substrate S is 450 mm, and the number of substrates to be held by the batch conveying type hand 409 is 5 and the height h of the part, of the whole batch conveying type hand 409, which passes the region overlapping with the substrate S stored in FOUP 426 in the view of the vertical direction when conveying the substrates is 72 mm or less. For example, the height h is 60 mm or more and 72 mm or less.

Similarly, another preferable example is that the diameter of the substrate S is 450 mm, and the number of substrates to be held by the batch conveying type hand 409 is 7 and the height h of the part, of the whole batch conveying type hand 409, which passes the region overlapping with the substrate S stored in FOUP 426 in the view of the vertical direction when conveying the substrates is 60 mm or less. For example, the height h is 49 mm or more and 60 mm or less.

Similarly, another preferable example is that the diameter of the substrate S is 450 mm, and the number of substrates to be held by the batch conveying type hand 409 is 6 or 9 and the height h of the part, of the whole batch conveying type hand 409, which passes the region overlapping with the substrate S stored in FOUP 426 in the view of the vertical direction when conveying the substrates is 96 mm or less. For example, the height h is 84 mm or more and 96 mm or less.

Note that, when the number of substrates to be held is 25 as in FOUP 426, it is especially desirable that the number of substrates n to be held by the batch conveying type hand 409 is 5. When the number of substrates n to be held by the batch conveying type hand 409 is 5, the number of substrates to be conveyed by the batch conveying type hand 409 is n×(positive integer)=5×4=20, and the number of substrates M to be conveyed by the blade hand 408 is 5. Namely, the total number of times of conveying substrates by the end effector 405 is 9 times, summing up 5 times by the blade hand and 4 times by the batch conveying type hand.

In contrast, when the number of substrates n to be held by the batch conveying type hand 409 is 4, the number of substrates to be conveyed the batch conveying type hand 409 is n×(positive integer)=4×5=20, and the number of substrates M to be conveyed by the blade hand 408 is 5. Namely, the total number of times of conveying substrates by the end effector 405 is 10 times, summing up 5 times by the blade hand 408 and 5 times by the batch conveying type hand 409, being 1 time more of conveying substrates compared to the case when n=5.

Also, when the number of substrates n to be held by the batch conveying type hand 409 is 6, the number of substrates to be conveyed the batch conveying type hand 409 is n×(positive integer)=6×3=18, and the number of substrates M to be conveyed the blade hand 408 is 7. Namely, the total number of times of conveying substrates by the end effector 405 is 10 times, summing up 7 times by the blade hand 408 and 3 times by the batch conveying type hand 409, being 1 time more of conveying substrates compared to the case when n=5.

When the number of substrates to be stored is 25 as in FOUP 426 as above, the total number of times of conveying substrates S by the end effector 405 can be minimized by setting the number of substrates n to be held by the batch conveying type hand 409 to 5.

Next, an operation for storing the substrates S carried out from FOUP 426 of a conveying source into a substrate storing shelf (substrate storing portion) 427 of a conveying destination (treatment device side) will be described, referring to FIGS. 24A to 24C.

Figure 24A:
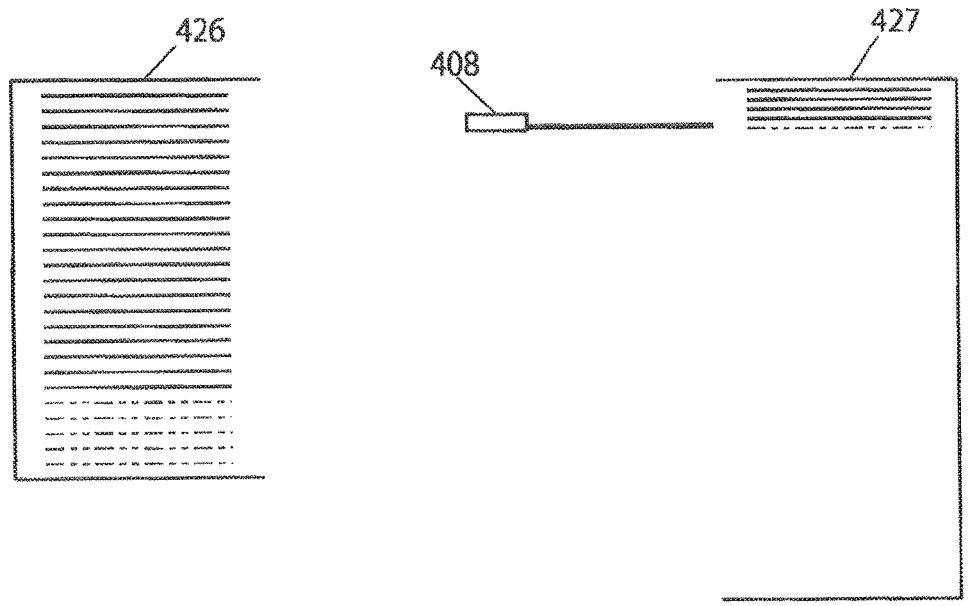
FIG. 24A is a schematic view illustrating a process for conveying a substrate carried out from the substrate storing portion (FOUP) of a conveying source using the substrate conveying robot in FIG. 16 into the substrate storing portion of a conveying destination.

In the embodiment, as illustrated in FIG. 24A, the substrate S carried out by the blade hand 408 from the lower end region of FOUP 426 of the conveying source in the above-mentioned first conveying step is carried into the upper end region of the substrate storing shelf 427 of the conveying destination.

Figure 24B:
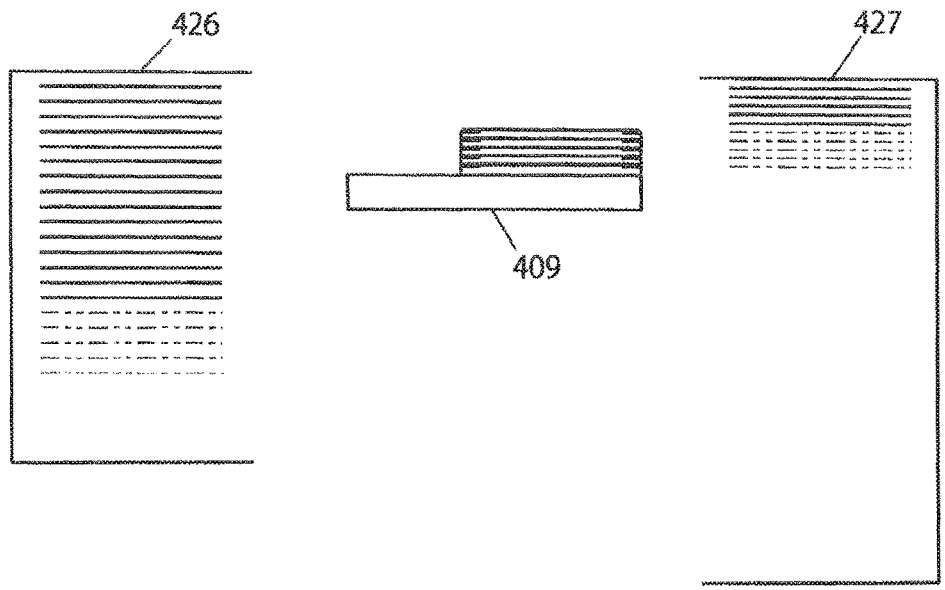
FIG. 24B is another schematic view illustrating a process for conveying a substrate carried out from a substrate storing portion (FOUP) of a conveying source using the substrate conveying robot in FIG. 16 into the substrate storing portion of a conveying destination.

Next, the substrates S carried out by the batch conveying type hand 409 from the intermediate region and the upper end region of FOUP 426 of the conveying source in the above-mentioned second conveying step is carried into the lower portion of the upper end region of the substrate storing shelf 427 of the conveying destination, as illustrated in FIG. 24B.

Here, in the example, the vertical pitch of the plurality of substrates S in a stored state is different between FOUP 426 of the conveying source and the substrate storing shelf 427 of the conveying destination. Namely, the substrate storing pitch of the substrate storing shelf 427 of the conveying destination is smaller than the substrate storing pitch in FOUP 426 of the conveying source.

Thereupon, after carrying-out the plurality of substrates S by the batch conveying type hand 409 from FOUP 426 of the conveying source in the second conveying step, the vertical pitch of the plurality of substrate supporting portions 420 is reduced in accordance with the substrate storing pitch of the substrate storing shelf 427 of the conveying destination. Thereby, the plurality of substrates S can be conveyed between substrate storing portions with different substrate storing pitches.

Note that, the number of substrates to be stored in the substrate storing shelf 427 of the conveying destination is sometimes more than the number of substrates to be stored in FOUP 426 of the conveying source (=25). For example, when the number of substrates to be stored in the substrate storing shelf 427 is 100, the substrates S are carried out from four FOUPs 426 in order and carried into the substrate storing shelf 427 of the conveying destination.

In this case, the substrates S to be carried into the upper end region of the substrate storing shelf 427 of the conveying destination are the substrates S which has been carried out from the lower end region of the first FOUP 426. In contrast, the substrates S to be carried into the lower end region of the substrate storing shelf 427 of the conveying destination is the substrates S which has been carried out from the upper end region of the fourth FOUP 426. Substrates carried out from the intermediate region/upper end region of the first FOUP 426, all regions of the second FOUP 426, all regions of the third FOUP 426, and the lower end region/intermediate region of the fourth FOUP 426, respectively are carried into the intermediate region of the substrate storing shelf 427 of the conveying destination.

Figure 24C:
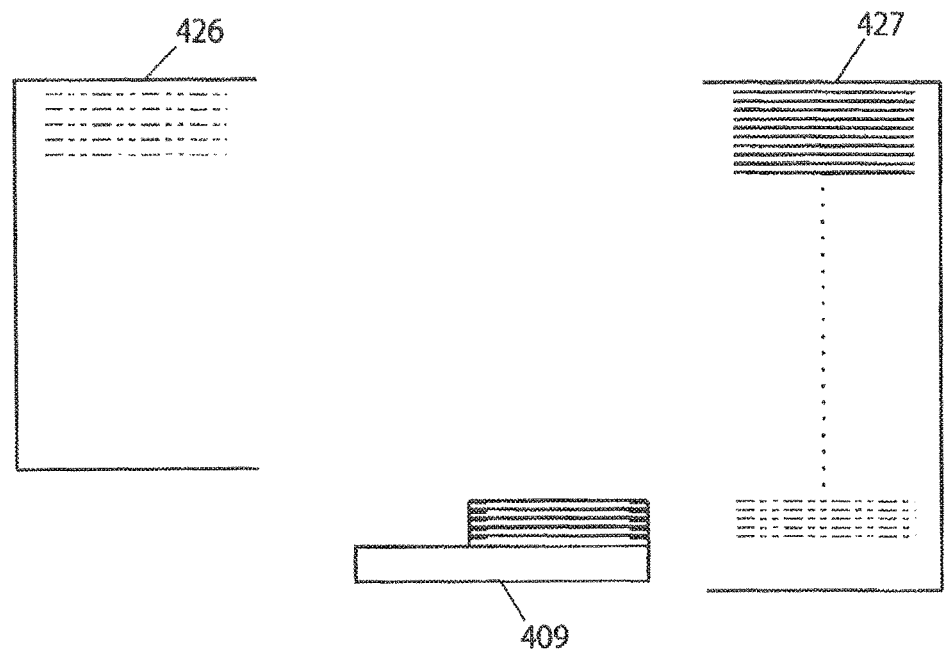
FIG. 24C is another schematic view illustrating a process for conveying a substrate carried out from a substrate storing portion (FOUP) of a conveying source using the substrate conveying robot in FIG. 16 into the substrate storing portion of a conveying destination.

Note that, as illustrated in FIG. 24C, since a space is ensured in the lower end region of the substrate storing shelf 427 of the conveying destination in the example, the batch conveying type hand 409 can be inserted into the lower end region of the substrate storing shelf 427 utilizing this space.

As a substrate conveying method according to a variation of the above-mentioned embodiment, part of, not all of, the substrates S left in FOUP 426 of the conveying source after the above-mentioned first conveying step can be carried out by the batch conveying type hand 409.

For example, part of the substrates S left in FOUP 426 of the conveying source after the first conveying step is carried out by the batch conveying type hand 409 and carried into the intermediate region in the vertical direction of the substrate storing shelf 427 of the conveying destination.

Subsequently, as illustrated in FIG. 25, the substrates S left in the upper end region of FOUP 426 of the conveying source is carried out one by one by the blade hand 408, not by the batch conveying type hand 409, and carried into the lower end region of the substrate storing shelf 427 of the conveying destination.

Thereby, the substrates S can be carried in up to the lowest stage of the substrate storing shelf 427 without any problem even when a space for inserting the batch conveying type hand 409 cannot be ensured in the lower end region of the substrate storing shelf 427 of the conveying destination.

Note that, in the above-mentioned end effector 405, as illustrated in FIG. 26, the blade hand 408 and the batch conveying type hand 409 can be rotated independently from each other about a common axis line (third axis line L3). Thereby, the state that the batch conveying type hand 409 is positioned in the operative position and the blade hand 408 is positioned in the retreat position (FIG. 26 (*a*)), and the state that the blade hand 8 is positioned in the operative position and the batch conveying type hand 409 is positioned in the retreat position (FIG. 26 (*b*)) can be switched properly.

Figure 27:
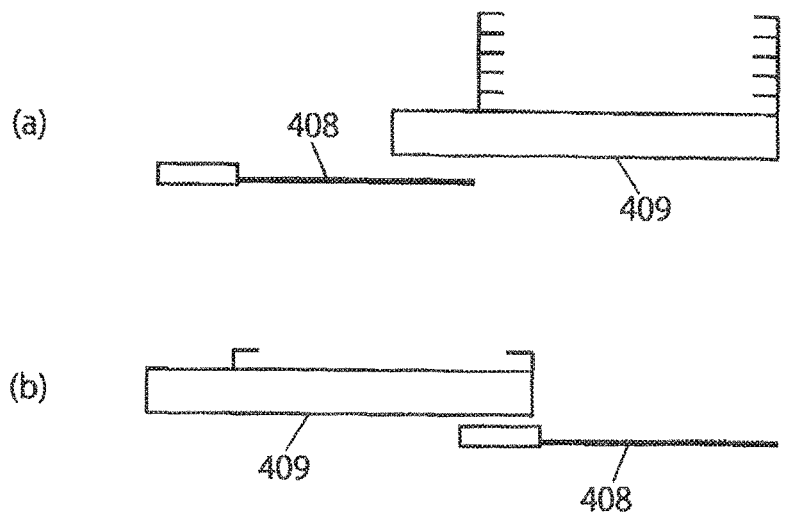
FIG. 27 is a schematic view illustrating a variation of the hand switchover mechanism in FIG. 26.

In contrast, as a variation, the blade hand 408 and the batch conveying type hand 409 can also be configured to be moved back and forth independently from each other using a linear guide and the like, as illustrated in FIG. 27.

In the configuration, the state that the batch conveying type hand 409 is advanced so as to be positioned in the operative position and the blade hand 408 is retreated so as to be positioned in the retreat position (FIG. 27 (*a*)), and the state that the blade hand 408 is advanced so as to be positioned in the operative position and the batch conveying type hand 409 is retreated so as to be positioned in the retreat position (FIG. 27 (*b*)) can be switched properly.

Figure 28:
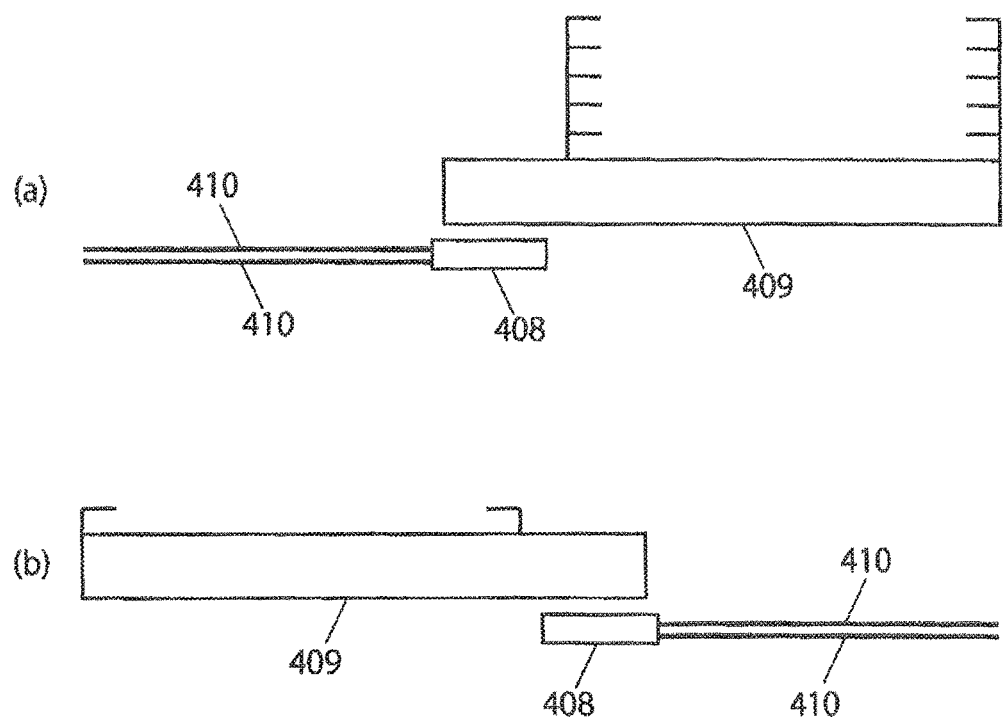
FIG. 28 is a schematic view illustrating a variation of an end effector of the substrate conveying robot in FIG. 16.

As another variation of the above-mentioned embodiment, as illustrated in FIG. 28, a plurality of hand bodies 10 can be provided to the blade hand 408. By providing the plurality of hand bodies 10 to the blade hand 408 in this way, a plurality of substrates S can be carried out from FOUP 426 simultaneously in the above-mentioned first conveying step. Thereby, the number of times of conveying substrates in the first conveying step can be decreased so as to shorten conveying time.

Figure 29:
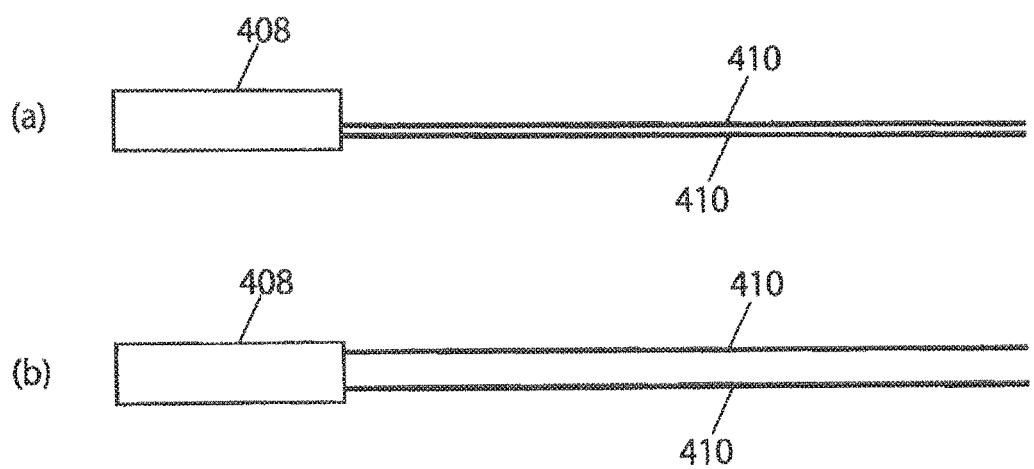
FIG. 29 is a schematic view illustrating a pitch change operation of a blade hand of the end effector in FIG. 28.

In the example, as illustrated in FIG. 29, it is preferable that the vertical pitch of the plurality of hand bodies 410 are changeable. By making the vertical pitch of the plurality of hand bodies 410 changeable, even when the substrate storing pitch of the conveying source and the substrate storing pitch of the conveying destination are different from each other, it is possible to adapt to the difference without any problem.

As described above, according to the above-mentioned embodiment of the second reference example of the present invention and its variations, the end effector 405 has both the blade hand 408 and the batch conveying type hand 409, and the substrate(s) S is(are) carried out using the blade hand 408 so as to ensure a space for inserting the batch conveying type hand 409 when the batch conveying type hand 409 cannot be inserted into the substrate storing portion. Thereby, a plurality of substrates can be conveyed simultaneously using the batch conveying type hand 409 without any problem even when use of the batch conveying type hand 409 is restricted due to the condition on the substrate storing portion side.

Note that, although the substrate storing portion of the conveying source is FOUP 426 and the substrate storing portion of the conveying destination is the substrate storing shelf 427 on the treatment device side in the above description, in contrast, the conveying destination can be FOUP 426 and the conveying source can be the substrate storing shelf 427 on the treatment device side. It is particularly effective when enough space for inserting the batch conveying type hand 409 cannot be ensured in the lower end region of the substrate storing shelf 427 on the treatment device side as the conveying source.

In addition, although a configuration that the substrate(s) S is(are) held on the upper surface side of each of the blade hand 408 and the batch conveying type hand 409 is described in the above-described embodiment, instead, a configuration that the substrate(s) S is(are) held on the lower surface side of each of the blade hand 408 and the batch conveying type hand 409 can also be employed.

In the example, when carrying-out a substrate by the blade hand from the substrate storing portion of the conveying source in the first conveying step, the substrate is carried out from the upper end region of the substrate storing portion of the conveying source and the substrate is carried into the lower end region of the substrate storing container of the conveying destination. Similarly, in the second conveying step, substrates carried out from the intermediate region and the lower end region of the substrate storing portion of the conveying source are carried into the intermediate region and the upper end region of the substrate storing portion of the conveying destination.

Note that, a configuration of the robot arm 404 on which the above-mentioned end effector 405 is mounted is not limited to the same, and the above-mentioned end effector can be mounted on various robot arms such as an orthogonal coordinate type, a cylindrical coordinate type, a polar coordinate type, a horizontal articulated type, or a vertical articulated type.

In addition, a configuration of the batch conveying type hand 409 is also not limited to the above-mentioned configuration, and the configurations disclosed in PTLs 1 to 3, for example, can be employed accordingly.

Figure 30:
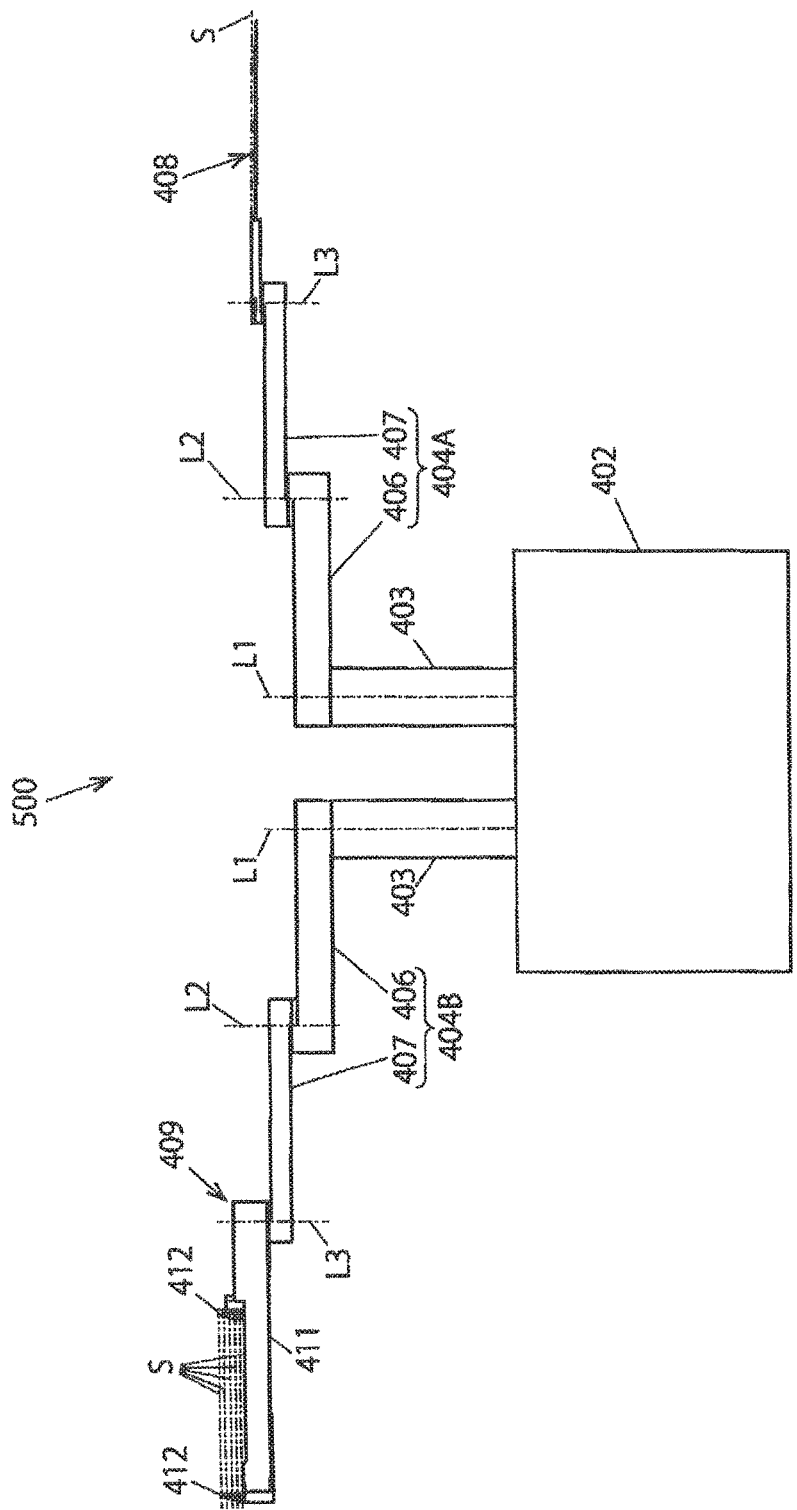
FIG. 30 is a side view illustrating a substrate conveying robot according to a variation of the embodiment above.

In addition, as another variation, in a substrate conveying robot 500 comprising a first robot arm 404A and a second robot arm 404B which can be driven independently from the first robot arm 404A, it is also possible that the above-mentioned blade hand (first hand) 408 is mounted on the first robot arm 404A, and the above-mentioned batch conveying type hand (second hand) 409 is mounted on the second robot arm 404B, as illustrated in FIG. 30.

Also in the substrate conveying robot 500 of the variation, when the batch conveying type hand 409 cannot be inserted into the substrate storing portion as with the above-described embodiment, the substrate S can be carried out using the blade hand 408 mounted on the first robot arm so as to ensure a space for inserting the batch conveying type hand 409. Thereby, a plurality of substrates can be conveyed using the batch conveying type hand 409 simultaneously without any problem even when use of the batch conveying type hand 409 is restricted due to the condition on the substrate storing portion side.

Figure 31:
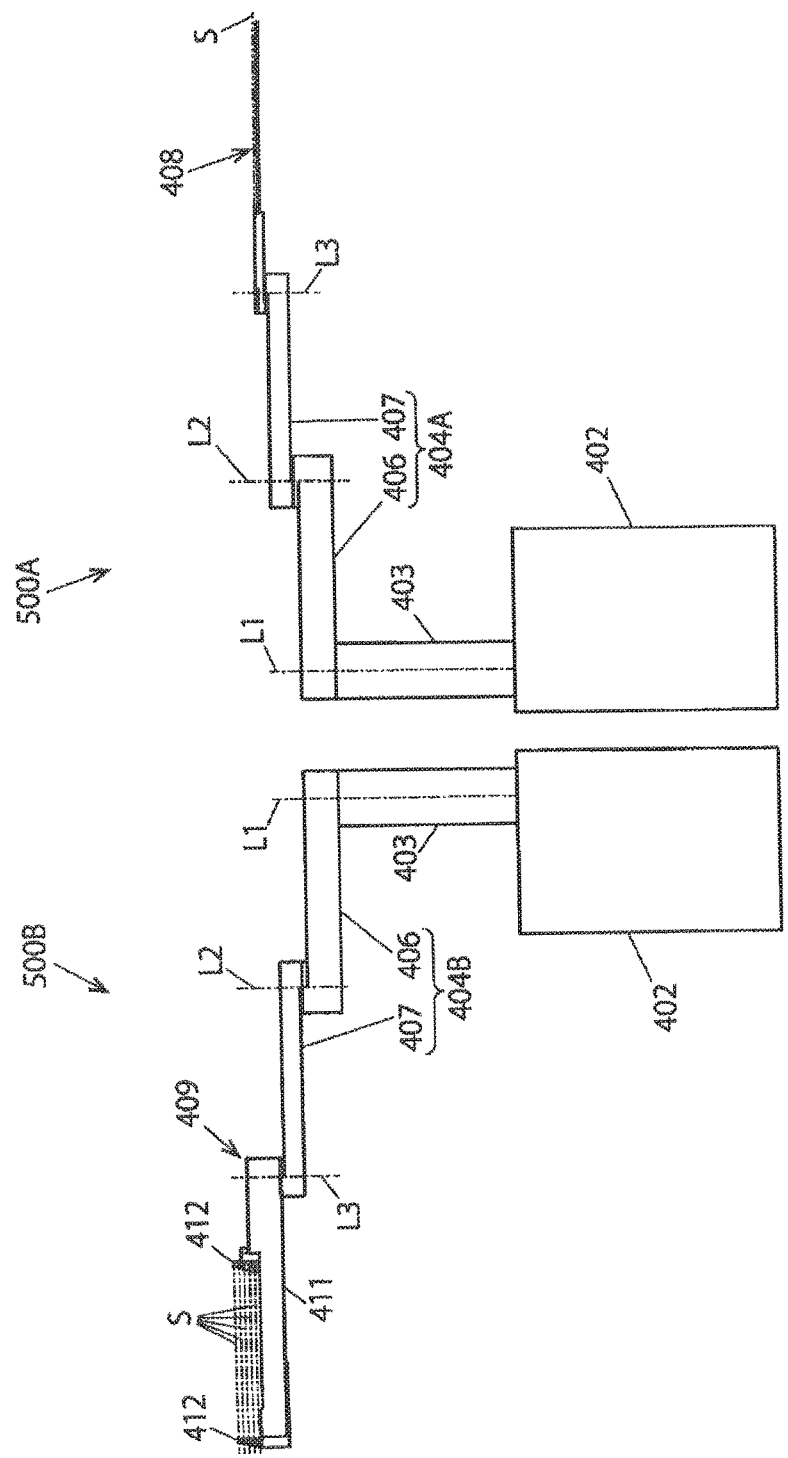
FIG. 31 is a side view illustrating a substrate conveying system according to a variation of the embodiment above.

In addition, as another variation, in the substrate conveying system comprising a first substrate conveying robot 500A and a second substrate conveying robot 500B, it is also possible that the above-mentioned blade hand (first hand) 408 is mounted on the first robot arm 404A of the first substrate conveying robot 500A and the above-mentioned batch conveying type hand (second hand) 409 is mounted on the second robot arm 404B of the second substrate conveying robot 500B, as illustrated in FIG. 31.

Also in the substrate conveying system of the variation, when the batch conveying type hand 409 cannot be inserted into the substrate storing portion, the substrate S can be carried out using the blade hand 408 of the first substrate conveying robot 500A so as to ensure a space for inserting the batch conveying type hand 409, as with the above-described embodiment. Thereby, a plurality of substrates can be conveyed simultaneously using the batch conveying type hand 409, even when use of the batch conveying type hand 409 is restricted due to the condition on the substrate storing portion side.

Figure 32:
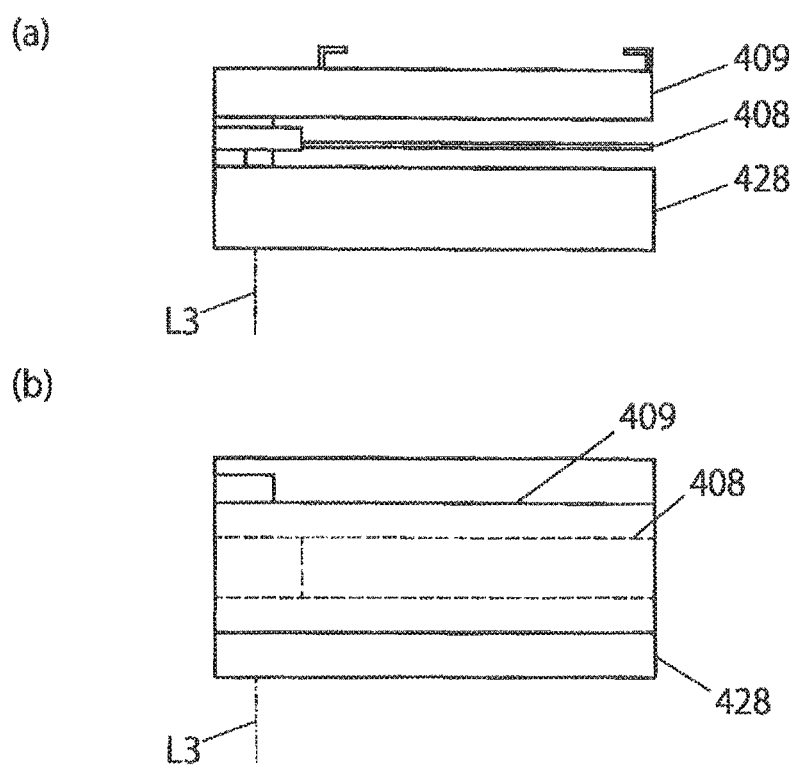
FIG. 32 is a schematic view illustrating a hand switchover mechanism of a substrate conveying robot according to a variation of the embodiment above.

In addition, as another variation, it is also possible that the blade hand (first hand) 408 and the batch conveying type hand (second hand) 409 are provided so as to slide independently from each other to a hand common body portion 428 provided rotatably about the third axis line L3, as illustrated in FIGS. 32 and 33.

In addition, although the interval between adjacent substrate supporting portions 420 are made changeable by configuring the substrate supporting portions 420 constructing the substrate holding unit 412 of the batch conveying type hand 409 so as to be lifted and lowered as illustrated in FIGS. 21A and 21B in the above-described embodiment, the interval between adjacent substrate supporting portions 420 may be fixed as a variation. In this case, the configuration can be simplified by omitting the lifting link mechanism 423 or the like.

In addition, although adjacent substrate supporting portions 420 are arranged not to overlap with each other in a view from above as illustrated in FIG. 19 in the above-described embodiment, the adjacent substrate supporting portions 420 may be arranged so as to overlap with each other in a view from above as a variation.

Hereunder, a substrate conveying robot comprising the end effector according to an embodiment of the third reference example in the present invention will be described referring to the figures.

Figure 34:
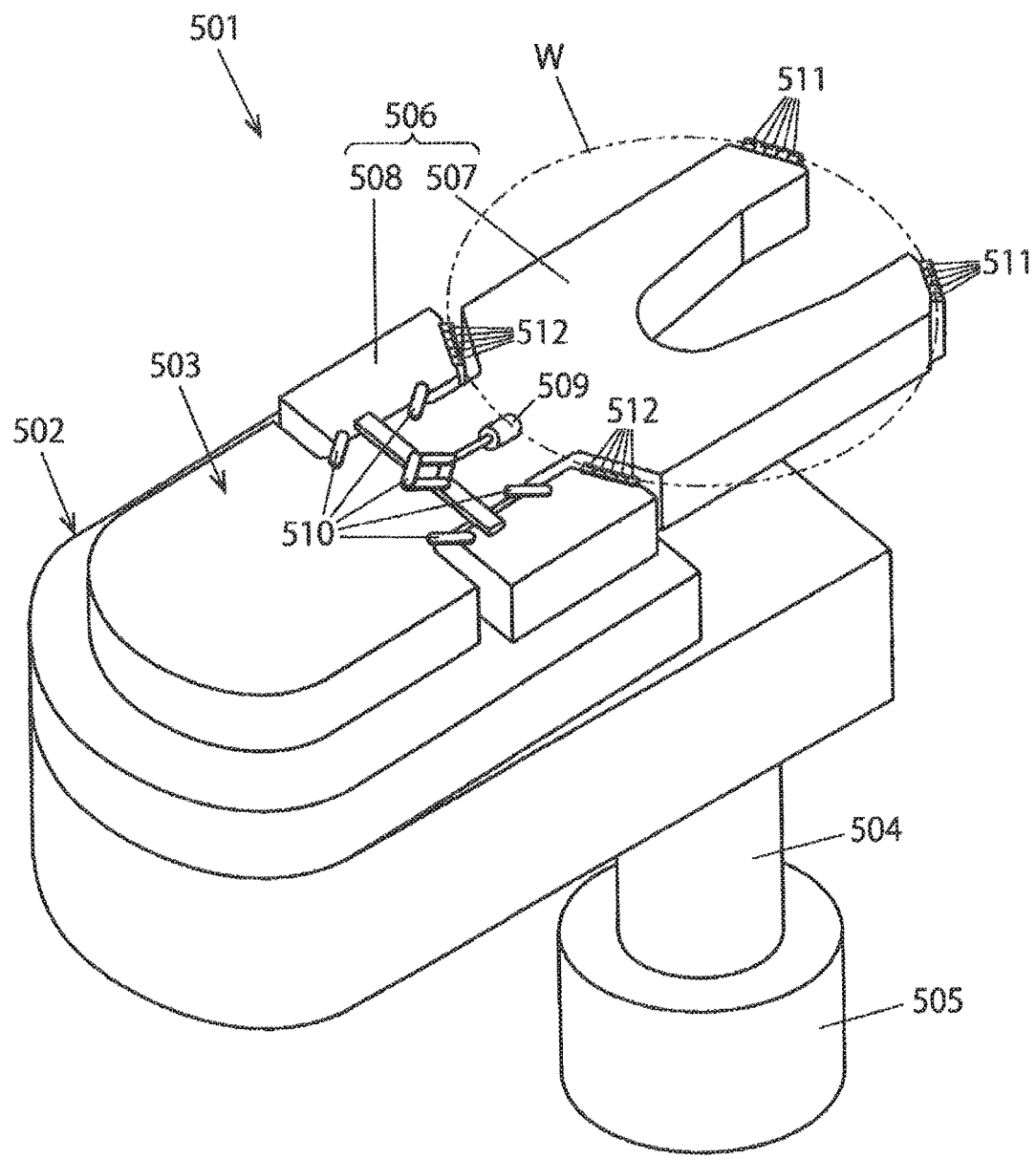
FIG. 34 is a perspective view of a substrate conveying robot comprising the end effector according to an embodiment of the third reference example of the present invention.

As illustrated in FIG. 34, a substrate conveying robot 501 according to the embodiment is a so called horizontal articulated type robot capable of simultaneously holding a plurality of wafers (substrates) W and conveying them.

Note that a substrate conveying robot to which the third reference example of the present invention can be applied is not limited to the specific substrate conveying robot described hereunder. The third reference example of the present invention can be applied to various substrate conveying robots such as a substrate conveying robot of a type conveying wafers one by one, not a type conveying a plurality of wafers simultaneously, for example.

The substrate conveying robot 501 according to the embodiment has an articulated robot arm 502, and an end effector 503 is mounted on the robot arm 502. The proximal end portion of the robot arm 502 is connected to the upper end of an arm supporting shaft 504 capable of elevating and turning, and the arm supporting shaft 504 is supported at a supporting base 505.

The end effector 503 has an end effector body 506 formed to be thick. The end effector body 506 comprises a fixed portion 507 fixed to the robot arm 502 and a pair of movable portions 508 positioned on both sides of the center portion in the longitudinal direction of the end effector body 506 and capable of advancing and retreating on the robot arm 502. The movable portions 508 are driven by an actuator 509 and a link mechanism 510 so as to advance and retreat.

A plurality of distal end side substrate supporting portions 511 are provided to the left and right distal end portions of the fixed portion 507, respectively. Similarly, a plurality of proximal end side substrate supporting portions 512 are provided to the distal ends of the pair of left and right movable portions 508, respectively as well.

Figure 35A:
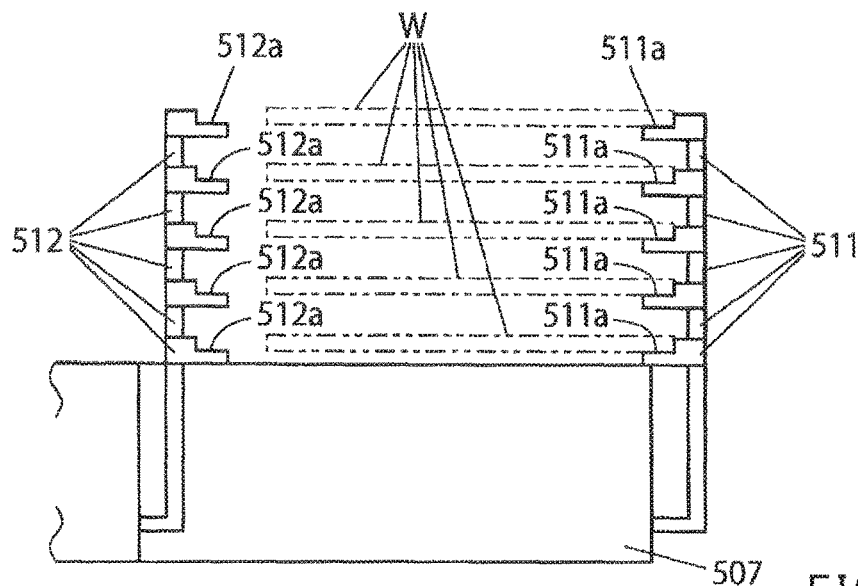
FIG. 35A is a schematic view illustrating an operation of the substrate conveying robot in FIG. 34.
Figure 35B:
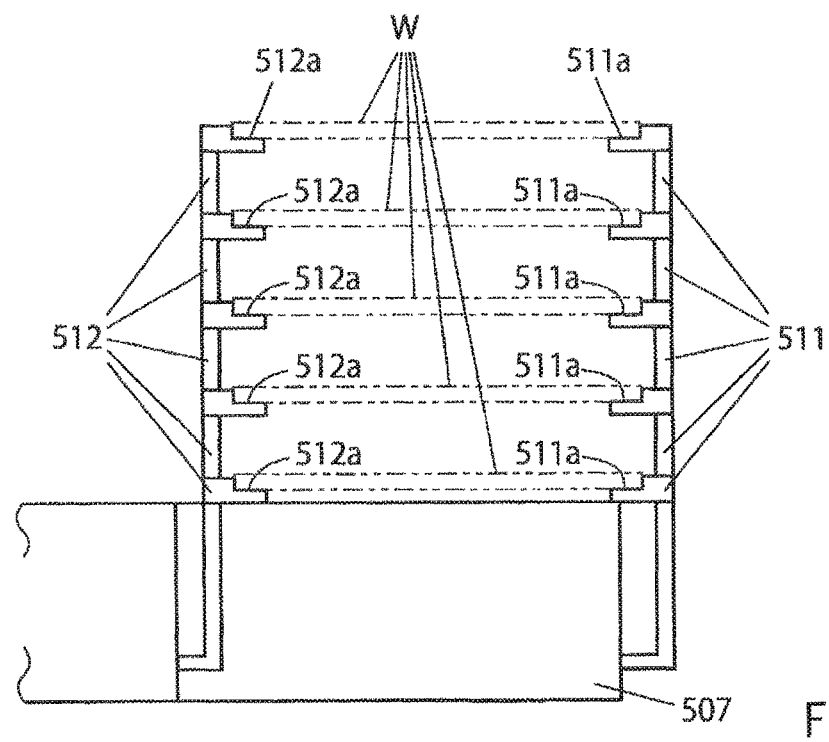
FIG. 35B is another schematic view illustrating an operation of the substrate conveying robot in FIG. 34.

As illustrated in FIG. 35A and FIG. 35B, a plurality of substrate placing surfaces 511a of the distal end side substrate supporting portions 511 and a plurality of substrate placing surfaces 512a of the proximal end side substrate supporting portions 512 can be arranged in different positions in the vertical direction, and a vertical pitch can be changed appropriately.

From the state illustrated in FIG. 35A, the actuator 509 is driven so as to advance the plurality of proximal end side substrate supporting portions 512 and insert them below the respective bottom surface edge portions of a plurality of wafers W, and subsequently the end effector 503 is elevated. Thereby, the bottom surface edge portions of the plurality of wafers W are supported by the respective substrate placing surfaces 511a, 512a of the distal end side substrate supporting portions 511 and the proximal end side substrate supporting portions 512. Thereby, the plurality of (five in the example) wafers W can be held by the end effector 503 simultaneously.

Also, since a pitch can be changed in the state that the plurality of wafers W are held so as to make a state of large pitch as illustrated in FIG. 35B, conveyance from a cassette of small pitch to a cassette of large pitch or a reverse conveyance can be performed.

Next, a substrate supporting portion connecting mechanism and a displacement prohibiting unit which are characteristic parts of the end effector according to the embodiment will be described referring to FIG. 36 and FIG. 37.

Figure 36:
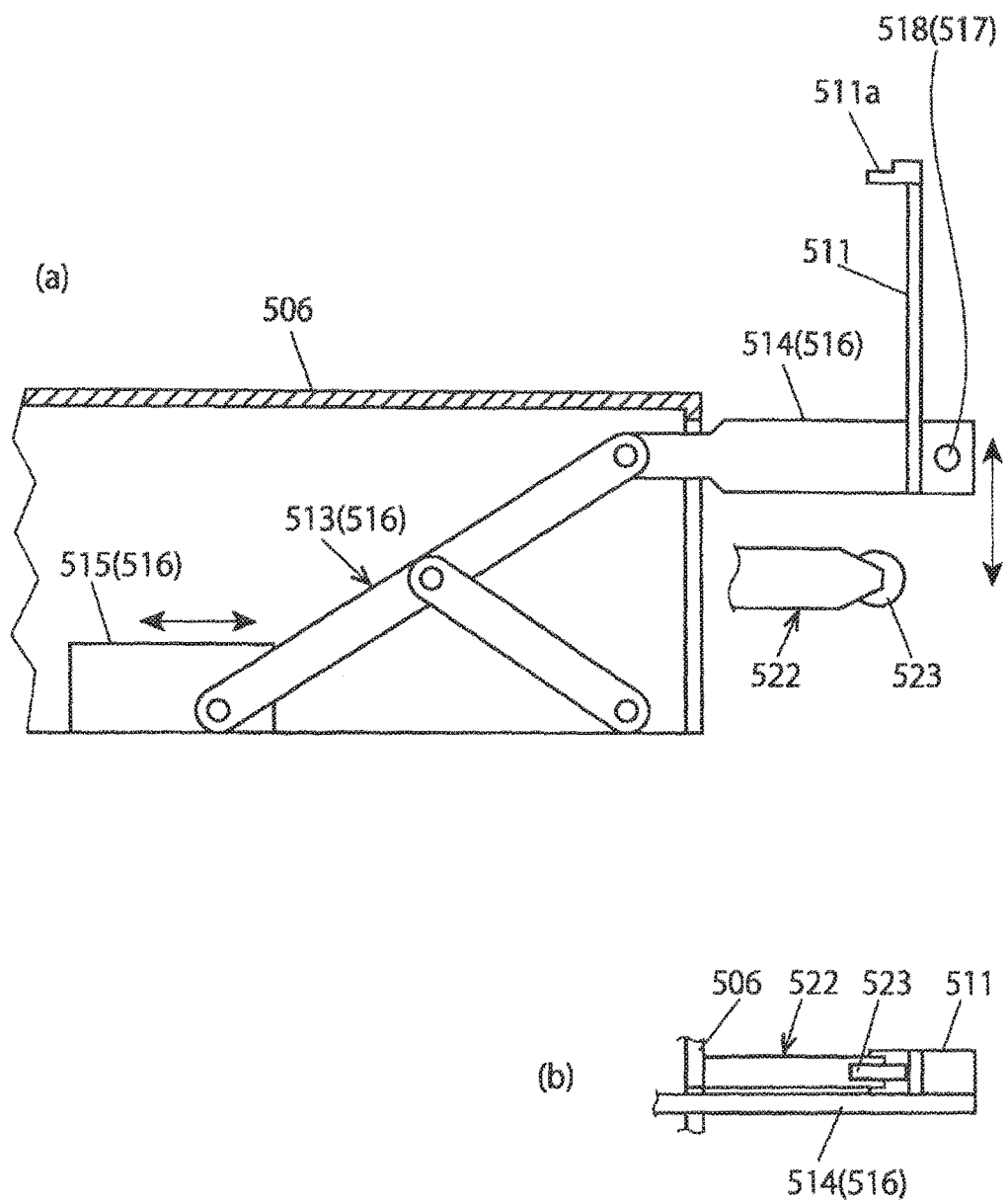
FIG. 36 (*a*) is an enlarged partial section view illustrating a distal end portion of the end effector of the substrate conveying robot in FIG. 34, and (b) is a bottom view illustrating part of (a).

As illustrated in FIG. 36, the proximal end portion of the distal end side substrate supporting portion 511 provided on the distal end side of the end effector body 506 is connected pivotably to an elevating member 514 connected to an elevating link mechanism 513 provided in the end effector body 506. By driving the elevating link mechanism 513 via a slider 515, the elevating member 514 elevates integrally with the distal end side substrate supporting portion 511.

The elevating link mechanism 513, the elevating member 514, and the slider 515 configure a substrate supporting portion drive unit 516 for moving the distal end side substrate supporting portion 511 between the upper position and the lower position. A vertical pitch of the plurality of distal end side substrate supporting portions 511 can be changed by the substrate supporting portion drive unit 516.

Figure 37:
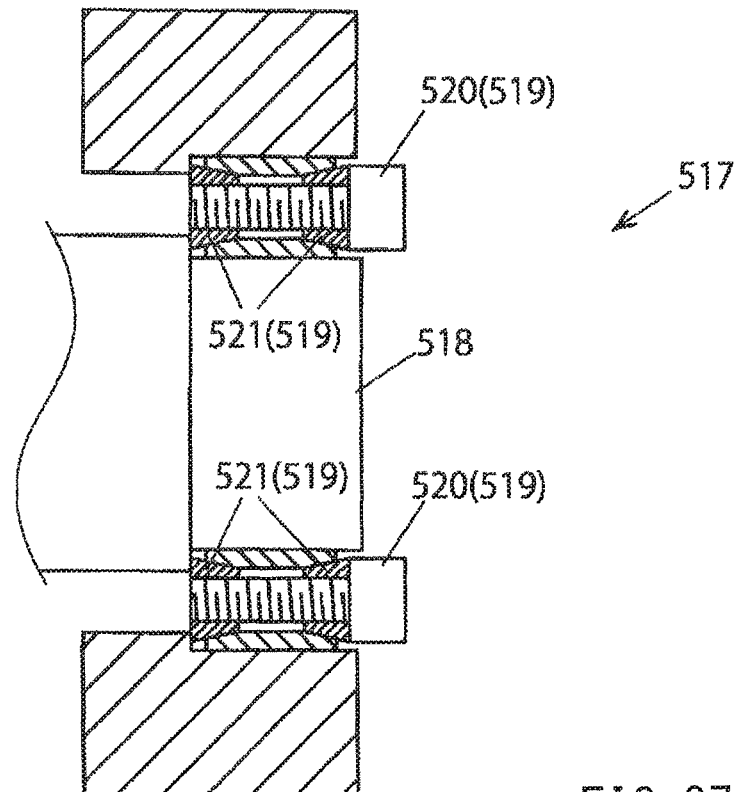
FIG. 37 is an enlarged partial section view illustrating a pivotal spindle part of a distal end side substrate supporting portion of the end effector in FIG. 36.

FIG. 37 illustrates a substrate supporting portion connecting mechanism 517 connecting the proximal end portion of the distal end side substrate supporting portion 511 pivotably to the elevating member 514. The substrate supporting portion connecting mechanism 517 connects the proximal end portion of the distal end side substrate supporting portion 511 to the elevating member 514 via a rotary spindle 518 so that, when an external force is applied to the distal end side substrate supporting portion 511, the distal end side substrate supporting portion 511 is pivoted in response to the external force.

The direction of a pivotal axis line of the pivoting operation of the distal end side substrate supporting portion 511 with respect to the end effector body 56, namely the axis line of the rotary spindle 518 is oriented in a direction orthogonal to the vertical direction. Thereby, the distal end side substrate supporting portion 511 is smoothly pivoted in response to an external force generated when the distal end side substrate supporting portion 511 collides with a structure around the same, when moving the end effector 503 in the advance direction from the proximal end side toward the distal end side of the end effector 503.

In addition, the substrate supporting portion connecting mechanism 517 has a resistance applying unit 519 for applying resistance to the pivoting operation of the distal end side substrate supporting portion 511 with respect to the end effector body 506. Specifically, by moderately fastening adjusting bolts 520 illustrated in FIG. 37, wedge effects of annular taper members 521 provided to the respective adjusting bolts 520 are generated. By the wedge effects, a moderate sliding resistance upon pivoting can be generated between the rotary spindle 518 of the distal end side substrate supporting portion 511 and the taper members 521. Thereby, the distal end side substrate supporting portion 511 can be prevented from being pivotally displaced unintentionally due to vibration or the like.

Note that a resistance applying unit for applying resistance to the pivoting operation of the distal end side substrate supporting portion 511 is not limited to the above-stated mechanism using the annular taper members 521, various mechanisms can be employed, such as a mechanism of applying resistance by pressing a ball plunger against the rotary spindle 518 of the distal end side substrate supporting portion 511 or a mechanism of applying resistance by a pivotal flange pivoting integrally with the rotary spindle 521 of the distal end side substrate supporting portion 511 and a fixed flange generating a frictional resistance between the pivotal flange and the same, for example.

Further, as illustrated in FIG. 36, the end effector 503 according to the embodiment comprises a displacement prohibiting unit 522 for prohibiting displacement of the distal end side substrate supporting portion 511 when an external force is applied to the distal end side substrate supporting portion 511 in the end effector 503 put in the small pitch state by the substrate supporting portion drive unit 516. The displacement prohibiting unit 522 has an abutting portion 523 consisting of a roller member on the distal end portion thereof.

Next, functions of the substrate supporting portion connecting mechanism 517 and the displacement prohibiting unit 522 will be described referring to FIG. 38A to FIG. 38E.

Figure 38A:
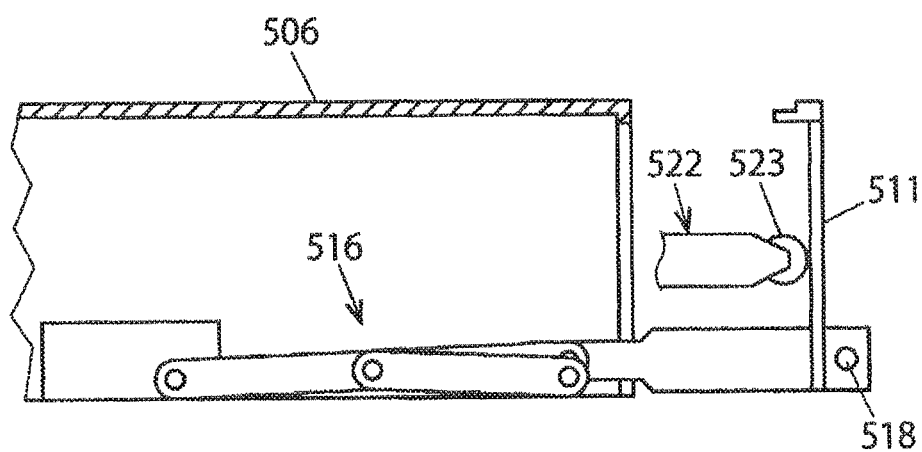
FIG. 38A is a partial cross section view illustrating an operation of the end effector in FIG. 36.

FIG. 38A illustrates the case when the end effector 503 is put in the small pitch state by the substrate supporting portion drive unit 516, and the abutting portion 523 of the displacement prohibiting unit 522 is abutted on the middle portion in the vertical direction of the distal end side substrate supporting portion 511 in the small pitch state. By restraining displacement of the distal end side substrate supporting portion 511 by the abutting portion 523 of the displacement prohibiting unit 522 in this way, the distal end side substrate supporting portion 511 can be surely prevented from being pivotally displaced unintentionally due to vibration or the like.

Figure 38B:
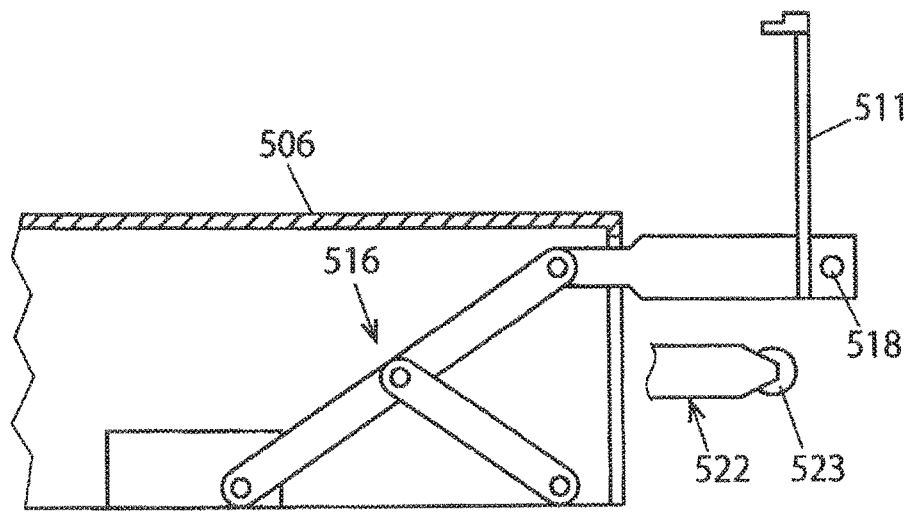
FIG. 38B is another partial cross section view illustrating an operation of the end effector in FIG. 36.

FIG. 38B illustrates the case when the end effector 503 is put in the large pitch state by the substrate supporting portion drive unit 516, and the abutting portion 523 of the displacement prohibiting unit 522 is out of the distal end side substrate supporting portion 511 in the large pitch state.

As above, the restricted state and the non-restricted state of displacement of the distal end side substrate supporting portion 511 by the displacement restricting unit 522 are switched therebetween according to a position of the distal end side substrate supporting portion 511 in the vertical direction (large pitch or small pitch).

Figure 38C:
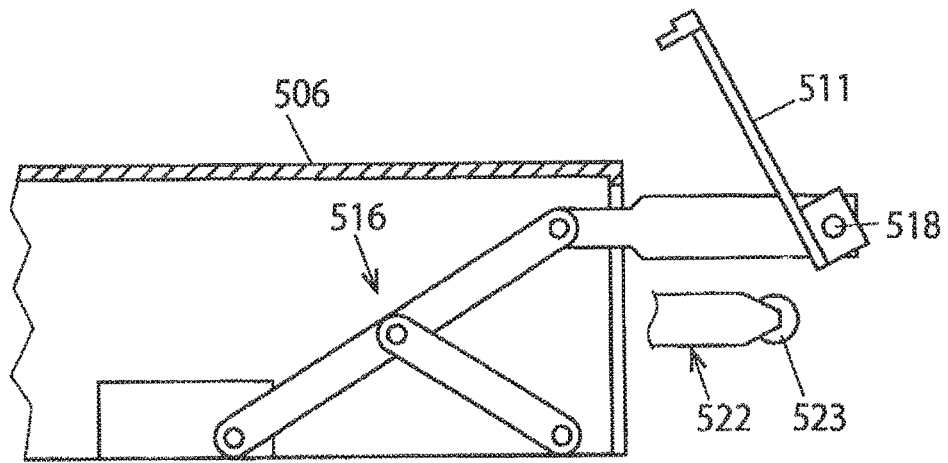
FIG. 38C is another partial cross section view illustrating an operation of the end effector in FIG. 36.

Additionally, in the large pitch state (FIG. 38B), when the distal end side substrate supporting portion 511 collides with a structure around the same and an external force works, the distal end side substrate supporting portion 511 is pivotally displaced about the rotary spindle 518 as the center as illustrated in FIG. 38C. Thereby, the distal end side substrate supporting portion 511 and the substrate supporting portion drive unit 516 coupled to the same can be prevented from being damaged by the external force working on the distal end side substrate supporting portion 511. Also, a damage of the structure around the distal end side substrate supporting portion 511 with which the distal end side substrate supporting portion 511 collides can also be prevented.

Note that, in the large pitch state illustrated in FIG. 38B, since resistance is applied to the pivoting operation of the distal end side substrate supporting portion 511 by the resistance applying unit 519 even when vibration or the like is added to the distal end side substrate supporting portion 511, the distal end side substrate supporting portion 511 is not pivotally displaced unintentionally.

Figure 38D:
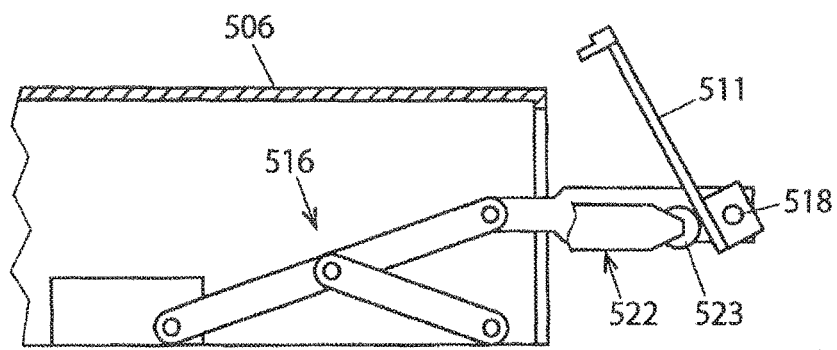
FIG. 38D is another partial cross section view illustrating an operation of the end effector in FIG. 36.
Figure 38E:
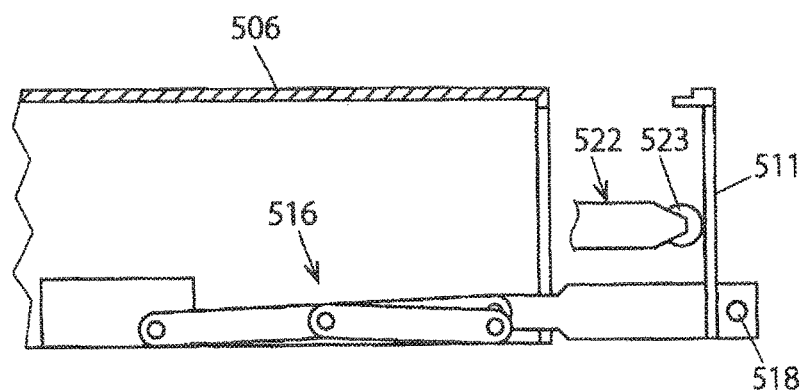
FIG. 38E is another partial cross section view illustrating an operation of the end effector in FIG. 36.

When converting the pitch of the end effector 503 from the large pitch state to the small pitch state by the substrate supporting portion drive unit 516 in the state that the distal end side substrate supporting portion 511 has been pivotally displaced by a collision as illustrated in FIG. 38C, the abutting portion 523 of the displacement prohibiting unit 522 abuts on the lowered distal end side substrate supporting portion 511 as illustrated in FIG. 38D. When the distal end side substrate supporting portion 511 is lowered further, the distal end side substrate supporting portion 511 is returned to the normal position (upright state) by the abutting portion 523 of the displacement prohibiting unit 522 as illustrated in FIG. 38E.

As stated above, the displacement prohibiting unit 522 surely prevents the distal end side substrate supporting portion 511 in the small pitch state from being pivotally displaced unintentionally and also can return the distal end side substrate supporting portion 511 pivotally displaced due to the collision in the large pitch state to the normal position automatically when converting the pitch (from large pitch to small pitch) of the end effector 503.

Next, the displacement prohibiting unit 522 of the end effector 503 according to another embodiment of the third reference example of the present invention will be described referring to FIG. 39A to FIG. 39C. Note that the same numerals are allocated to the same members as in the embodiments above so as to omit explanation.

In the embodiment, the displacement prohibiting unit 522 comprises a plunger mechanism (abutting portion drive unit) 524, and an abutting portion 523 consisting of a roller member is provided to the distal end of a plunger 524*a* of the plunger mechanism 524. The plunger mechanism 524 can be configured by an air cylinder, for example.

The plunger mechanism 524 is configured to move the abutting portion between a reaching position capable of reaching the distal end side substrate supporting portion 511 in a non-displaced position and a separate position separated from the distal end side substrate supporting portion 511 in the non-displaced position.

Figure 39A:
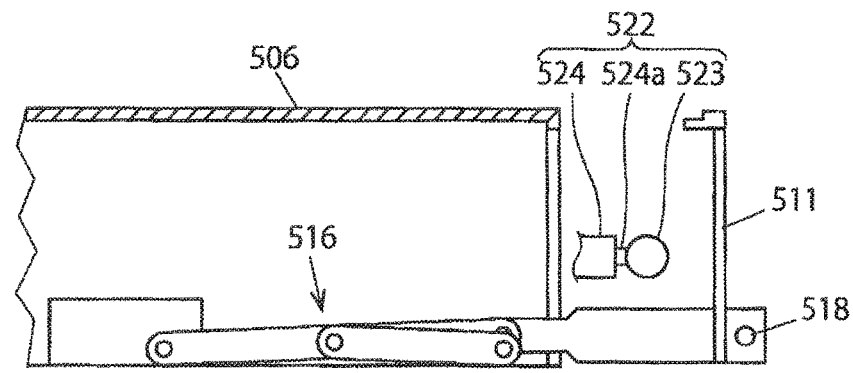
FIG. 39A is an enlarged partial cross section view illustrating a distal end portion of the end effector according to another embodiment of the third reference example of the present invention.
Figure 39B:
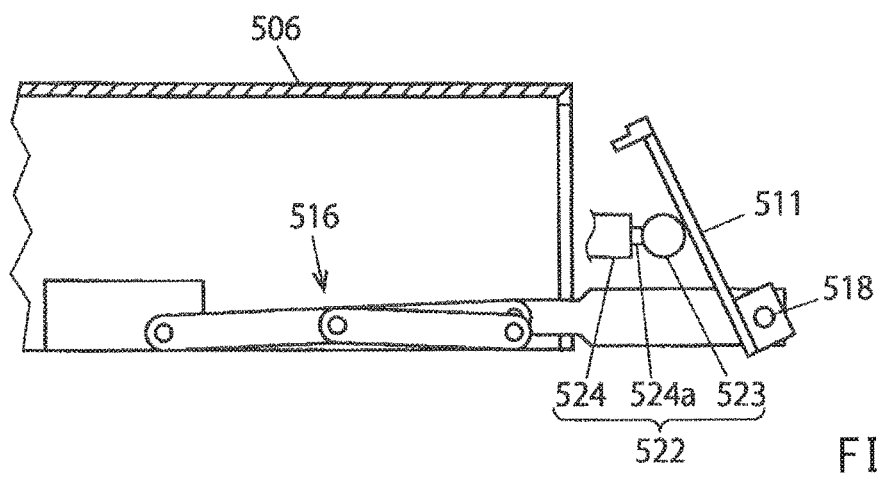
FIG. 39B is a partial cross section view illustrating an operation of the end effector in FIG. 39A.

Thus, the displacement prohibiting unit 522 in the embodiment comprises the abutting portion 523 capable of advancing and retreating with respect to the distal end side substrate supporting portion 511 in the small pitch state, and the distal end side substrate supporting portion 511 is pivotally displaced freely by putting the abutting portion 523 in the separate position as illustrated in FIG. 39A. When the distal end side substrate supporting portion 511 collides with the structure around the same and the external force is applied in this state, the distal end side substrate supporting portion 511 is pivotally displaced as illustrated in FIG. 39B.

Thereby, even in the end effector 503 in the small pitch state, the distal end side substrate supporting portion 511 and the substrate supporting portion drive unit 516 coupled to the same can be prevented from being damaged by the external force working on the distal end side substrate supporting portion 511, and also a damage of the structure around the distal end side substrate supporting portion 511 with which the same portion 511 collides can also be prevented.

Figure 39C:
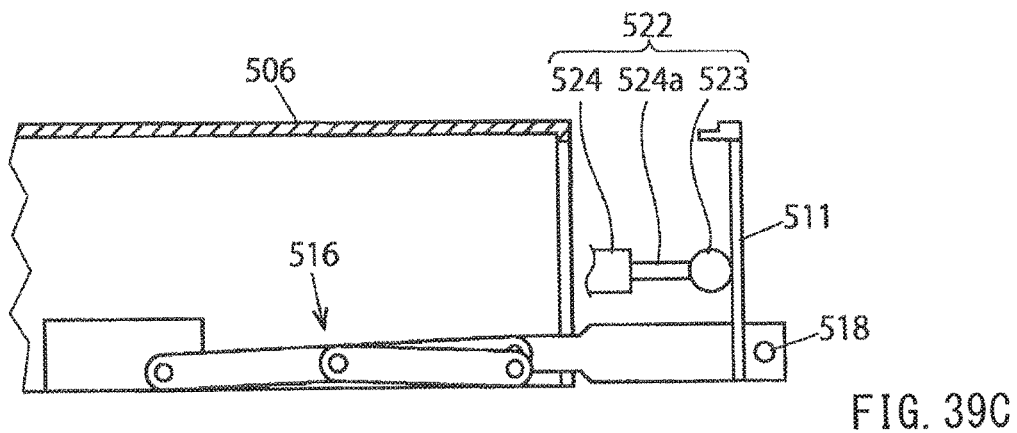
FIG. 39C is another partial cross section view illustrating an operation of the end effector in FIG. 39A.

When returning the distal end side substrate supporting portion 511 pivotally displaced by the collision to the normal position, the plunger 524a is advanced so as to move the abutting portion 523 to the reaching position and the abutting portion 523 presses the distal end side substrate supporting portion 511 so as to return the same to the normal position, as illustrated in FIG. 39C.

A retreating operation of the plunger 524a is performed before executing a robot operation expecting the collision of the structure around the distal end side substrate supporting portion 511 with the same. In contrast, in a situation where a collision countermeasure is not necessary, the plunger 524a is advanced and the abutting portion 523 is abutted on the distal end side substrate supporting portion 511 so that the distal end side substrate supporting portion 511 can be surely prevented from being pivotally displaced unintentionally due to vibration or the like.

In addition, when the distal end side substrate supporting portion 511 is displaced due to the collision in the large pitch state, the distal end side substrate supporting portion 511 can be returned to the normal position automatically like the first embodiment illustrated in FIG. 38C to FIG. 38E by converting the large pitch state to the small pitch state in the state that the plunger 524a is advanced.

Alternatively, the pivotally displaced distal end side substrate supporting portion 511 can be returned to the normal position by advancing the plunger 524a after conversion to the small pitch state so as to press the pivotally displaced distal end side substrate supporting portion 511.

Further, in the end effector 503 according to each embodiment above, a displacement detecting unit for detecting displacement of the distal end side substrate supporting portion 511 due to the external force can be provided.

Figure 40:
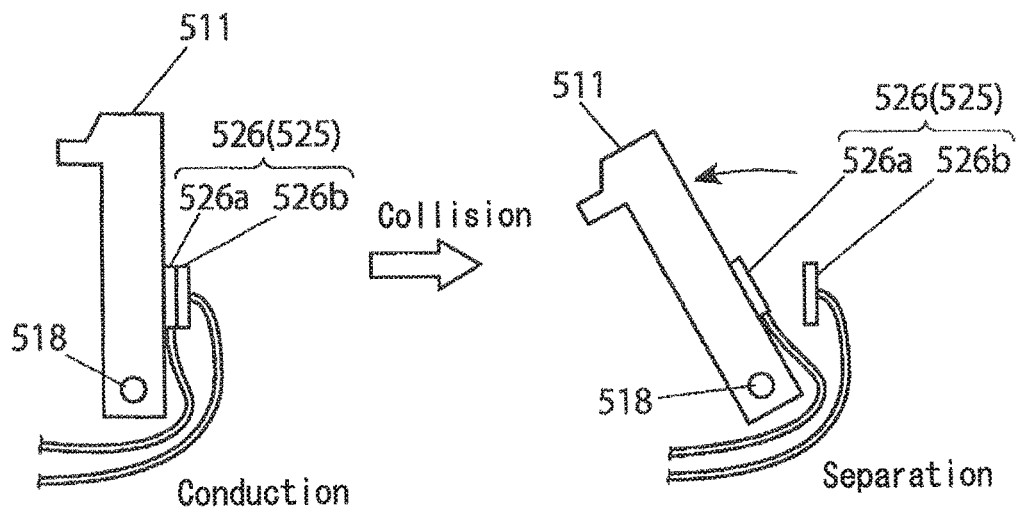
FIG. 40 is a schematic view illustrating an example of the displacement detecting unit in each embodiment of the third reference example of the present invention.

For example, as illustrated in FIG. 40, one terminal 526a of a conduction detecting switch 526 is mounted on the distal end side substrate supporting portion 511 and the other terminal 526b is fixingly provided on the side of the end effector body 506.

The terminals 526a, 526b of the conduction detecting switch 525 are connected to each other and in a conducting state when the distal end side substrate supporting portion 511 is in the normal position, and both the terminals 526a, 526b are separated and in a disconnected state when the distal end side substrate supporting portion 511 is pivotally displaced due to the collision. Thereby, a pivotal displacement of the distal end side substrate supporting portion 511 can be detected.

Figure 41:
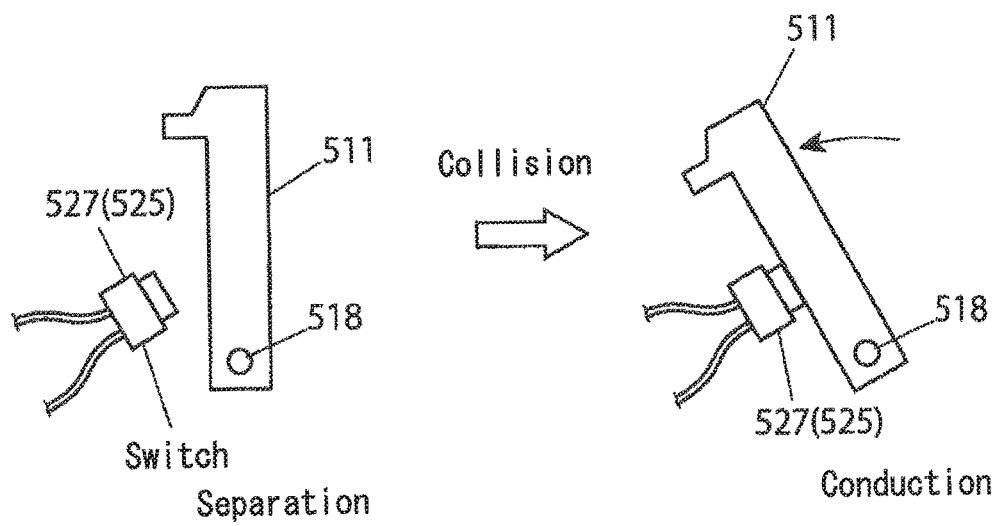
FIG. 41 is a schematic view illustrating another example of the displacement detecting unit in each embodiment of the third reference example of the present invention.

Also, as illustrated in FIG. 41, a push type switch 527 may be provided fixingly on the side of the end effector body 506 in the pivotal displacement direction of the distal end side substrate supporting portion 511 and the switch 527 may be pressed by the pivotally displaced distal end side substrate supporting portion 511 so that the switch 527 in the disconnected state is switched to the conducting state.

Figure 42:
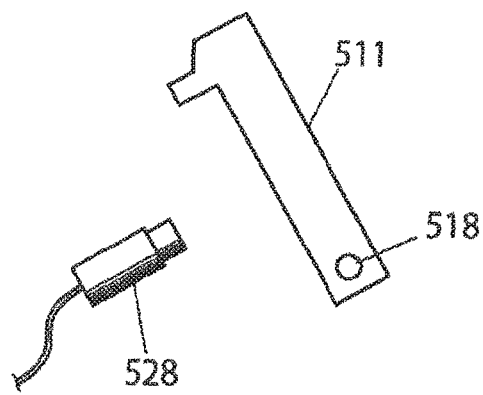
FIG. 42 is a schematic view illustrating still another example of the displacement detecting unit in each embodiment of the third reference example of the present invention.

Also, as illustrated in FIG. 42, a reflection type optical distance sensor 528 may be installed fixingly on the side of the end effector body 506 so that the reflection type optical distance sensor 528 detects the distance to the distal end side substrate supporting portion 511. When the distal end side substrate supporting portion 511 is pivotally displaced due to the collision, a detected distance by the reflection type optical distance sensor 528 is changed, and thereby a pivotal displacement of the distal end side substrate supporting portion 511 can be detected.

By the end effector 503 according to each embodiment above, when the distal end side substrate supporting portion 511 collides with the structure around the same in robot operation, only the distal end side substrate supporting portion 511 whose mass is relatively small is displaced, not the whole end effector 503. Therefore, impact force in collision can be relieved with high sensitivity.

Also, deformation in collision does not occur in the entire end effector 503 and occurs only in the distal end side substrate supporting portion 511. Therefore, component replacement is easy and also cost is reduced even when component replacement is needed.

In addition, by the end effector 503 according to each embodiment above, by comprising the displacement prohibiting unit 522, unintentional displacement of the distal end side substrate supporting portion 511 can be surely prevented and also the distal end side substrate supporting portion 511 displaced due to the collision can be returned to the normal position.

Next, a batch conveying type hand as an embodiment of the end effector according to the present invention will be described referring to the figures.

Figure 43:
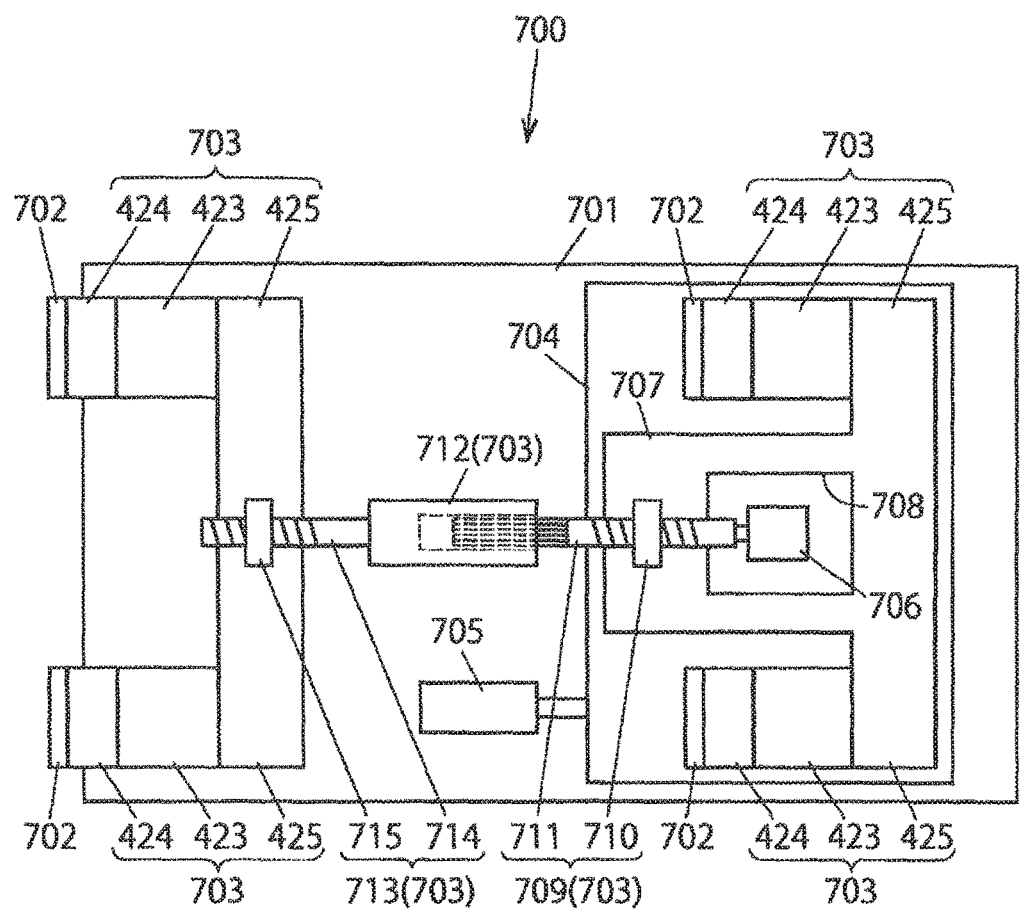
FIG. 43 is a schematic plan view illustrating the batch conveying type hand according to an embodiment of the present invention so that the inside of the hand base portion can be seen.

FIG. 43 is a schematic plan view visibly illustrating the inside of a hand base portion 701 of a batch conveying type hand 700 according to the embodiment. The batch conveying type hand 700 comprises a protrusion amount change unit 703 for changing a protrusion amount of a substrate holding unit 702 from the reference surface (surface corresponding to the opposed surface 32 in FIG. 1A) including the surface of the hand base portion 701 opposed to the lowermost substrate of a plurality of substrates stored in a substrate storing portion such as FOUP.

The substrate holding unit 702 corresponds to the holding portions 4A, 4B of the embodiment illustrated in FIG. 1A, for example, and also corresponds to the substrate holding unit 412 of the embodiment illustrated in FIG. 16 and FIG. 17 or corresponds to the substrate supporting portions 511, 512 illustrated in FIG. 34.

By changing the protrusion amount of the substrate holding unit 702 by the protrusion amount change unit 703, a vertical pitch of substrates held by the substrate holding unit 702 changes. The protrusion amount change unit 703 can be configured by various link mechanisms in the various embodiments above or the like, for example, it can be configured including the elevating link mechanism 423, the elevating member 424, and the slider 425 illustrated in FIG. 21A and FIG. 21B.

The left and right elevating link mechanisms 423 on the hand distal end side are respectively connected to the left and right end portions of the single slider 425 provided so as to move forward and rearward with respect to the hand base portion 701. The left and right elevating link mechanisms 423 on the hand proximal end side are connected to each of the left and right end portions of another single slider 425. Another single slider 425 is provided on a slide plate 704 which is provided so as to move forward and rearward with respect to the hand base portion 701 so as to move forward and rearward with respect to the slide plate 704. The distal end of a piston of an air cylinder 705 is connected to the slide plate 704, and the slide plate 704 can be moved forward and rearward with respect to the hand base portion 701 by driving the air cylinder 705 so as to operate the piston advancingly and retreatingly.

A servo motor 706 is provided in the center portion of the slide plate 704 and the servo motor 706 moves forward and rearward integrally with the slide plate 704. A front protrusion portion 707 protruding toward the hand distal end side is formed integrally with the slider 425 arranged on the slide plate 704 so as to move forward and rearward, and the servo motor 706 is arranged in an opening 708 formed in the center of the front protrusion portion 707 of the slider 425. The opening 708 in the center of the front protrusion portion 708 is formed at a dimension such that an edge portion of the opening 708 does not come into contact with the servo motor 706 even when the slide plate 704 is moved forward and rearward with respect to the hand base portion 701.

A nut 710 of a ball screw 709 on the hand proximal end side is fixed to the front protrusion portion 707 formed integrally with the slider 425. A rear end portion of a screw shaft 711 of the ball screw 709 is connected to an output shaft of the servo motor 706. A rear end portion of a screw shaft 714 of a ball screw 713 on the hand distal end side is connected to the front part of the ball screw 709 via a ball spline 712. A nut 715 of the ball screw 713 on the hand distal end side is fixed to the center portion of the slider 425 on the hand distal end side.

The servo motor 706, the ball screws 709, 713, and the ball spline 712 configure the protrusion amount change unit 703 along with the elevating link mechanism 423, the elevating member 424, and the slider 425.

Figure 44:
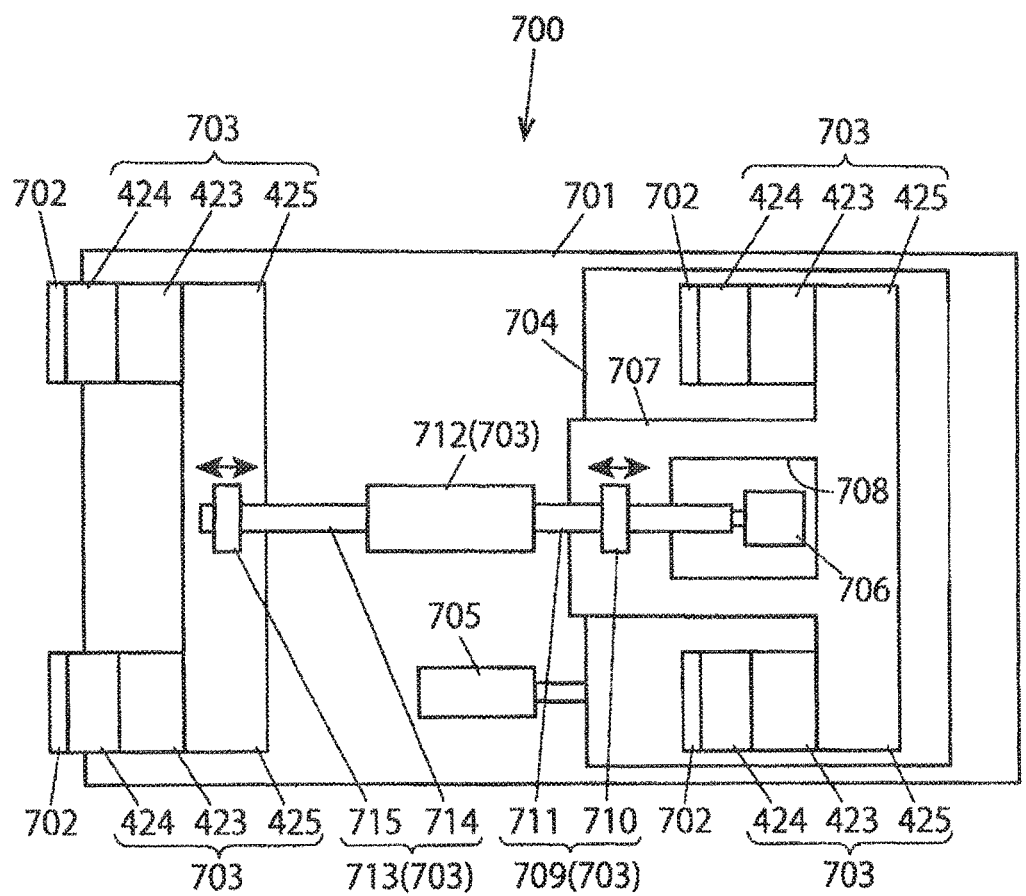
FIG. 44 is a schematic plan view illustrating a vertical pitch converting operation of the batch conveying type hand in FIG. 43.

The servo motor 706 configures a single drive source applying drive force to the entire substrate holding unit 702. Namely, as illustrated in FIG. 44, when the servo motor 706 is driven so as to rotate its output shaft, the ball screw 713 on the hand distal end side and the ball screw 709 on the hand proximal end side are driven integrally. Thereby, the slider 452 on the hand distal end side moves forward and rearward integrally with the nut 715 on the hand distal end side, and the slider 425 on the hand proximal end side moves forward and rearward integrally with the nut 710 on the hand proximal end side at the same time. Therefore, all of the four sets of substrate holding unit 702 in total of a left set and a right set of substrate holding unit 702 on the hand distal end side and a left set and a right set of substrate holding unit 702 on the hand proximal end side are driven by the servo motor 706 as a single drive source.

As above, in the batch conveying type hand 700 according to the embodiment, drive force can be applied to the entire substrate holding unit 702 by the servo motor 706 as a single drive source, and therefore a vertical pitch of a plurality of substrates can be converted equally. Thereby, when converting the pitch in the state that the plurality of substrates are held by the batch conveying type hand 700, the substrates can be surely prevented from being inclined.

Figure 45:
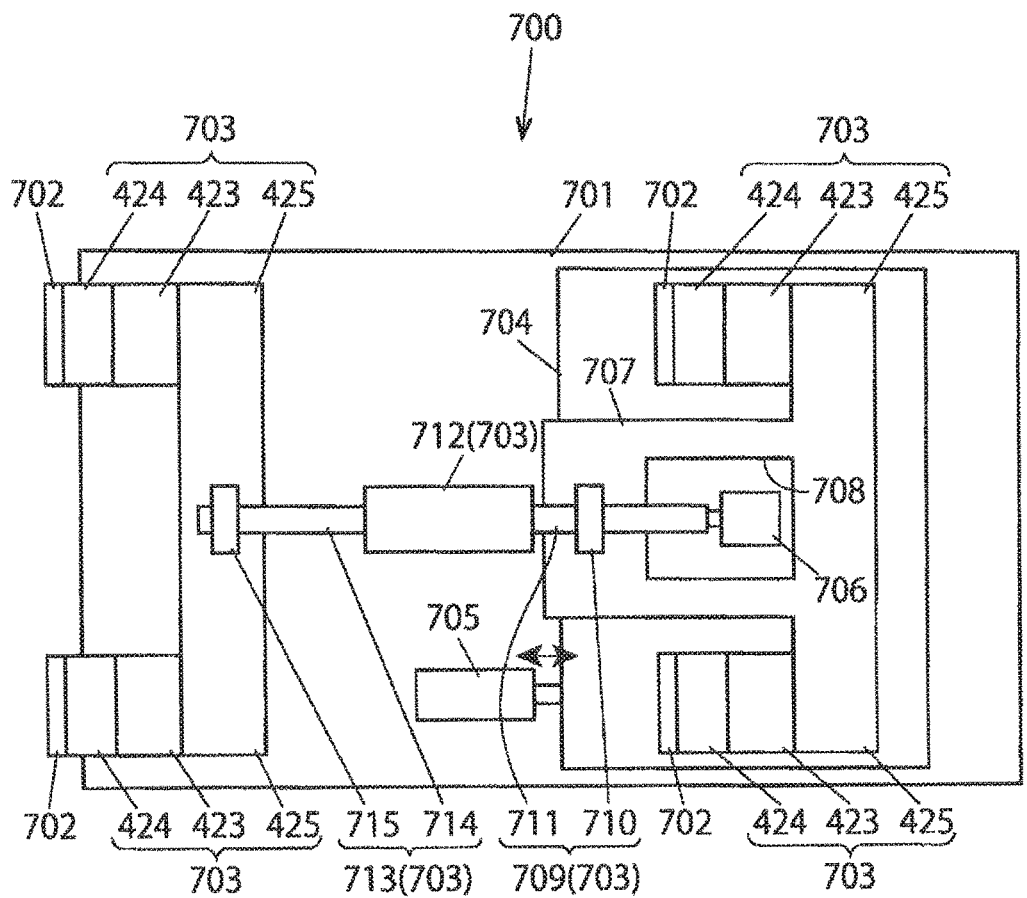
FIG. 45 is a schematic plan view illustrating a substrate pinching operation of the batch carrying type hand in FIG. 43.

When pinching the substrates by the batch conveying type hand 700 according to the embodiment, the air cylinder 705 is driven so as to retract its piston as illustrated in FIG. 45, thereby moving the slide plate 704 forward. Thereby, the left and right sets of substrate holding unit 702 on the hand proximal end side moves forward integrally with the slide plate 704. At this time, since the ball spline 712 is provided between the screw shaft 711 on the hand proximal end side and the screw shaft 714 on the hand distal end side, a forward drive force is not transmitted to the screw shaft 714 on the hand distal end side even when the screw shaft 711 on the hand proximal end side moves forward in accordance with the forward movement of the slide plate 704 and the servo motor 706.

Next, another embodiment of the batch conveying type hand 800 above will be described referring to FIG. 46.

Figure 46:
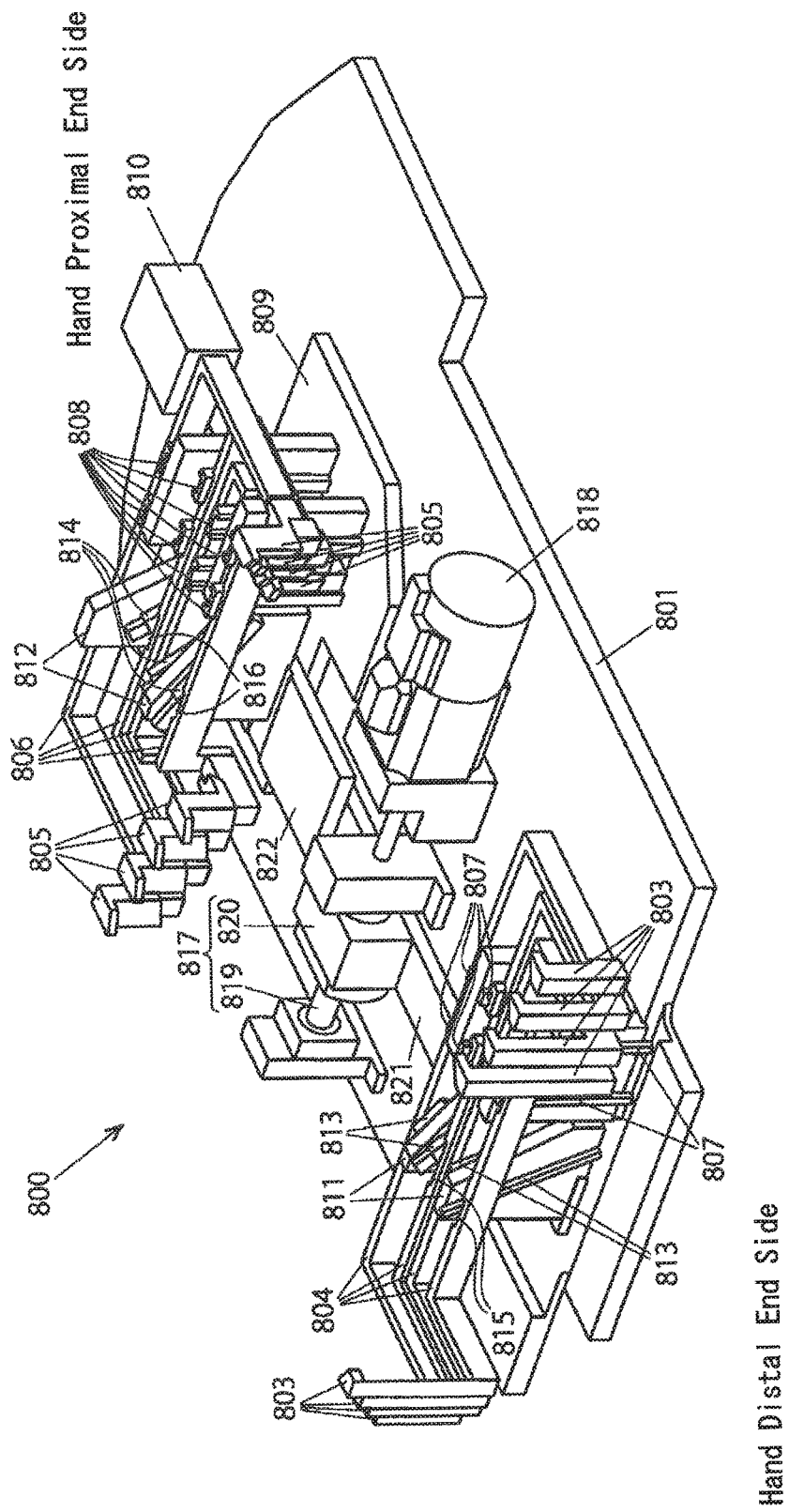
FIG. 46 is a schematic perspective view illustrating the batch carrying type hand according to another embodiment of the present invention so that the inside of the hand base portion can be seen.

As illustrated in FIG. 46, in the batch conveying type hand 800, left and right sets of distal end side substrate supporting portions 803 of a hand base portion 801 are coupled to each other by four distal end side coupling members 806. Similarly, left and right sets of proximal end side substrate supporting portions 805 of the hand base portion 801 are coupled to each other by four proximal end side coupling members 806.

Each of the distal end side coupling members 804 and the proximal end side coupling members 806 is a substantially U-shaped member extending in the horizontal direction and configured so that its horizontal movement is guided by a distal end side vertical guide member 807 and a proximal end side vertical guide member 808. Since the distal end side substrate supporting portions 803 are connected to the distal end side coupling members 804 and the proximal end side substrate supporting portions 805 are connected to the proximal end side coupling members 806, the distal end side and proximal end side substrate supporting portions 803, 805 are elevated according to the elevating movement of the distal end side and proximal end side coupling members 804, 806.

The distal end side vertical guide members 803 are provided fixingly to the hand base portion 801. In contrast, the proximal end side vertical guide members 808 are provided fixingly to a slide plate 809 capable of moving in the forward and rearward direction with respect to the hand base portion 801.

A piston of an air cylinder 810 provided to the hand base portion 801 is connected to the slide plate 809. By driving the air cylinder 810 so as to advance and retreat its piston, the slide plate 809 moves forward and rearward. Since the proximal end side vertical guide members 808 are fixed to the slide plate 809 and the proximal end side substrate supporting portions 805 are supported by the proximal end side vertical guide members 808 so as to be elevated, a substrate pinching operation according to the advance operation of the proximal end side substrate supporting portion 805 can be realized by moving the slide plate 809 forward and rearward.

An elevating drive force to the distal end side coupling member 804 is applied via a distal end side drive member 811 provided movably in the left and right direction with respect to the hand base portion 801. An elevating drive force to the proximal end side coupling member 806 is applied via a proximal end side drive member 812 provided movably in the left and right direction with respect to the slide plate 809.

The distal end side drive member 811 has four distal end side inclined guide rails 813 corresponding to the four distal end side coupling members 804. Similarly, the proximal end side drive member 812 has four proximal end side inclined guide rails 814 corresponding to the four proximal end side coupling members 806. Each of the distal end side inclined guide rails 813 and the proximal end side inclined guide rails 814 is fitted slidably in a distal end side inclined groove 815 and a proximal end side inclined groove 816 formed in each of the distal end side coupling members 804 and the proximal end side coupling members 806.

Each of the distal end side inclined guide rails 813 and the proximal end side inclined guide rails 814 is inclined with respect to the vertical direction. Therefore, the distal end side and proximal end side coupling members 804, 806 can be driven so as to be elevated along the distal end side and proximal end side inclined guide rails 813, 814 by moving the distal end side and proximal end side drive members 811, 812 in the left and right direction.

The four distal end side inclined guide rails 813 have their respective different inclination angles with respect to the vertical direction. Similarly, the four proximal end side inclined guide rails 814 have their respective different inclination angle with respect to the vertical direction. The larger the inclination angle of the distal end side and proximal end side inclined guide rails 813, 814 with respect to the vertical direction, the smaller the distance of the elevating operation of the distal end side and proximal end side substrate supporting portions 803, 805. In the distal end side and proximal end side substrate supporting portions 803, 805 supporting the same substrate, the inclination angles of the distal end side and proximal end side inclined guide rails 813, 814 with respect to the vertical direction are set to the same. Thereby, the distal end side and proximal end side substrate supporting portions 803, 805 supporting the same substrate are always maintained at the same height during the pitch converting operation. Therefore, when the pitch is converted in the state that a substrate is held, the substrate can be surely prevented from being inclined during the pitch converting operation.

A ball screw 817 is provided to the hand base portion 801 so as to extend in the left and right direction. A servo motor 818 adjacent to the ball screw 817 is provided to the hand base portion 801, and an output shaft of the servo motor 818 is connected to one end of a screw shaft 819 of the ball screw 817. A nut 820 of the ball screw 817 is fixed to the middle of a forward and rearward direction elongated member 821 provided so as to move in the left and right direction with respect to the hand base portion 801.

The distal end side drive member 811 is fixed to the front end portion of the forward and rearward direction elongated member 821. A slide piece 822 is provided to the rear end portion of the forward and rearward direction elongated member 821 so as to slide in the forward and rearward direction with respect to the forward and rearward direction elongated member 821. Moreover, the slide piece 822 is provided so as to slide in the left and right direction with respect to the slide plate 809, and the proximal end side drive member 812 is fixed on the upper surface of the slide piece 822.

The servo motor 818 configures a single drive source applying drive force to the entire substrate holding unit including the distal end side and proximal end side substrate supporting portions 803, 805. Namely, when driving the servo motor 818 so as to rotate the screw shaft 819 of the ball screw 817, the nut 820 of the ball screw 817 moves in the left and right direction. Thereby, all of the distal end side and proximal end side drive members 811, 812 move in the left and right direction simultaneously and the distal end side and proximal end side coupling members 804, 806 are driven so as to be elevated along the distal end side and proximal end side inclined guide rails 813, 814. Therefore, all of the left and right sets of the distal end side substrate supporting portions 803 and the left and right sets of the proximal end side substrate supporting portions 805, namely the four sets of the substrate supporting portions 803, 805 in total are driven by the servo motor 818 as a single drive source.

As above, in the batch conveying type hand 800 according to the embodiment, drive force can be applied to the entire substrate holding unit including the distal end side and proximal end side substrate supporting portions 803, 805 by the servo motor 818 as a single drive source, and therefore a vertical pitch of a plurality of substrates can be converted equally. Thereby, when the pitch is converted in the state that the plurality of substrates are held by the batch conveying type hand 800, the substrates can surely be prevented from being inclined.

Hereunder, an embodiment using a so called double feed mechanism (double stroke mechanism, double speed mechanism) for a pitch converting mechanism of a substrate holding unit will be described.

Figure 47:
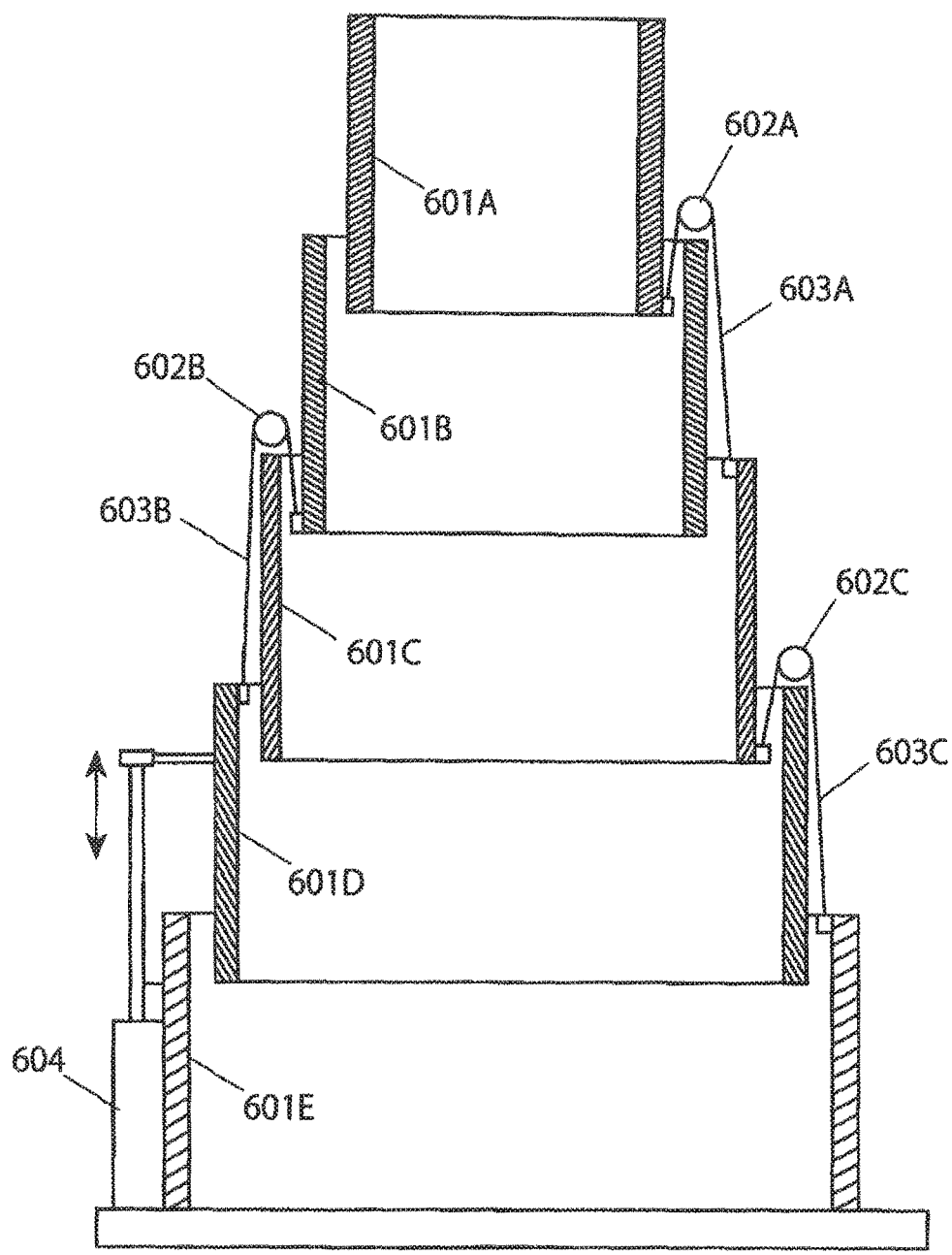
FIG. 47 is a schematic cross section view illustrating another example of the pitch converting mechanism of the substrate holding unit of the batch carrying type hand.

FIG. 47 illustrates another example of the pitch converting mechanism of the substrate holding unit described above. In this example, five cylindrical members 601A, 601B, 601C, 601D, 601E have a nest (telescopic) structure. Pulleys 602A, 602B, 602C are provided to the upper ends of the cylindrical members 601B, 601C, 601D which are second, third, fourth from the inside, respectively. Belts (flexible members) 603A, 603B, 603C are stretched on the respective pulleys 602A, 602B, 602C. The belts 603A, 603B, 603C connect the respective pairs of cylindrical members sandwiching therebetween the corresponding cylindrical members 601B, 601C, 601D to which the respective pulleys 602A, 602B, 602C are provided.

The second cylindrical member 601D from the outside is driven upward by a drive source 604 such as an air cylinder. Thereby, the pulley 602C of the second cylindrical member 601D from the outside is lifted and the third cylindrical member 601C from the outside is pulled up via the belt 603C. When the third cylindrical member 601C from the outside is pulled up, the pulley 602B provided thereto is lifted and the fourth cylindrical member 601B from the outside is pulled up via the belt 603B. Similarly, the pulley 602A of the fourth cylindrical member 601B from the outside is lifted and the innermost cylindrical member 601A is pulled up via the belt 603A.

The cylindrical members 601A, 601B, 601C, 601D, 601E are provided with their respective substrate holding portions (substrate holding portions 20 illustrated in FIG. 20A and FIG. 20B, for example), and the substrate holding portions 20 are elevatingly operated integrally with the respective cylindrical members 601A, 601B, 601C, 601D, 601E. Thereby a pitch is converted.

Figure 48A:
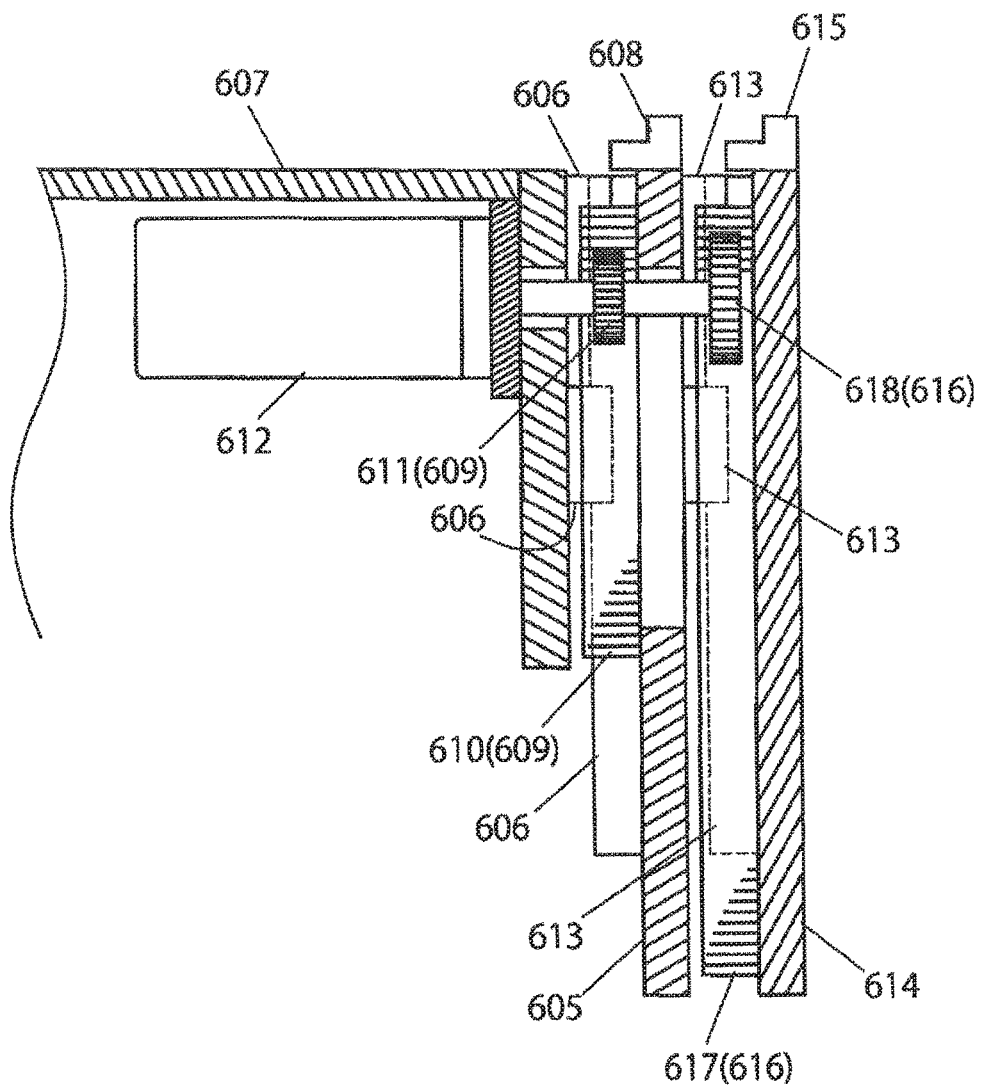
FIG. 48A is a schematic partial cross section view illustrating another example of the pitch converting mechanism of the substrate holding unit of the batch carrying type hand.
Figure 48B:
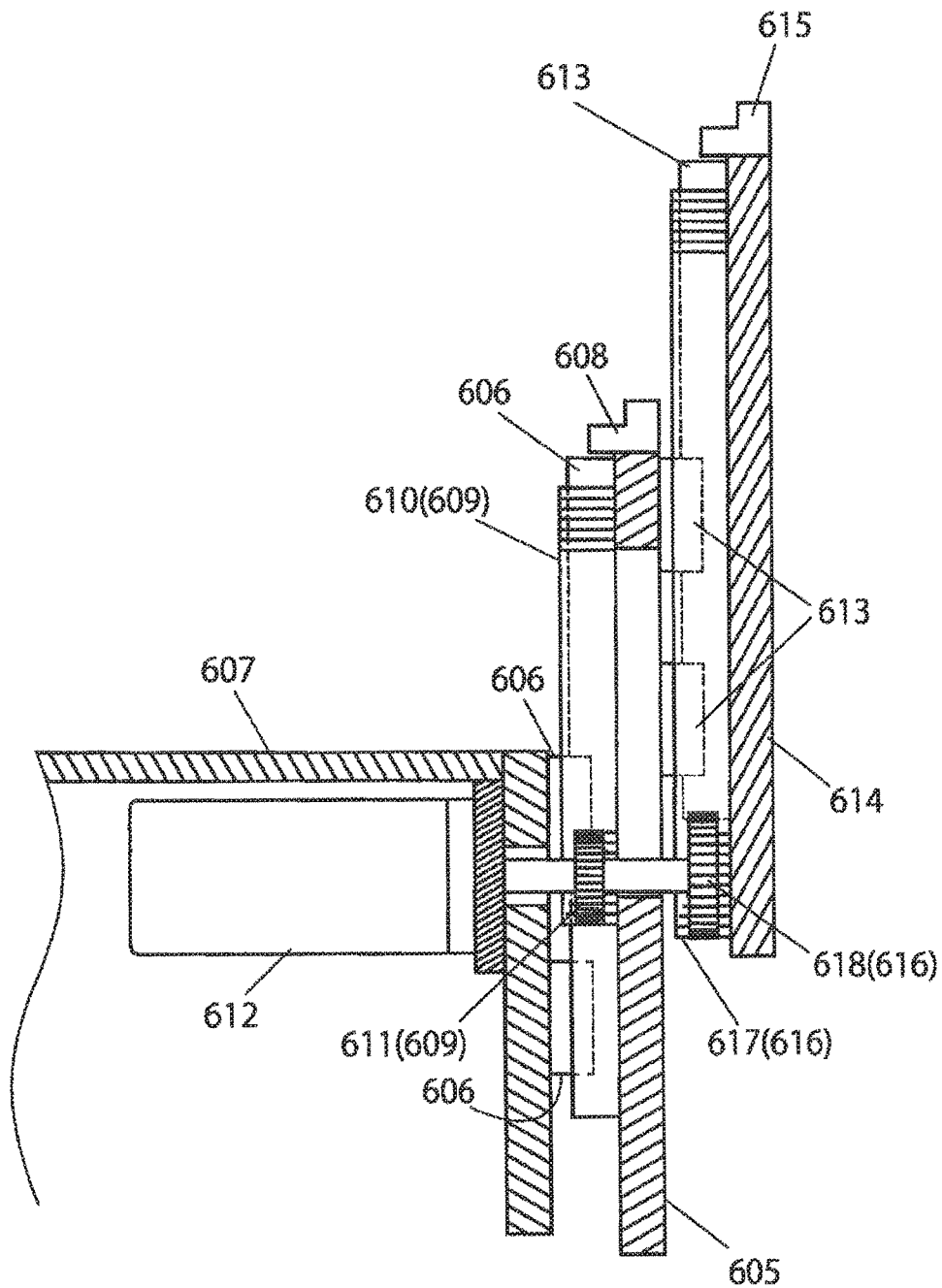
FIG. 48B is a schematic partial cross section view illustrating an operation of the pitch converting mechanism in FIG. 48A.

FIG. 48A and FIG. 48B illustrates another example of the pitch converting mechanism of the substrate holding unit described above. In this example, a first elevating member 605 is provided so as to move vertically with respect to a hand base portion 607 via a first vertical direction linear guide 606, and a first substrate supporting portion 608 is provided on the upper end of the first elevating member 605. A rack 610 of a first rack and pinion 609 is provided to the first elevating member 605, and a pinion 610 of the first rack and pinion 609 is fixed to an output shaft of a servo motor 612 provided to the hand base portion 607.

A second elevating member 614 is provided on the outer side of the first elevating member 605 via a second vertical direction linear guide 613, and a second substrate supporting portion 615 is provided on the upper end of the second elevating member 614. A rack 617 of a second rack and pinion 616 is provided to the second elevating member 614, and a pinion 618 of the second rack and pinion 616 is fixed to the output shaft of the servo motor 612 provided to the hand base portion 607.

Similarly, a third elevating member is provided on the outer side of the second elevating member, and a fourth elevating member is provided on the outer side of the third elevating member. A third substrate supporting portion is provided on the upper end of the third elevating member, and a fourth substrate supporting portion is provided on the upper end of the fourth elevating member, which are not illustrated.

The pinion 618 of the second rack and pinion 616 has the diameter larger (larger number of teeth) than the pinion 611 of the first rack and pinion 609. A pinion of the third rack and pinion has the diameter larger (larger number of teeth) than the pinion 618 of the second rack and pinion 616. A pinion of the fourth rack and pinion has the diameter larger (larger number of teeth) than the pinion of the third rack and pinion.

When rotating the output shaft of the servo motor 612 from the state illustrated in FIG. 48A, the respective elevating members 605, 614 are lifted as illustrated in FIG. 48B. Here, as the diameters (numbers of teeth) of the pinions of the racks and pinions differ from one elevating member to another, lifting speeds differ from one elevating member to another. Therefore, the elevating members 605, 614 and the substrate supporting portions 608, 615 on the upper ends thereof can be arranged at their respective different heights, as illustrated in FIG. 48B.

Figure 49:
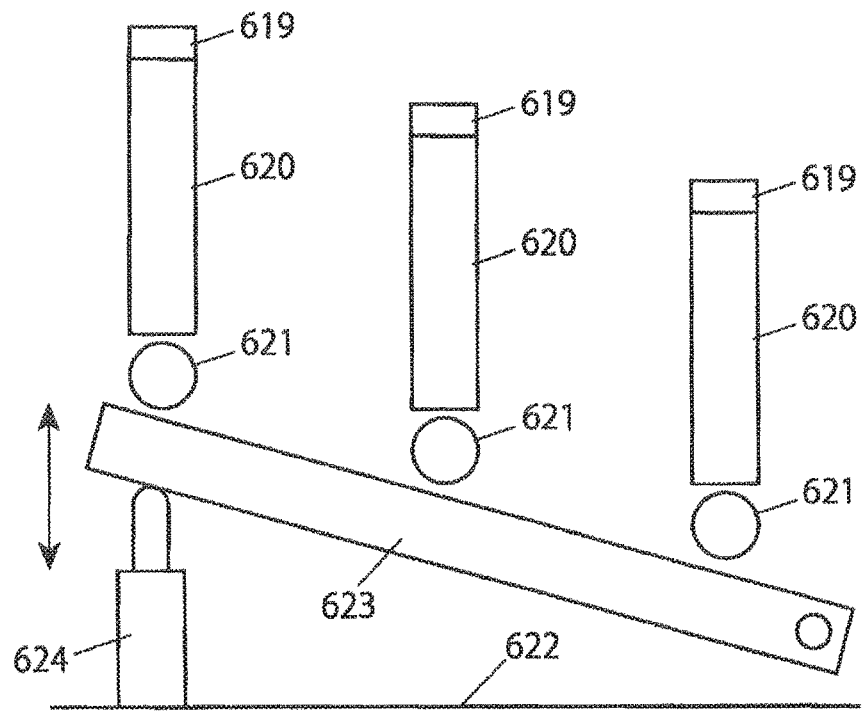
FIG. 49 is a schematic view illustrating another example of the pitch converting mechanism of the substrate holding unit of the batch conveying type hand.

FIG. 49 illustrates another example of the pitch converting mechanism of the substrate holding unit described above. In this example, a roller 621 is provided on the lower end of each elevating member 620 having a substrate supporting portion 619 on the upper end thereof. Each elevating member 620 is supported so as to move in the vertical direction by a linear guide (not illustrated).

One end of a rocking drive member 623 is connected pivotably to a hand base portion 622, and thereby the rocking drive member 623 can rock with respect to the hand base portion 622. Each roller 621 of each elevating member 620 is abutted on the upper surface of the rocking drive member 623 so as to roll. By driving a free end side of the rocking drive member 623 by a drive source 624 such as an air cylinder so as to change an inclination angle of the rocking drive member 623, the elevating members 620 and the substrate supporting portions 619 on the upper ends thereof can be arranged at their respective different heights.

Figure 50:
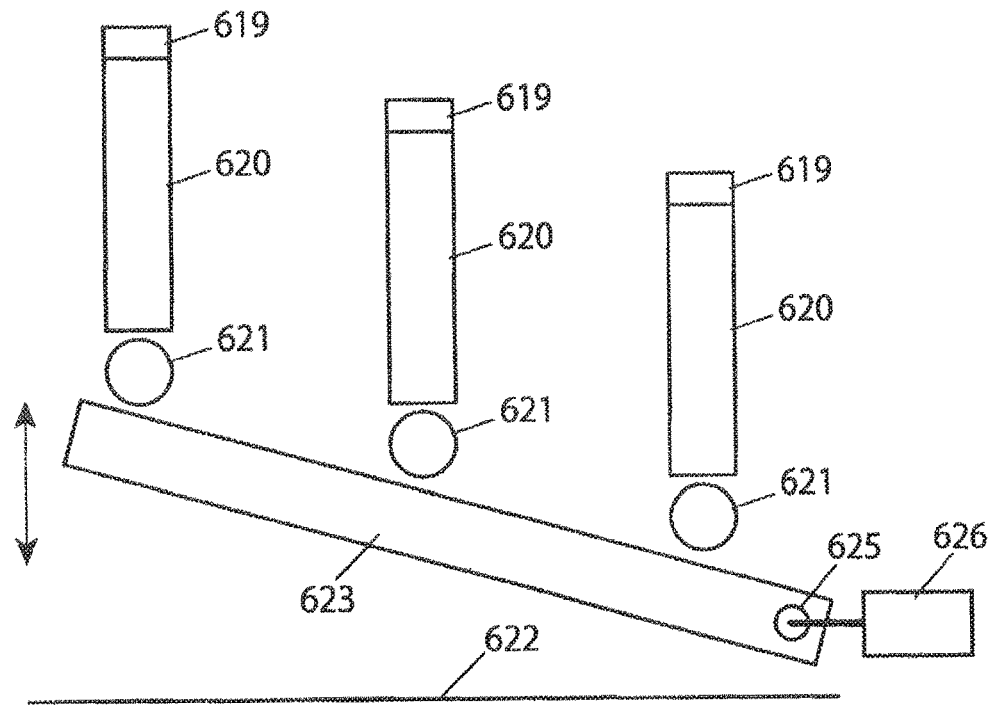
FIG. 50 is a schematic view illustrating another example of the pitch converting mechanism of the substrate holding unit of the batch conveying type hand.
Figure 51:
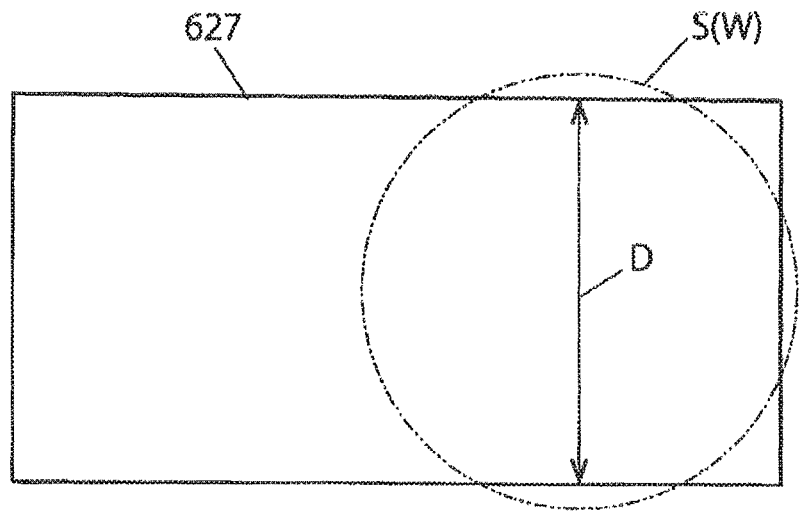
FIG. 51 is a schematic plan view illustrating the dimension of the batch carrying type hand according to another embodiment of the present invention.

Also, as illustrated in FIG. 50, the inclination angle of the rocking drive member 623 may be changed by rotationally driving a rotary shaft 625 provided on the proximal end side of the rocking drive member 623 by a servo motor 626.

Also as another variation of another pitch converting mechanism, an air cylinder may be provided for each elevating member so that each air cylinder drives each elevating member individually.

Also as a variation of each embodiment described above, at least a part of a hand base portion 627 advancing below the lowermost substrate or above the uppermost substrate may be set smaller than 300 m in a width D in its left and right direction.

Figure 52:
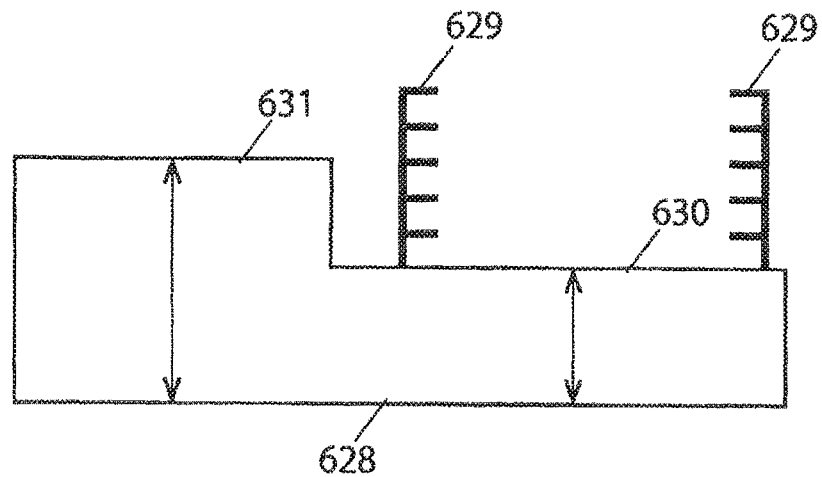
FIG. 52 is a schematic side view illustrating the form of the batch carrying type hand according to another embodiment of the present invention.

Also as illustrated in FIG. 52, a hand base portion 628 has a front part 630 to which a substrate holding unit 629 is arranged and a rear part 631 formed integrally with the front part 630, and the thickness of the rear part 631 in the vertical direction may be larger than the front part 630. A drive source (such as servo motor, air cylinder) of the substrate holding unit or the like can be arranged inside the rear part 631 with large thickness. Also, downward warping of the hand base portion 628 can be lessened by doing so.

Also as another variation, heights of a plurality of substrate supporting portions may be the same or may not be the same in the state that a protrusion amount of a substrate holding unit is made minimum by a protrusion amount change unit.

Also as another variation, change of protrusion amount of a substrate holding unit may be switched between predetermined two values. For example, the first protrusion amount can be a value corresponding to the vertical pitch 6 mm, and the second protrusion amount can be a value corresponding to the vertical pitch 10 mm.

Also as another variation, all of a plurality of substrate supporting portions may not protrude from the reference surface (surface corresponding to the opposed surface 32 in FIG. 1A) of a hand base portion, or at least a part of a plurality of substrate supporting portions may protrude from the reference surface, in the state that a protrusion amount of a substrate holding unit is made minimum by a protrusion amount change unit.

Also as another variation, a protrusion amount change unit may be configured so as to change a protrusion amount of only a plurality of substrate holding unit on the distal end side of a hand base portion, and a protrusion amount of a plurality of substrate supporting portions on the proximal end side of the hand base portion may be unchanged.

Also as another variation, substrate supporting portions for supporting a substrate in a position closest to the reference surface of a hand base portion, of two or more substrates held by a batch conveying type hand, may be fixed to the hand base portion. Thereby, a pitch converting mechanism can be simplified.

Also as another variation, at least a part of a substrate supporting portion or a member formed integrally with the same (such as elevating member) may be configured by a material which is easily deformable when receiving an impact force, such as resin, metal plate, aluminum or the like, for example. Here, "easily deformable" means being deformed by a force smaller than a force by which a drive mechanism inside a hand base portion is damaged. Thereby, a damage of the drive mechanism inside the hand base portion by transmission of an impact force applied to the substrate supporting portion or the like can be prevented.

Figure 53:
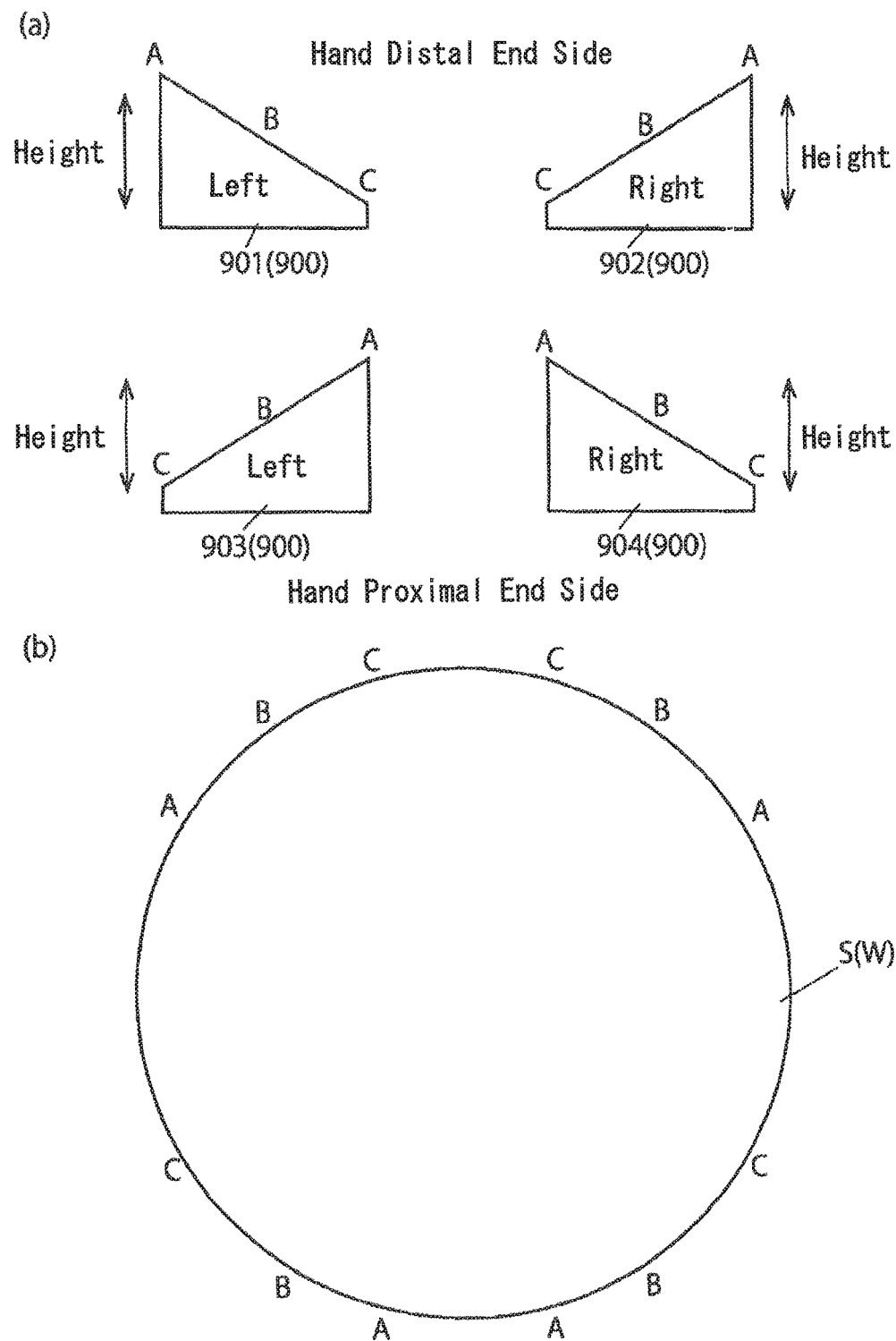
FIG. 53 is a schematic view illustrating another example of the substrate holding unit of the batch conveying type hand.
Figure 54:
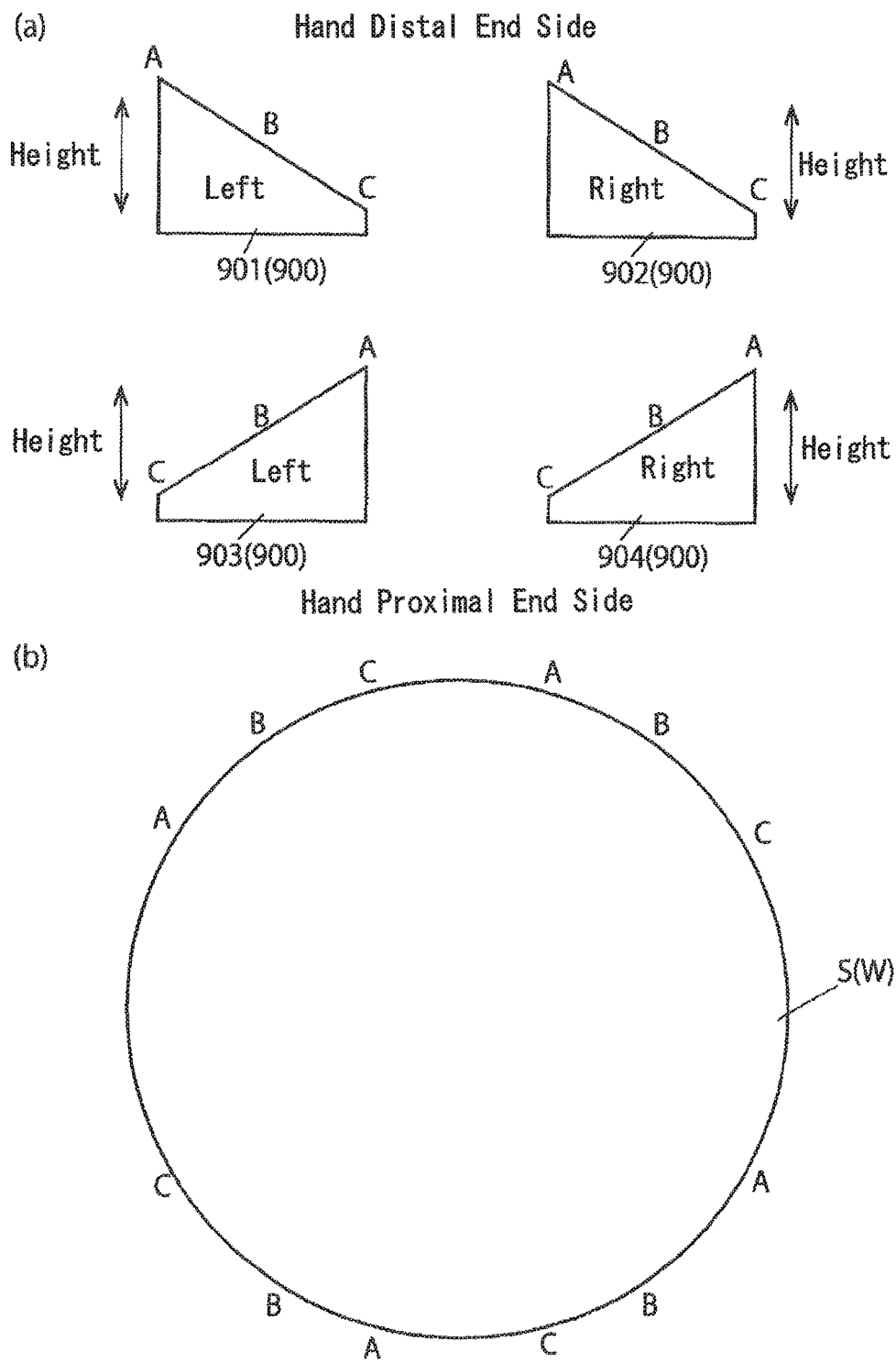
FIG. 54 is a schematic view illustrating another example of the substrate holding unit of the batch conveying type hand.

Also as another variation, in the state that a plurality of (three in the example) substrates are held by a substrate holding unit 900, a pair of forward and rearward left sets 901, 903, and a pair of forward and rearward right sets 902, 904 of substrate supporting portions are opposite to each other in a direction of inclination along left and right directions formed by the respective heights of the substrate supporting portions, as illustrated in FIG. 53(*a*). Further, a forward pair of left and right sets 901, 902, and a rearward pair of left and right sets 903, 904 of substrate supporting portions are opposite to each other in the direction of inclination along left and right directions formed by their respective heights.

When the inclination directions of sets of substrate supporting portions on the distal end side and the proximal end side are as illustrated in FIG. 53(*a*), four supporting positions with respect to each substrate are as illustrated in FIG. 53(*b*). Namely, as can be seen from FIG. 53(*b*), a quadrangle with four supporting positions A as vertexes of a substrate held at the highest position is identical to a quadrangle with four supporting positions C as vertexes of a substrate held at the lowest position. Although a quadrangle with four supporting positions B as vertexes of a substrate held at the middle-high position is not identical to the quadrangles according to the supporting positions A or supporting positions C, they do not differ greatly. Therefore, dispersion of holding states in the respective substrates caused by dispersion of substrate supporting positions in the respective substrates can be suppressed.

Alternatively, the forward pair of left and right sets 901, 902 and the rearward pair of left and right sets 903, 904 of substrate supporting portions may be the same in the direction of inclination along left and right directions formed by their respective heights. By doing so, all of the quadrangle with four supporting positions A as vertexes of a substrate held at the highest position, the quadrangle with four supporting positions B as vertexes of a substrate held at the middle-high position, and the quadrangle with four supporting positions C as vertexes of a substrate held at the lowest position are identical. Therefore, dispersion of holding states in the respective substrates can be further suppressed.

Figure 55:
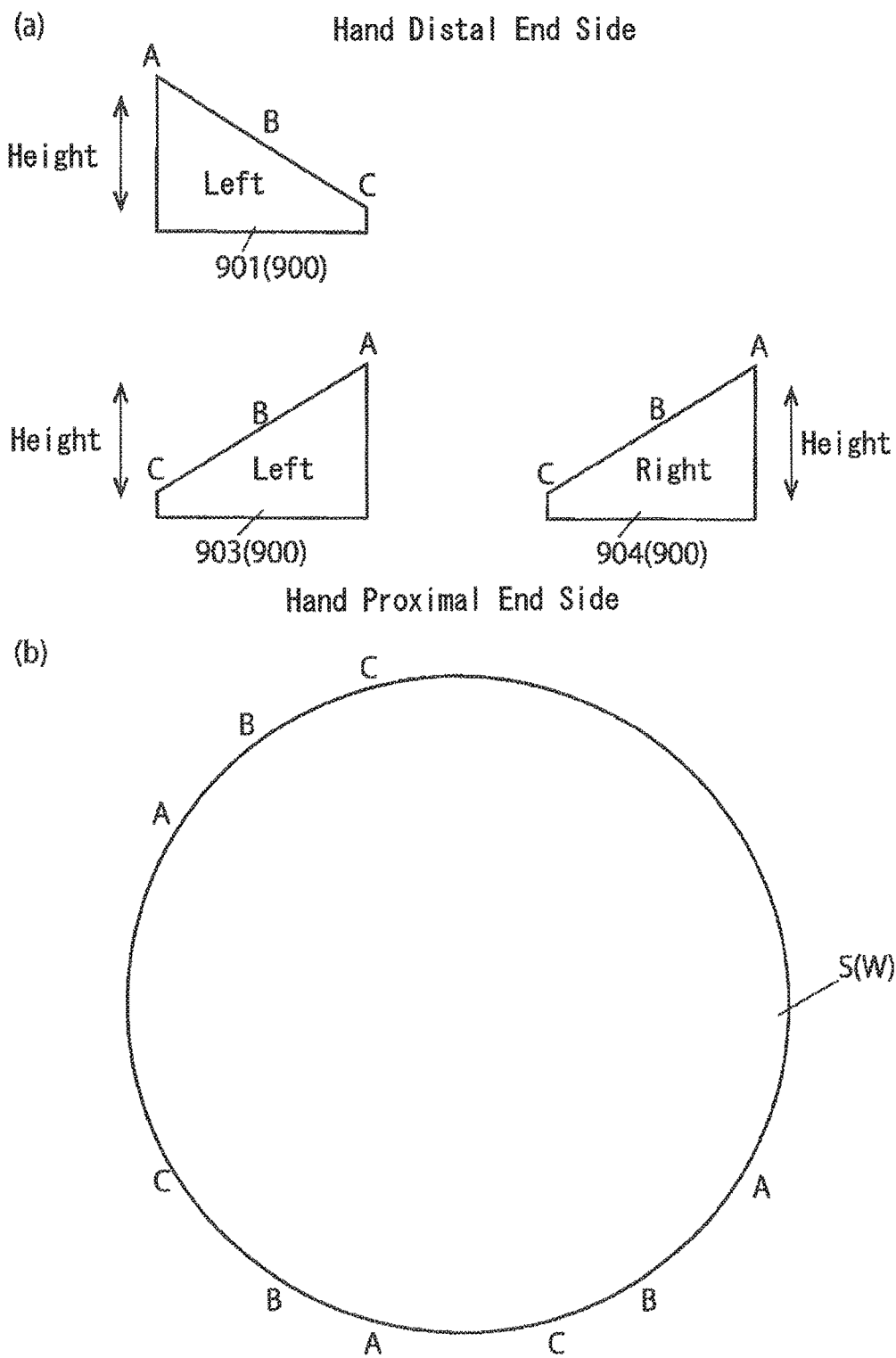
FIG. 55 is a schematic view illustrating another example of the substrate holding unit of the batch conveying type hand.

Also as a variation of various embodiments described above, a substrate holding unit may support three points of an edge portion of each substrate. For example, it can be configured so that only a substrate supporting portion 901 supports on the distal end side, as illustrated in FIG. 55, for example.

In each embodiment above, each set of substrate supporting portions on the proximal end side of a hand base portion can be moved forward and rearward with respect to the hand base portion, and each set of substrate supporting portions on the distal end side of the hand base portion cannot be moved forward and rearward with respect to the hand base portion.

When pinching substrates by the respective sets of substrate supporting portions on the distal end side and the proximal end side, each set of substrate supporting portions on the proximal end side is driven by a drive source in the hand base portion so as to be moved to the substrate-side and each set of substrate supporting portions on the distal end side is moved to the substrate-side by a robot operation as a whole hand.

By utilizing the robot operation as above, the pinching operation of substrates can be performed with no problem without providing any special drive mechanism to each set of substrate supporting portions on the distal end side.

As a variation of the substrate pinching operation, a method of utilizing an operation that each set of substrate supporting portions is pivoted about a vertical pivotal axis line, and a method of tilting each set of substrate supporting portions with respect to the vertical direction so as to position the substrate supporting portions below the respective substrates can also be employed.

When a substrate is conveyed using the end effector 405 comprising the blade hand 408 and the batch conveying type hand 409 illustrated in FIG. 16 and FIG. 17, the common divisor of the number of substrates left in the FOUP 426 illustrated in FIG. 24A after substrates are withdrawn from the FOUP 426 by the blade hand 408 and the number of empty slot steps after putting substrates into the substrate storing shelf 27 of a substrate conveying destination by the blade hand 408 may be the number of substrates held by the batch conveying type hand 409.

By doing so, the number of substrate conveyances from the FOUP 426 to the substrate storing shelf 27 can be minimized.

Note that, holding a substrate herein means that a substrate is put in the state that it can be conveyed by a hand, and also the state that the substrate is loaded, sucked, or pinched will do.

The various embodiments and variations above can be combined properly in the scope of the present invention. For example, the substrate supporting portion connecting mechanism 517 illustrated in FIG. 517 may applied to the first holding portion 4A illustrated in FIG. 1A, the substrate holding unit 702 illustrated in FIG. 43, or the distal end side substrate supporting portion 803 illustrated in FIG. 46. Also, in the robot 401 illustrated in FIG. 16, the hand 3 illustrated in FIG. 1A or the end effector 503 illustrated in FIG. 34 can be employed instead of the batch conveying type hand 409.

REFERENCE SIGNS LIST

1 . . . end effector device
2 . . . plate member conveying robot
3 . . . hand
5 . . . main slide body
7 . . . pitch converting mechanism
8A . . . link mechanism
9 . . . semiconductor wafer
30 . . . body portion
31 . . . movable portion
40A . . . first linearly moving body
41A . . . first linearly moving portion
401, 500 . . . substrate conveying robot
402 . . . base
403 . . . main shaft
404 . . . robot arm
404A . . . first robot arm
404B . . . second robot arm
405 . . . end effector
406 . . . first arm member
407 . . . second arm member
408 . . . blade hand (first hand)
409 . . . batch conveying type hand (second hand)
410 . . . hand body of blade hand
411 . . . hand base portion of batch conveying type hand
412 . . . substrate holding unit of batch conveying type hand
413 . . . finger portion of blade hand
414 . . . hand base portion of blade hand
415 . . . substrate supporting portion of blade hand
416 . . . gripping portion of blade hand
417 . . . abutting portion of blade hand
418 . . . movable member of blade hand
419 . . . drive source of blade hand
420 . . . substrate supporting portion of batch conveying type hand
421 . . . movable member of batch conveying type hand
422 . . . drive source of batch conveying type hand
423 . . . lifting link mechanism
424 . . . liftable member
425 . . . slider
426 . . . FOUP (substrate storing portion)
427 . . . substrate storing shelf (substrate storing portion)
428 . . . hand common body portion
500A . . . first substrate conveying robot
500B . . . second substrate conveying robot
501 . . . substrate conveying robot
502 . . . robot arm
503 . . . end effector
504 . . . arm supporting shaft
505 . . . supporting base
506 . . . end effector body
507 . . . fixed portion of end effector body
508 . . . movable portion of end effector body
509 . . . actuator of movable portion
510 . . . link mechanism of movable portion
511 . . . distal end side substrate supporting portion
511a . . . substrate placing surface
512 . . . proximal end side substrate supporting portion
512a . . . substrate placing surface
513 . . . elevating link mechanism
514 . . . elevating member 515 . . . slider
516 . . . substrate supporting portion drive unit
517 . . . substrate supporting portion connecting mechanism
518 . . . rotary spindle
519 . . . resistance applying unit
520 . . . adjusting bolt
521 . . . taper member
522 . . . displacement prohibiting unit
523 . . . abutting portion
524 . . . plunger mechanism (abutting portion drive unit)
525 . . . displacement detecting unit
526 . . . conduction detecting switch
526a, 526b . . . terminal of conduction detecting switch
527 . . . push type switch
528 . . . reflection type optical distance sensor
601A to E . . . cylindrical member of pitch converting mechanism
602A to E . . . pulley
603A to C . . . belt (flexible member)
604 . . . drive source of pitch converting mechanism
605 . . . first elevating member
606 . . . first vertical direction linear guide
607 . . . hand base portion
608 . . . first substrate supporting portion
609 . . . first rack and pinion
610 . . . rack of first rack and pinion
611 . . . pinion of first rack and pinion
612 . . . servo motor
613 . . . linear guide of second vertical direction
614 . . . second elevating member
615 . . . second substrate supporting portion
616 . . . second rack and pinion
617 . . . rack of second rack and pinion
618 . . . pinion of second rack and pinion
619 . . . substrate supporting portion
620 . . . elevating member
621 . . . roller
622 . . . hand base portion
623 . . . rocking drive member
624 . . . drive source
625 . . . rotary shaft
626 . . . servo motor
627, 628 . . . hand base portion
629 . . . substrate holding member
630 . . . front part of hand base portion
631 . . . rear part of hand base portion
700, 800 . . . batch conveying type hand (end effector)
701, 801 . . . hand base portion
702 . . . substrate holding unit
703 . . . protrusion amount change unit
704 . . . slide plate
705 . . . air cylinder
706 . . . servo motor of protrusion amount change unit
707 . . . front protrusion portion of slider
708 . . . opening of front protrusion portion
709 . . . ball screw on hand proximal end side
710 . . . nut of ball screw on hand proximal end side
711 . . . screw shaft of ball screw on hand proximal end side
712 . . . ball spline
713 . . . ball screw on hand distal end side
714 . . . screw shaft of ball screw on hand distal end side
715 . . . nut of ball screw on hand distal end side
802 . . . substrate supporting portion
803 . . . distal end side substrate supporting portion
804 . . . distal end side coupling member
805 . . . proximal end side substrate supporting portion
806 . . . proximal end side coupling member
807 . . . distal end side vertical guide member
808 . . . proximal end side vertical guide member
809 . . . slide plate
810 . . . air cylinder
811 . . . distal end side drive member
812 . . . proximal end side drive member
813 . . . distal end side inclined guide rail
814 . . . proximal end side inclined guide rail
815 . . . distal end side inclined groove
816 . . . proximal end side inclined groove
817 . . . ball screw
818 . . . servo motor
819 . . . screw shaft of ball screw
820 . . . nut of ball screw
821 . . . forward and rearward direction slender member
900 . . . substrate holding unit
L1 . . . first axis line
L2 . . . second axis line
L3 . . . third axis line
S, w . . . substrate (wafer)

The invention claimed is:

1. An end effector capable of holding two or more substrates, comprising:
a base at least a part of which advances below a lowermost substrate or above an uppermost substrate of a plurality of substrates stored in substrate storage;
a substrate holder provided on the base so as to hold the two or more substrates including the lowermost substrate or the uppermost substrate, the substrate holder comprising
a substrate support provided on a distal end side of an end effector body including the base, the substrate support including a surface supporting a bottom surface edge portion of the substrate, and
a connector comprising a rotary spindle connecting the substrate support to the distal end side of the end effector body so that the substrate support pivots in response to an external force when the external force is applied to the substrate support; and
a servo motor for changing a protrusion amount of the substrate holder from a reference surface including a surface of the base opposed to the lowermost substrate or the uppermost substrate,
wherein the servo motor is configured for applying a drive force to a whole of the substrate holder, and
wherein a vertical pitch of the two or more substrates held by the substrate holder is changed by changing the protrusion amount of the substrate holder by the servo motor.

2. The end effector according to claim 1, wherein the substrate support is displaced in response to the external force generated when the substrate support collides with an object around the same during movement of the end effector in an advance direction from the proximal end side toward the distal end side of the end effector.

3. The end effector according to claim 1, wherein the substrate holder has a left set and a right set of substrate supports provided on a distal end side of the base in order to support corresponding edge portions of the respective substrates and a left set and a right set of substrate supports provided on a proximal end side of the base in order to support corresponding edge portions of the respective substrates, and
wherein the left and right sets of substrate supports on the distal end side of the base are coupled to each other and the left and right sets of substrate supports on the proximal end side of the base are coupled to each other.

4. The end effector according to claim 1, wherein the at least a part of the base which advances below the lowermost substrate or above the uppermost substrate has a width smaller than 300 mm in left and right directions.

5. The end effector according to claim 1, wherein the base has a front part to which the substrate holder is arranged and a rear part formed integrally with the front part, wherein the rear portion is thicker than the front part in a vertical direction.

6. The end effector according to claim 1, wherein the substrate holder has a left set and a right set of substrate supports provided on the distal end side of the base in order to support corresponding edge portions of the respective substrates and a left set and a right set of substrate supports provided on the proximal end side of the base in order to support corresponding edge portions of the respective substrates, and wherein, in a state that the two or more substrates are held by the substrate holder, a pair of forward and rearward left sets, and a pair of forward and rearward right sets of the substrate supports are opposite to each other in a direction of inclination along left and right directions formed by the respective heights of the substrate supports.

7. The end effector according to claim 1, wherein the substrate holder is configured to support three points of an edge portion of each of the two or more substrates.

8. The end effector according to claim 7, wherein the substrate holder has a left set and a right set of substrate supports provided on the distal end side of the base in order to support corresponding edge portions of the respective substrates and a left set and a right set of substrate supports provided on the proximal end side of the base in order to support corresponding edge portions of the respective substrates, and wherein the left and right sets of substrate supports on the distal end side are configured to support different substrates, respectively.

9. The end effector according to claim 1, wherein the substrate holder has a plurality of substrate supports each for supporting an edge portion of the substrate, and wherein at least one of the substrate supports for supporting a closest one of the two or more substrates to the reference surface is fixed to the base.

10. The end effector according to claim 1, wherein the substrate holder has a plurality of substrate supports each for supporting an edge portion of the substrate, and wherein each substrate supports or at least a part of a member formed integrally with the same is formed of a material which is deformed easily when receiving an impact force, the member comprising one of resin, a metal plate and aluminum.

11. The end effector according to claim 1, further comprising a detector for detecting a displacement of the substrate support by the external force, the detector comprising one of a detecting switch, a push type switch and an optical sensor.

12. The end effector according to claim 1, wherein the rotary spindle pivotably connects a proximal end portion of the substrate support to the distal end side of the end effector body.

13. The end effector according to claim 12, wherein the connector has bolts, tapers, and the rotary spindle for applying a resistance to a pivoting operation of the substrate support with respect to the end effector body.

14. The end effector according to claim 12, wherein a pivotal axis line of the pivoting operation of the substrate support with respect to the end effector body is oriented in a direction orthogonal to a vertical direction.

15. A substrate conveying robot, comprising:
the end effector according to claim 1; and
an articulated arm on whose distal end the end effector is mounted.

16. An end effector capable of holding two or more substrates, comprising:
a base at least a part of which advances below a lowermost substrate or above an uppermost substrate of a plurality of substrates stored in substrate storage;
a substrate holder provided on the base so as to hold the two or more substrates including the lowermost substrate or the uppermost substrate, the substrate holder comprising
a substrate support provided on a distal end side of an end effector body including the base, the substrate support including a surface supporting a bottom surface edge portion of the substrate, and
a connector comprising a rotary spindle connecting the substrate support to the distal end side of the end effector body so that the substrate support pivots in response to an external force when the external force is applied to the substrate support; and
a servo motor for changing a protrusion amount of the substrate holder from a reference surface including a surface of the base opposed to the lowermost substrate or the uppermost substrate,
wherein the servo motor is configured for applying a drive force to a whole of the substrate holder, and
wherein an plunger and an abutment comprising a roller connected to the plunger are configured for prohibiting a displacement of the substrate support when the external force is applied to the substrate support.

17. The end effector according to claim 16, further comprising a link member for moving the substrate support between an upper position and a lower position, wherein a limited state and a non-limited state of a displacement of the substrate support by the abutment and plunger are switched therebetween according to a position of the substrate support in a vertical direction.

18. The end effector according to claim 17, wherein the substrate support is pivotable about its proximal end portion in response to the external force, and wherein the abutment is abutted on the substrate support when the substrate support which has pivoted in response to the external force is moved downward by the link member so as to return the substrate support to a non-pivoted position.

19. The end effector according to claim 17, comprising the plurality of substrate supports arranged in their respective different positions in a vertical direction, wherein the link member is configured for changing a pitch of the plurality of substrate supports in the vertical direction.

20. The end effector according to claim 16, wherein:
the abutment is configured to advance and retreat with respect to the substrate support; and
the plunger is configured for moving the abutment between a reaching position for reaching the substrate support in a non-displaced position and a separate position separated from the substrate support in the non-displaced position.

* * * * *